(12) United States Patent
Klughart

(10) Patent No.: US 6,396,137 B1
(45) Date of Patent: May 28, 2002

(54) INTEGRATED VOLTAGE/CURRENT/POWER REGULATOR/SWITCH SYSTEM AND METHOD

(76) Inventor: Kevin Mark Klughart, 14 Chapel St., Concord, NH (US) 03301-4305

( * ) Notice: Subject to any disclaimer, the term of this patent is extended or adjusted under 35 U.S.C. 154(b) by 0 days.

(21) Appl. No.: 09/809,611

(22) Filed: Mar. 15, 2001

Related U.S. Application Data

(60) Provisional application No. 60/189,721, filed on Mar. 15, 2000.

(51) Int. Cl.[7] .............................................. H01C 23/52
(52) U.S. Cl. ........................ 257/691; 257/723; 257/724; 438/107
(58) Field of Search ................................. 257/691, 723, 257/724, 401, 341, 207, 763, 764, 765; 438/107; 307/125, 126, 130, 131

(56) References Cited

U.S. PATENT DOCUMENTS 5,216,275 A  *  6/1993  Chen
6,246,598 B1 *  6/2001  Tarter et al.
6,262,905 B1 *  7/2001  Zhang et al.
6,288,883 B1 *  9/2001  Chen

* cited by examiner

*Primary Examiner*—Sheila V. Clark
(74) *Attorney, Agent, or Firm*—Kevin Mark Klughart

(57) ABSTRACT

An integrated voltage/current/power regulator/switch (VCPRS) system and method are disclosed in which regulator/switch circuitry is vertically integrated on top of an existing integrated circuit. The present invention does not require additional integrated circuit chip area for the regulator pass device as is required in the prior art, and by virtue of its construction provides a significantly reduced on-resistance as compared to all prior art implementations. The present invention both stabilizes the power supply for large area integrated circuits and permits individual areas of the integrated circuit to have switched power capability, a highly desirable feature in low power and battery power applications. The present invention permits an increase in the power supply rejection ratio (PSRR) for digital, analog, and especially mixed-signal integrated circuit designs by permitting various circuit blocks to have localized power regulation that is obtained from a common power supply plane within the integrated circuit framework. Finally, the present invention appears to be the only economically practical method of addressing the power supply regulation requirements of modern and future integrated microprocessor designs.

20 Claims, 42 Drawing Sheets

*Prior Art*

*Prior Art*

*Prior Art*

*Prior Art*

*Prior Art*

*Prior Art*

*Prior Art*

*Prior Art*

*Prior Art*

2005

2006

2016

2007

2108

2109

2110

2111

*Prior Art*

*Prior Art*

*Prior Art*

*Prior Art*

*Prior Art*

*Prior Art*

Clock-Based
Anticipatory Regulator/Switch
System Timing

INTEGRATED VOLTAGE/CURRENT/POWER REGULATOR/SWITCH SYSTEM AND METHOD

CROSS REFERENCE TO RELATED APPLICATIONS

Applicant claims benefit pursuant to 35 U.S.C. §119 and hereby incorporates by reference Provisional Patent Application for "INTEGRATED VOLTAGE/CURRENT/POWER REGULATOR/SWITCH SYSTEM AND METHOD", Ser. No. 60/189,721, filed Mar. 15, 2000.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

FIELD OF THE INVENTION

The present invention relates generally to the regulation and/or switching of voltage and/or current and/or power as applied to integrated circuits.

BACKGROUND OF THE INVENTION

General System Block Diagram (0100)

The basic problem addressed by the present invention can be best illustrated by reference to the block diagram of FIG. 1. Here it can be seen that a non-ideal voltage source (0101) is used to provide a current ($I_{VS}$) to a complex load (0103) through a voltage/current/power regulator/switch (VCPRS) module (0102). It is important to note that the same non-ideal voltage source (0101) may simultaneously supply a variety of other loads (0106) through other VCPRS modules (0105) within the context of the entire system environment. The ground reference (0104) for the entire system is typically common but need not necessarily be so in all circumstances.

Regulator Function

The primary function in many system contexts is for the voltage/current/power regulator module (0102) to regulate the output voltage supplied to the complex load (0103) so that it is constant under all loading conditions and also under all conditions of the non-ideal voltage source (0101). While the typical context of this regulation scheme is one of constant output voltage, there are applications in which a constant output current (or constant output power) are desired, and this discussion applies equally well to these environments.

Voltage Regulation

Typically the voltage transformation from the non-ideal voltage source (0101) to the complex load (0103) can occur via dissipation in the VCPRS module (0102) (linear voltage regulation), or may occur within the context of a buck/boost voltage converter in which the voltage regulator/switch acts more strictly as a power converter with regulated output voltage and/or current. Neither configuration limits the teachings of the present invention, as the form of voltage/current regulation in both cases requires some common circuit elements that are the subject of the teachings herein. Therefore, it is sufficient to realize that the regulator function served by the VCPRS function (0102) is one of meeting the demands (voltage, current, power) to the load based on a specified regulation scheme.

As an example, the typical voltage regulation requirements for a modern microprocessor range from ±10% to ±5%, which for a 1.5V core voltage means a ±150 mV to ±75 mV regulation range. This is in stark contrast to the ±500 mV regulation range typically permitted for older 5V digital logic systems. A significant reason for limiting the regulation drift of a microprocessor power supply voltage (VDD) is one of reliability. As the gate oxide thickness of modern CMOS processes are reduced, the susceptibility to oxide punchthrough is increased and thus regulation of the power supply becomes a paramount reliability consideration.

Voltage Dropout

The issue of voltage regulation is tightly related to another concept termed voltage dropout. As stated in the literature:

"The dropout voltage is the voltage at which the input voltage is low enough to cause the output to go out of regulation. With the reduction of logic voltages, the dropout voltage becomes more critical. A case in point in when you want a 1.5V alkaline cell to power a 1-V DSP. The alkaline cell can degrade to 1-V and the regulator can still provide power to within a few millivolts of 1 V. Dropout requirements dictate the type of pass element used and favor CMOS for very low-dropout regulators. Some regulators use a pass element and a low-loss switch that directly couples V(in) to V(out) with a small voltage drop across the switch."

See Brian Erisman, "Voltage Regulation Tames Transients" and "Voltage Regulation Takes Trade-Offs", ELECTRONIC ENGINEERING TIMES, at 84–100 (Oct. 4, 1999).

Note that the prior art clearly indicates that as supply voltages drop, the efficiency of the pass element becomes a significant design issue. However, little if any guidance is provided as to how to solve the problems associated with lowered supply voltages and fixed dropout voltage values in regards to high current or mixed signal integrated circuit systems.

Current Regulation

While voltage regulation and switching are the primary focus of the present invention, current and/or power regulation may be equally implemented utilizing the disclosed invention teachings in conjunction with the prior art. Current regulators, of all power variations, are detailed in the literature. See Henri J. Oguey and Daniel Aebischer, "CMOS Current Reference Without Resistance", IEEE JOURNAL OF SOLID-STATE CIRCUITS, Vol. 32, No. 7, at 1132–1135 (Jul, 1997).

Switching Function

Additionally, in many circumstances the VCPRS module (0102) may be called upon to act as a high efficiency switch to completely enable or disable power dissipation by the complex load (0103). It is extremely important that this switching function be electrically efficient, meaning that the "on" impedance magnitude of the switch be near zero ohms. It is significant to note that it is the impedance magnitude and not just the DC resistance value of the switch that is of importance here. Thus, the parasitics associated with the voltage regulator/switch module, including parasitic "on" resistance, capacitance, and inductance are of concern in these designs, especially with highly dynamic complex loads (0103) as occur in a microprocessor or any analog/digital integrated circuit environment.

Multi-Value Supply Voltage Integration (0200)

One method employed by the prior art and which has been useful in some implementations is the use of a multi-value supply voltage topology as illustrated in FIG. 2. Here, the system supply voltage is maintained at +5V, and used to supply both the 3.3V system regulator as well as the I/O circuitry. In this manner, the internal digital core voltages can be maintained at low voltage levels to prevent oxide punchthrough and other reliability problems, while permitting the circuit to be integrated with other +5V parts. See Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998).

Note that any use of this technique dictates that level shifter circuitry be implemented to interface the lower internal core voltages to the higher interface voltages that are present outside the target integrated circuit. See Nobuaki Otsuka and Mark A. Horowitz, "Circuit Techniques for 1.5-V Power Supply Flash Memory", IEEE JOURNAL OF SOLID-STATE CIRCUITS, Vol. 32, No. 8, at 1217–1230. A significant issue in all of these level shifting methodologies deals with the capabilities (or lack thereof) in the core integrated circuit fabrication process to handle the elevated voltages present outside the target integrated circuit. Thus, although a level shifting circuit suitable for the interface to the outside world can be fabricated, there still remain issues of reliability in that the higher outside voltages may stress oxides and devices in the level shifting circuitry and thus degrade the overall performance of the system.

While this technique is in general useful in designing modern integrated circuits, there still exist significant practical implementation issues in creating an efficient voltage regulator design within an integrated circuit context. As will be shown later in this document, existing methods to implement efficient regulator schemes are not at present economically scalable to provide the required circuit performance for modern and future integrated microprocessor designs. What is desperately needed both now and in the future is a new regulation/switching technology to address these efficiency issues.

DESCRIPTION OF THE PRIOR ART

General Topology Overview

It is instructive before describing the present invention to inspect the methods by which the prior art has addressed the issue of both the regulator and switching functions described previously. This discussion is provided in greater detail in the literature. See Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998).

A Note Concerning MOSFET Strength

The following discussion will make use of the term 'MOSFET strength' which concerns the transconductance characteristics of a MOSFET that are directly related to the geometry of the device. In general, the transconductance ($g_m$) of a MOSFET will be given by the relation $$g_m \propto \frac{W}{L}$$

$$A \cong W \times L \tag{1}$$

where
 A≡effective chip area consumed by MOSFET (microns$^2$)
 L≡effective gate length of the MOSFET (microns)
 W≡effective gate width of the MOSFET (microns)

It is significant to note that the device length (L) is limited by the process technology and applied supply voltage, so to achieve a certain device current passing capability, there must be a corresponding increase in the area (A) consumed by the MOSFET.

Similar tradeoffs occur for every type of active device: to pass a given amount of current (with a specified series resistance typically referred to as RDS(on)) requires a minimum amount of area that is technology dependent. The 'strength' of the device is therefore dictated by the application requirements, and this in turn indirectly dictates the size of any MOSFET or other active device used to pass the current. The significance of this minimum area requirement will be revisited throughout this document in a variety of contexts.

PMOS Pass Device (0300)

Referencing FIG. 3, a common method of providing voltage regulation is to use an operational transconductance amplifier (OTA) in conjunction with a strong P-channel MOSFET (0301) in a negative feedback arrangement. The literature indicates that while the OTA provides sufficient feedback to ensure that the output voltage remains constant, the circuit suffers from an increase in output impedance with increasing dynamic loading frequency. This is undesirable in a digitally clocked system where high frequency current spikes will be present at the drain of the pass MOSFET device (0301).

As with all systems of this configuration, the Miller capacitance associated with this device is multiplied by the transconductance gain of the pass device, making the frequency rolloff larger as the size of the pass MOSFET device (0301) is increased. Thus, as the current carrying capacity demands of the output load are increased, requiring a stronger (higher W/L ratio) in the pass MOSFET device (0301), the high frequency response of the system actually decreases further, an undesirable result.

It is significant to note that the literature mentions that this high frequency rolloff characteristic may be mitigated by the use of a large output capacitor Cext (0302, 0402, 0502). However, the drawback of this additional component is one of the use of additional chip area for its fabrication. This is unfortunate, but a necessary evil of this design topology. While the literature has mentioned some means to reduce the power consumption associated with the output capacitance as exemplified by the schematic of FIG. 6, the high frequency rolloff characteristic is a fundamental design constraint that limits the performance of the regulator/switch. See Gabriel A. Rincon-Mora and Phillip E. Allen, "A Low-Voltage, Low Quiescent Current, Low Drop-Out Regulator", IEEE JOURNAL OF SOLID-STATE CIRCUITS, Vol. 33, No. 1, at 36–44 (January 1998).

NMOS Source Follower (0400)

Referencing FIG. 4, this configuration appears to be identical to that of FIG. 3, but the difference here is that the OTA is used with a N-channel MOSFET in a source follower configuration. Note that this configuration has excellent incremental impedance, as the impedance looking into the pass MOSFET device (0401) from the load is given by the relation $$r_{o(s)} \propto \frac{1}{g_m} = \frac{L}{W} \qquad (2)$$

where $r_{o(s)}$=effective incremental impedance looking into MOSFET source

Here it is significant to note that the stronger (larger) the pass MOSFET device (0401) is constructed, the stiffer the supply regulation becomes. This is a desirable characteristic, but comes with the penalty that the regulated output voltage must be one threshold voltage ($V_{TH}$) below the VDDD supply rail.

NMOS Source Follower with Charae Pump (0500)

The literature has attacked the deficiencies of the circuit topology of FIG. 4 by incorporating a charge pump into the design as illustrated in FIG. 5. Here the charge pump permits the gate voltage of the pass MOSFET device (0501) to exceed that of the VDDD supply, making it possible to drive the regulated output voltage all the way to the level of the VDDD supply voltage.

Power Conversion Charge Pump Methodology

Often it is necessary in integrated circuit design to generate a high internal voltage supply for use within the confines of the target integrated circuit. These designs invariably use a capacitor-based charge-pump approach to provide the required power conversion. Applications for this methodology include flash memories and bias generators for DRAM memory systems. See Takayuki Kawahara, Syun-ichi Saeki, Yusuke Jyouno, Naoki Miyamoto, Takashi Kobayashi, and Katsutka Kimura, "Internal Voltage Generator for Low Voltage, Quarter-Micrometer Flash Memories", IEEE JOURNAL OF SOLID-STATE CIRCUITS, Vol. 33, No. 1, at 126–132 (January 1998).

However, it should be noted in all these prior art examples, there is in general only a small power conversion requirement dictated by the application. That is, the current demands on the converted power supply are minimal. Thus, this technique is of less use in regulating large power supply voltages to smaller voltages for use with low voltage target integrated circuit systems.

Circuit Integration (0600)

As illustrate in FIG. 6, any of the approaches of FIGS. 3–5 may be utilized with a scaled feedback scheme to sense the regulated output voltage at some level lower than the actual regulated output voltage. This technique may be utilized with conventional bandgap references as well as replication of the output driver structure to achieve better voltage stability at the complex load as described in the literature. See Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998).

Summary

It should be noted that in all the schemes mentioned above, the performance of the pass MOSFET transistor and the size of the required filter capacitor are key performance considerations in any of these designs. To perform well under high frequency dynamic loading conditions, the designs above must all have significant filtering capacitance and the impedance characteristics of the pass MOSFET transistor must be designed for low dynamic transconductance.

PRIOR ART TRADEOFFS

Relating Pass Device Strength and Capacitance

The need for improved voltage/current regulation/switching within the context of an integrated circuit environment is not a new problem. Engineers have essentially addressed this problem by using larger integrated capacitors for filtering and have increased the strength (and corresponding area) of the pass MOSFET transistor to accommodate the increased dynamic loading characteristics of modern microprocessors and other mixed-signal integrated circuits.

It is helpful at this point to quote the literature regarding the rationale behind this design philosophy. Gerrit W. den Besten and Bram Nauta as referenced above have stated that "The circuit part consisting of C1 [0302, 0402, 0502] and M1 [0301, 0401, 0501] consumes most of the die area of the complete voltage regulator. One can either spend a lot of area on C1 or on M1. If C1 is made very large, then the ripple on $V_G$ will be small; the $V_{gs}$ variation may then be 400 mV, and M1 need not to be too large. On the other hand, if C1 is made small, then the $V_G$ variation will be large. This means that the is less left for $V_{gs}$ variation, and thus M1 becomes large. The optimization has been done numerically, which led to an optimal ratio between capacitor and transistor area."

It is significant to note in this cited circuit application that the design required a 3Ω impedance for M1 (0301, 0401, 0501) as the pass MOSFET device, which yielded the desired regulated voltage variation of +300 mV with a peak power supply load of 100 mA. To achieve this design requirement, the W/L of M1 was sized at 14000 μm/0.5 μm for a total device area of at least 7000 μm². Assuming that C1 was equally as large, the total area (A) consumed by the regulator was on the order of 14000 μm², or approximately 140000 μm²/A of regulated output current.

Limits to Low Power Operation

Even if the desired pass device could be properly constructed as indicated above, there remains a serious performance issue of parasitic capacitance associated with a pass device fabricated with this amount of die area. As stated by the literature, " . . . current efficiency plays a pivotal role in designing battery-powered supplies. The two performance specifications that predominantly limit the current efficiency of low drop-out regulators are maximum load-current and transient output voltage variation requirements. Typically, more quiescent current flow is necessary for improved performance in these areas.

Output current and input voltage range directly affect the characteristics of the pass element in the regulator, which defines the current requirements of the error amplifier. As the maximum load-current specification increases, the size of the pass device necessarily increases. Consequently, the amplifier's load capacitance (Cpar [0302, 0402, 0502]) increases. This affects the circuit's frequency performance by reducing the value of the parasitic pole present at the output of the amplifier. Therefore, phase-margin degrades and stability may be reduced accordingly. As a result, more current in the buffer stage of the amplifier is required, be it a voltage follower or a more complicated circuit architecture. In a similar manner, low input voltages require that MOS pass device structures increase in size and thus yield the same negative effects on frequency response and quiescent current as just described. This is because the gate drive decreases as the input voltages decrease, thereby demanding larger MOS pass elements to drive high output currents.

Further limits to low quiescent current arise from the transient requirements of the regulator, namely, the permissible output voltage variation in response to a maximum load-current step swing. The output voltage variation is determined by the response time of the [regulator] circuit, the specified load-current, and the output capacitor. The worst case response time corresponds to the maximum output voltage variation. This time limitation is determined by the closed-loop bandwidth of the system and the output slew-rate current of the error amplifier. These characteristic requirements become more difficult to realize as the size of the parasitic capacitor at the output of the amplifier (Cpar) increases, which results from low-voltage operation and/or increased output current specification. Consequently, the quiescent current of the amplifier's gain stage is limited by a bandwidth minimum while the quiescent current of the amplifier's buffer state is limited by the slew-rate current required to drive Cpar."

See Gabriel A. Rincon-Mora and Phillip E. Allen, "A Low-Voltage, Low Quiescent Current, Low Drop-Out Regulator", IEEE JOURNAL OF SOLID-STATE CIRCUITS, Vol. 33, No. 1, at 36–44 (January 1998). This quote validates the premise that increased capacitance comes at the penalty of increased power dissipation, whether static or dynamic.

Current/Future Requirements
Scalability (0700)

Another significant problem with the design approach as detailed above is its lack of scalability to the high current levels that are and will be experienced by advanced digital and analog integrated circuitry. Referencing FIG. 7, it is well known in the industry that there is an exponential relationship between the size of an integrated circuit and its cost. While various literature describes the cost as proportional to some exponential function of the chip die area (See Mark Dorais, "Analyze ASIC Designs To Optimize Integration Levels", supplement to ELECTRONIC DESIGN, at 83–86 (Aug. 9, 1999)), others have more rigorously quantified this relationship to be cubic, meaning that the cost of a given integrated circuit chip is generally proportional to the cube of the die area (See John L. Hennessy and David A. Patterson, COMPUTER ARCHITECTURE—A QUANTITATIVE APPROACH, at 60 (ISBN 1-55880-069-8, 1990)).

Die Size Considerations

In any case, using the data illustrated in FIG. 7, the chip die for the Gerrit W. den Besten and Bram Nauta reference would put their disclosed chip design die cost approximately at point (0701) (14000 $\mu m^2$=0.014 $mm^2$) in FIG. 7. Now the question arises as to what happens if the peak current requirements are raised from 100 mA as in the Gerrit W. den Besten and Bram Nauta reference to that of modern or future microprocessors. Specifically, it should be noted that the advent of low voltage processors ($\leq$1.0V to 1.8V VDD) with corresponding high current transients (50A to $\geq$100A) will require that any power supply used to support these regulators be capable of "deal[ing] with very dynamic loads at high current-slew rates during transients." See Roger Allan, "Lateral CMOS Process Yields 7.4V MOSFET With An On-Resistance of 6 m$\Omega$", ELECTRONICS DESIGN 36–37 (Jul. 12, 1999).

According to the rough calculations done previously indicating that the effective die area needed for a given ampere of regulated output current would be on the order of 140000 $\mu m^2$/A, a 100 A regulation scheme would require a chip die area of 14000000 $\mu m^2$=14 $mm^2$ which roughly corresponds to point (0702) in FIG. 7. This calculation is verified by Gerrit W. den Besten and Bram Nauta which state that "[a]bsolute values of M1 [0301, 0401, 0501] and C1 [0302, 0402, 0502] depend on the peak load current to be expected. If N times more current is needed, C1 and M1 become a factor of N larger. Since the area of the regulator is dominated by M1 and C1, its area is proportional to the expected peak load current."

Using this rough graphical estimate, it can be seen that the chip die cost for the 100 A regulator will be at least 20–30 times that of the 100 mA regulator configuration. Thus, while the die area may be made linear to the required output load current, the nonlinear nature of the die cost to die area dictates the total die cost when all factors are considered simultaneously. This is a significant scaling penalty, and it should be noted that the heat dissipation problems and reliability problems associated with the current concentrations in this topology have yet to be addressed by the prior art. It is therefore doubtful that this design approach will be of significant use in working with future highly integrated microprocessor systems and other mixed signal system integrations.

Gate Drive Limitations

Another significant issue not accounted for in the den Besten analysis for future product designs is the impact of reduced gate drive on the ability to generate pass devices with sufficiently low RDS(on) values. Recall that the drain resistance of a MOSFET operating in the saturation region (with $V_{GS}$>$V_T$; $V_{DS}$>$V_{GS}$-$V_T$) is given by the first-order relation $$R_{DS(ON)} = \frac{2}{\beta} \frac{1}{[V_{GS} - V_T]^2 \lambda} \qquad (3)$$
$$= \frac{2}{K'} \frac{L}{W} \frac{1}{[V_{GS} - V_T]^2 \lambda}$$

Noting that the den Besten analysis assumed a 3.3V, and assuming comparable threshold voltages (VT) of 0.6V, it can be seen that the gate drive component of the den Besten system is approximately $1.0/(3.3-0.6)^2$=0.137. If the system is now converted to a 1.5V process with all other factors equal, the gate drive becomes $1.0/(1.5-0.6)^2$=1.235, or approximately an order of magnitude greater than the 3.3V system.

This gate drive component is important in the analysis because as the maximum process voltage decreases, the threshold voltages cannot be decreased at will without incurring higher leakage losses (and increased power consumption) in the system. Therefore, the resulting increase in RDS(on) resistance due to reductions in gate drive in many circumstances requires that the size of pass devices be increased to compensate for the effective decrease in drive strength of the pass MOSFET device. Incorporating this additional factor of 10 into the calculations for a 100 A pass device as described above would increase the overall device size to 1400000 $\mu m^2$/A, or a total chip die area of 140000000 $\mu m^2$=140 $mm^2$. This would clearly make this solution uneconomical in most integrated circuit system designs.

Metalization Distribution Limitations

One aspect of the current art that has become a significant limitation in the generation of modern large integrated circuit systems deals with losses associated with metalization distribution. This problem is best illustrated graphically as in FIG. 16. Here an integrated circuit system is depicted (1600) having a variety of analog (1611, 1613) and digital (1612) systems on the same chip. Bond pads (1601, 1602) are used to supply VSS and VDD power connections respectively.

The problem typically encountered in such systems is a tradeoff between area efficiency in distributing power and power supply noise integrity. Referencing the VSS pad (1601) tree-style bus routing, it can be seen that the voltage drop incurred along the common VSS bus by the digital (1612) and analog (1613) systems is impressed on the bus before it reaches the first analog system (1611), causing a voltage drop and corresponding noise injection into this circuit.

Integrated circuit layout designers have typically abandoned tree-style bus routing in modern integrated circuit layout for the single-point bus routing that is illustrated on the VDD bond pad (1602). Here there are individual power bus traces being routed to each of the analog/digital subsystems (1611, 1612, 1613), and thus the common voltage reference point is (1602). Voltage drops incurred by the load generated by each subsystem are in part limited to the power supply of that subsystem. Note that due to finite bond wire inductance there will always be some noise induced at the bond pad (1602) due to transients in the power consumption of the analog/digital subsystems (1611, 1612, 1613). While this technique can be of great use in many mixed signal circuit designs, it does not solve all the problems that can occur in modern high-speed integrated circuit design.

The main problem is that the metalization routing illustrated in either technique of FIG. 16 produces only a passive regulation, using the inherent metalization resistance to perform the required noise isolation between the systems. Even if the metalization were to cover the entire top of the chip, there would still be significant noise coupling between individual circuit components. This requirement is more pronounced with increasing current demands on the entire integrated circuit system.

While some techniques have been developed to stack wafers on top of one another using 'bump' or 'ball' technologies as illustrated in FIG. 27, these have proven difficult and expensive to use for commodity integrated circuit applications. In general, these techniques will not become economically feasible until the tooling for these designs overcomes some basic reliability problems associated with the mechanical assembly process inherent in any chip stacking procedure.

What is needed in the industry at the present and in future designs is an active regulation and noise reduction scheme. To date nothing in the prior art has suggested how this might be accomplished, but the present invention does provide a useful method to implement this functionality at a general and very broadly applicable level.

Other Considerations

It must be additionally noted that irrespective of the resulting die cost, the addition of 14 mm$^2$ die area to any existing high complexity integrated circuit design severely dictates what package styles will be available for use with the product. Only the largest of ceramic packages can afford to incorporate an additional half-inch square die just for local power regulation purposes. Thus, there are significant mechanical considerations to the addition of any pass/regulation device consuming this amount of die area.

Interim Solutions to the Problem

In the interim, as exemplified by the MOSFET structure illustrated in FIG. 8, there have been some approaches to solving the problem described above in that some researchers have utilized multiple metal levels and interdigitated drain/source strapping to minimize the effective impedance of the drain/source channel in a conventional MOSFET. A recent MOSFET configuration using this approach has been reported in the literature. See Roger Allan, "Lateral CMOS Process Yields 7.4V MOSFET With An On-Resistance of 6 mΩ", ELECTRONICS DESIGN 36–37 (Jul. 12, 1999).

However, even this approach has its drawbacks. Allan reports that the effective drain-source resistance for a typical interdigitated MOSFET configuration is given by the relation $$R_{EFF} = \frac{\sqrt{rR} \coth\left(N\sqrt{\frac{r}{R}}\right) + rc}{2} \quad (4)$$

$$\cong \frac{\sqrt{rR} + rc}{2} \text{ for large } N$$

where
$R=R_{ON}(\text{simulated})+R_{CONTACT}$
r=resistance of the metal trace between a two-unit cell
rc=resistance of the metal trace between drain and source pads
N=number of devices integrated What is significant to note from this relation is that the overall drain-source resistance is not significantly decreased beyond a given limit. So, the basic performance of the lateral MOSFETs utilized in this interdigitated scheme cannot be significantly improved by virtue of this topology. Therefore, the resulting chip die area for very large current carrying pass devices is still considerable, yielding an unacceptable (yet marginally better) die cost and resulting lowered die yield and reliability.

What is also absent from the analysis reported by Allan is the cost/yield impact of adding the interdigitated metalization layers to an existing design. While the cost of extra metal layers has continuously dropped with time, the extra processing steps involved in the Allan methodology has yet to prove economically viable given current technology. Additionally, as indicated in the title of the article, the structure reported by Allan is essentially a low-voltage (7.4V) MOSFET, and not suitable for even 12V automotive applications, and clearly not applicable for high voltage applications.

Finally, an unmentioned and unresolved issue in the configuration reported by Allan is that of thermal management. The pass devices created using this methodology must by their very nature be placed at some portion of the subject integrated circuit. The high power density being passed by this pass device tends to locally increase the temperature on the integrated circuit, and generate a thermal gradient across the integrated circuit die. This thermal gradient makes integration of precision analog circuitry difficult, and presents significant reliability and performance issues with remaining digital circuitry. Neither the structure reported by Allan nor the prior art solves this thermal gradient problem.

Trends in Regulator Systems

Overview

While linear regulation schemes as illustrated in FIGS. 3–6 have been widely used within the electronics industry for decades, the advent of personal computer (PC) systems has driven a move in most new designs to switched-mode regulators that are essentially DC-DC power converters having a regulated output voltage. These systems are often characterized in the art as 'boost', 'buck', or 'buck/boost' converters to describe their capability to take a given DC input voltage and increase, decrease, or increase/decrease it respectively to generate a regulated output voltage.

These systems have traditionally used one or more external power switches to perform the buck/boost functionality within the context of the switching regulator. This may be seen by inspecting the placement of Q1, Q2, and Q3 in FIG. 13 and FIG. 15. In both circumstances the energy storage inductor L1 is switched either to either supply rail via use of the gate controls of Q1 and Q2/Q3 respectively.

Integrated Power Switches

Recently switched-mode power supply integrators have moved towards integration of these switches on the same chip as the switched-mode controller integrated circuit. Examples of this integration are illustrated in FIG. 9, FIG. 10, FIG. 11, and FIG. 30. In many of these circumstances the manufacturers are emphasizing the small package size of the overall integrated system containing both the controller and the power switching devices (which are typically fabricated using lateral MOSFET pass devices). However, these integrated versions have some serious drawbacks, including the following:

1. The small package size limits the effective area (A) of the MOSFET pass devices, and as a result the current supplying capability of these designs is severely restricted. Rather than being capable of supplying dozens of amperes of peak current, these integrated pass device implementations are generally limited to low current (<3 A) applications.
2. The use of lateral MOSFETs in these integrated switching power supply controllers dictates both a low breakdown voltage as well as a relatively inefficient transconductance as compared to a wide variety of vertical MOSFET structures.
3. Package lead bond wire resistance can create a significant reduction in the effective Q of the external inductor when operated at high switching frequencies.
4. At high switching frequencies, radiation of RF energy from the switching system is a problem and must be shielded to conform to FCC and other regulatory restrictions.
5. While the integrated switching supply controllers illustrated in FIGS. 9–11 are by themselves small, the addition of the required external components typically doubles or triples the effective PCB area required to implement these functions. Little has been done to reduce this PCB board area overhead in the prior art. Since PCB board area typically costs $1/square inch in modern designs, this additional area translates directly into additional overhead cost in the final product. Furthermore, the lack of full integration of all external components tends to increase the overall cost of the final product, a result that is always undesirable.
6. Although the switching regulators illustrated in FIGS. 9–11 and FIG. 30 may be efficient at power conversion with low current levels, this is not the entire story when the system supports a complex digital integrated circuit load. Since there is always a finite inductance/resistance along PCB traces between the output of the switching regulator and the input to the complex digital integrated circuit load, this additional impedance can have a significant negative impact on the overall supply regulation at the complex digital integrated circuit load. Since the voltage sensing function for the switching regulator can never probe the voltage at the die surface of the complex digital integrated circuit load, there is insufficient information in the feedback loop to permit the switching regulator to properly adjust the output voltage in response to high power demands from the complex load.
7. While there are both systems that provide for inductor-based conversion (FIGS. 9–10, 30) and capacitor-based conversion (FIG. 11), neither has the potential to support peak currents on the order of 100 A that will be required of future power supply systems supporting low voltage digital systems. In short, while these technologies may improve with time, they are fundamentally limited by their architecture when dealing with the problems present in modern digital system power supply regulation.

While this is just a short list of the drawbacks of the prior art, they should alert the reader to the fact that even with recent advances in integration, there appears to be a host of problems in this art area that have yet to be addressed by the electronics industry. The present invention addresses most if not all of these issues and provides a method to overcome the prior art deficiencies while providing significantly better performance and energy economy in the resulting switched-mode power supply system.

Multi-Stage Power Conversion

1-Step Regulation

One method utilized by at least one integrated switched-mode power supply vendor to improve efficiency is the utilization of multi-stage power conversion within the context of an integrated voltage regulator system. As illustrated in FIG. 12, the performance of a typical 1-step switched mode regulator varies based on the VDDD(IN) supply voltage that is presented to the switched mode regulator system. Based on the curves of FIG. 13, it would appear that using the switched-mode topology in this example (illustrated by the schematic of FIG. 14), the performance of the system increases with decreasing VDDD(IN) supply voltage (lower power lost=higher efficiency for a given load current). The reason for this loss in efficiency is given in the literature:

"Traditionally, portable CPU voltage regulators operate over a wide range of input voltages. This 1-step regulation technique forces the power supply to operate from battery voltages as low as 8V to adapter voltages as high as 24V. This large input voltage range forces the designer to use a relatively large inductance value for the switch inductor [L1, FIG. 14]. The large inductor value means more energy storage, so the overvoltage transient will be larger with the load current rapidly changes from high to low. Additional output capacitances may be require to meet transient specifications.

CPU core voltage are currently in the 1.5V region. Using the 1-step approach, regulating 24V down to 1.5V forces the regulator to regulate narrow 'slivers' of input current to meet the transient requirements of high speed CPUs. A 24V wall adapter forces a 6.25% duty cycle when supplying a CPU voltage of 1.5V which means that the top [Q1, FIG. 14] MOSFET conducts for 0.2 us each cycle, at 300 kHz."

See John Seago, Linear Technology Design Note 209, "2-Step Voltage Regulation Improves Performance and Decreases CPU Temperature in Portable Applications", www.linear-tech.com/go/dnLTC1736 (August, 1999). While this loss of efficiency is a problem with 1-step regulation schemes, they are far more common than 2-step regulation schemes in common system designs.

2-Step Regulation

In contrast to 1-step regulation, the power lost using 2-step regulation can in low load current circumstances be made less than a 1-step regulator as illustrated in FIG. 14. Contrast the circuit topologies of FIG. 13 and FIG. 15 and details (1301) and (1501) to illustrate the circuit topology differences between a 1-step and 2-step regulator methodology respectively. Contrasting the performance curves of FIG. 12 and FIG. 14 reveals the fact that operation at a fixed input voltage of 5V proves to be overall more efficient than the 1-step regulator approach for all supply voltages once regulated down to 5V. This might give the reader pause, given that the individual efficiencies of each state of a 2-stage regulator must be less than 100%. The literature explains this anomaly by stating that "[a] common misconception is that the total efficiency of two circuits in series is the product of the efficiencies of each circuit. This is not true. Efficiency is defined as the total output power divided by the sum of the total output power plus all circuit losses.

2-step regulation takes advantage of the 5V regulator efficiency curve. The 5V supply has a peak efficiency of about 95% which is relatively flat over a wide range of load currents. The added current required to power the CPU supply causes the 5V regulator efficiency to decrease by about 1% but it also regulates the majority of the CPU power at about 94% efficiency. With a 5V input, the CPU regulator peaks at about 90% efficiency. Comparing 1-step and 2-step conversion efficiencies with a 12V input, the increased loss in the 5V regulator is about the same as the decreased loss in the CPU regulator so the overall system efficiency remains nearly constant."

See John Seago, Linear Technology Design Note 209, "2-Step Voltage Regulation Improves Performance and Decreases CPU Temperature in Portable Applications", www.linear-tech.com/go/dnLTC1736 (August, 1999).

However, it must be noted that neither of these 1-step or 2-step approaches really tackles the real problem with power conversion in a battery-powered environment: that of parasitic losses in inductors, capacitors, interconnect, and pass devices. The present invention specifically addresses these issues individually and en masse in an attempt to create switching regulator systems that exceed the 90% efficiency standard set by these existing switched mode regulation systems.

Efficiency/Startup Characteristics

As illustrated in FIG. 28, the prior art typically experiences 60–80% power conversion efficiencies for designs that are fully integrated. This poor performance (as compared to 90+% efficiencies with designs utilizing external MOSFET switches) is inherently due to poor on-resistance of the lateral on-chip MOSFETs utilized in current fully integrated designs.

It should be noted that the on-resistance characteristics also dictate a higher starting voltage for systems when the load presented to the regulator is increased. As illustrated in FIG. 29, this minimum starting operating voltage can increase substantially when the load presented to the regulator is increased. This effectively reduces the useful battery life of a portable system, an undesirable characteristic. By reducing the on-resistance of switching devices used in regulators, the present invention overcomes this deficiency in the prior art and improves the capability of systems to operate at depressed battery voltages.

Cascading Area Penalty

It is significant to note in FIG. 13 and FIG. 15 that the transistors (Q1, Q2, Q3) that are driven externally by the integrated circuit must be provide sufficient gate drive to overcome capacitive effects of the large gate plate associated with these transistors. This is especially true in situations where the transistors are integrated as lateral devices on-chip as illustrated in FIGS. 9–11.

This gate drive requirement has associated with it a cascading area penalty to minimize power dissipation during switching of the power transistor. The literature describes this penalty in terms of determining the minimum power dissipation when the transistor size ratio of the final inverter stage to the first stage is given. As stated by the literature (and edited for content herein):

"This problem can be seen not only in the DC-DC converter but also in an output pad where the output transistor size is given from specifications such as drive capability.

Power dissipation in the jth stage can be expressed as follows:

$$P[j]=P_C[j]+P_S[j] \quad (5)$$

Where PC[j] is power dissipation due to charging and discharging and PS[j] is power dissipation due to crowbar current. Let us assume that PC[j] is proportional to W[j] and inversely proportional to signal slope. Let us also assume that the signal slope is proportional to W[j−1]/W[j] because driving current is proportional to W[j−1] and loading capacitance is proportional to W[j]. Then PC[j] and PARTNERSHIP [j] are given by $$P_C[j]=U \times W[j]$$

$$P_S[j] = V \times W[j] \times \frac{W[j]}{W[j-1]} \quad (6)$$

Where U and V are constants. Total power dissipation is therefore given by $$P_{TOTAL}=\Sigma P[j]$$

$$P_{Total} = \sum P[j] \quad (7)$$
$$= V(M-1) \times \frac{x(K+x)}{x-1} \times W[0]$$

where $$x = \frac{W[j]}{W[j-1]} \quad (8)$$

$$M = \frac{W[n]}{W[0]}$$

$$k = \frac{U}{V}$$

When the partial derivative of Ptotal/x is zero the total power dissipation becomes minimum. Then $$x = 1 + \sqrt{1+K} \quad (9)$$

$$N = \frac{\ln\left(\frac{W[n]}{W[0]}\right)}{\ln x}$$

. . . " See Tadahiro Kuroda, Kojiro Suzuki, Shinji Mita, Tetsuya Fujita, Fumiyuki Yamane, Fumihiko Sano, Akihiko Chiba, Yoshinori Watanabe, Koji Matsuda, Takeo Maeda, Takayasu Sakurai, and Tohru Furuyama, "Variable Supply-voltage Scheme for Low-Power High-Speed CMOS Digital Design", IEEE JOURNAL OF SOLID-STATE CIRCUITS, Vol. 33, No. 3, at 454–462 (March 1998).

What is significant about equation (9) is that the number of stages (N) is generally proportional to the natural logarithm of the size ratio between the smallest integrated driver and the size of the largest (possibly non-integrated) driver. If these ratios are large, the number of buffer stages can be significant, and result in a substantial loss of integrated circuit die area in the fabrication of these devices. Note that this formulation is generally applicable to lateral MOSFET devices, and would be improved somewhat when using Chen-style devices (or other vertical pass devices) that have substantially lower gate capacitances than their lateral counterparts. This capacitance differential is used to advantage in the present invention.

SUMMARY

In summary, while the prior art has endeavored to improve both linear and switched-mode regulator systems for use with complex integrated circuit loads, there appears to be a host of practical issues that have yet to be addressed, including but not limited to the following:
1. RDS(on) values for linear regulator systems are still too high to solve problems with high current digital systems.
2. Associated capacitance requirements for linear regulators are too high to provide for fast response to high-current step loads.
3. Integration levels and power handling capabilities of switched mode regulators are too low for many modern digital systems.
4. Existing linear and switched mode regulators are generally not low power if they must supply a high current output load.
5. The economics of extrapolating the current design techniques for on-chip power supply regulation are cost prohibitive.
6. Gate drive limitations for low voltage systems dictate that pass device areas be so huge so as to be uneconomical in many circumstances using existing design techniques.
7. Proposed 'novel' MOSFET topologies in the literature are not amenable to high voltage environments, such as might be present in an all-electric automobile or in a household appliance.
8. Thermal management in the prior art is problematic because of the slavish use of lateral MOSFETs in these designs. This mantra has been taken for granted within the prior art, as existing process techniques did not provide for the economic integration of both vertical power devices and high-density digital control logic.

These points taken individually may in some rare cases be solvable by niches of the prior art, but combinations of these problems are the norm in modern integrated system design, and such combinations have proven intractable via use of existing design methodologies. The industry is primed for a system/method whereby these drawbacks in the current art can be overcome and thus provide a platform for the next generation of high performance fully integrated digital/analog systems.

OBJECTS OF THE INVENTION

Accordingly, the objects of the present invention are (among others) to circumvent the deficiencies in the prior art and affect one or more of the following objectives:
1. Significantly improve the RDS(on) characteristic of pass devices used in conventional regulator/switch functions in an integrated circuit environment.
2. Improve the performance of regulator/switch functions within an integrated circuit environment by permitting the use of lateral and/or vertical pass devices in these circuits.
3. Reduce or eliminate the amount of circuit chip die area that is consumed by pass devices in regulator/switch functions to improve the overall cost of integrated circuits requiring these functions.
4. Permit high voltage pass devices to be incorporated on the same integrated circuit die as low voltage circuitry without the need for exotic fabrication processes.
5. Permit integration of analog and digital systems on the same chip with minimal noise and crosstalk between the systems.
6. Permit independent regulation/switching of voltage/current/power to various portions of a given integrated circuit so as to allow both better PSRR for each system component as well as the option of reducing overall system power by switching off various integrated circuit subsystems when not in use.
7. Provide an economical and efficient means for digital integrated circuits that are targeted towards portable applications to manage power consumption so as to conserve battery power and extend battery life in these applications.
8. Permit retrofit of existing integrated circuits to permit incorporation of improved regulator/switching capabilities.
9. Improve the local power supply stability in a wide variety of integrated circuits as compared to the prior art.
10. Permit the integration of high current regulator/switch functions in modern analog, digital, and mixed-signal designs.
11. Permit the use of integrated appliance system networks in areas that heretofore were not practical due to lack of integration in the prior art.

While these objectives should not be understood to limit the teachings of the present invention, in general these objectives are achieved by the disclosed invention that is discussed in the following sections.

BRIEF SUMMARY OF THE INVENTION

Overview (1700)

Briefly, the invention is a system and method permitting voltage and/or current regulation and/or switching of power within the context of an integrated circuit environment while simultaneously eliminating the need for chip area consumption by high current capacity pass devices commonly employed within the prior art. Rather than implementing the required pass devices necessary for voltage/current regulation/switching on the same integrated circuit plane as the foundation integrated circuit (FIC), the present invention implements the regulator/switching structure on top (or bottom) of the existing foundation integrated circuit. Thus, as illustrated in FIG. 17, the term foundation integrated circuit will be used to describe the existing integrated circuit 'foundation' on which the regulator/switch functionality is fabricated.

This new regulator/switching topology can make use of a wide variety of pass transconductor types, but many preferred embodiments of the present invention utilize Chen-style vertical MOSFETs (as described in U.S. Pat. No. 5,216,275) or the like to provide for superior RDS(on) performance and corresponding 'stiffer' supply regulation characteristics. While the present invention topologies are applicable to both regulator and/or switching applications, there is a particular class of applications involving high speed low voltage microprocessors in which the present invention excels over the prior art. Specifically, the advent of low voltage processors ($\leq 1.0$V to 1.8V VDD) with corresponding high current transients (50 A to $\geq 100$ A) will require that any power supply used to support these regulators be capable of "deal[ing] with very dynamic loads at high current-slew rates during transients." See Roger Allan, "Lateral CMOS Process Yields 7.4V MOSFET With An On-Resistance of 6 mΩ", ELECTRONICS DESIGN 36–37 (Jul. 12, 1999).

ADVANTAGES OVER THE PRIOR ART

The present invention solves the problems present in the prior art by permitting the following:

1. Pass devices generated using the present invention may be of the vertical device configuration (a feature not possible with the prior art), permitting drastically reduced RDS (on) resistance values as compared to conventional lateral MOSFET and BJT device structures. Thus, it is easy to fabricate pass devices with RDS(on) resistance values approaching three orders of magnitude lower than conventional lateral device geometries.
2. No additional chip area is necessary to implement voltage and/or current and/or power regulation and/or switching functions, in contrast to the prior art that requires large chip area sacrifices to implement any form of regulation and/or switching functions.
3. Since no additional chip area is necessary to implement pass devices using the present invention, the pass devices utilized for regulation/switching functions are only limited by the die area of the foundation (bottom/top) integrated circuit.
4. Since pass devices may have large effective areas in the present invention without consuming additional foundation chip area, the quality of the pass device (from a per unit performance perspective) need not be on par with the rest of the process technology to still provide significant advantages over the prior art lateral-type foundation integrated circuit pass devices. Thus, the economics of the present invention are superior to the existing prior art even using low-quality pass devices, as long as the effective performance of the low quality device can overcome the additional area penalty associated with the prior art configurations.
5. Existing integrated circuits may be augmented with voltage regulation/switching functions without the need for massive re-layout of the foundation integrated circuit. Thus, retrofit of existing integrated circuits is entirely possible using the present invention. This feature may be heavily utilized in system-on-a-chip (SOC) designs where existing intellectual property (IP) chip designs are integrated on a single die and independently regulated/switched using the present invention.
6. In contrast to prior art regulation/switching implementations, the present invention requires much less chip layout planning for its implementation. Regulation/switching functions occur at another level of integration and are separate from the routing concerns at the foundation integrated circuit level.
7. The present invention provides a more uniform power plane to the foundation integrated circuit than is possible with existing power routing within prior art integrated circuits. By providing a uniform metalized base plate, the present invention eliminates the need for exotic chip layout methodologies to minimize power supply noise coupling within the foundation integrated circuit. See Mark Ingels and Michiel S. J. Steyaert, "Design Strategies and Decoupling Techniques for Reducing the Effects of Electrical Interference in Mixed-Mode ICs", IEEE JOURNAL OF SOLID-STATE CIRCUITS, Vol. 32, No. 7, at 1136–1141 (July 1997).
8. While conventional integrated circuit design tends to dictate separate power and ground busses for mixed signal designs, the present invention permits individual regulation of the power supplies for separate parts of a mixed-signal foundation integrated circuit.
9. The ability to provide for individual regulation of power within separate portions of the foundation integrated circuit permits a much more robust PSRR to be achieved than that which is possible with existing integrated circuit layout techniques. This independent regulation capability permits high levels of isolation to occur between analog and digital circuitry on the same chip, thus permitting a higher degree of integration with mixed-signal integrated circuit designs.
10. In contrast to traditional methods of power supply routing within an integrated circuit, the present invention utilizes. a power plane interconnect philosophy similar to that employed in printed circuit board (PCB) manufacturing. This methodology provides for both reduced power supply noise in remote areas of the integrated circuit, but also provides an inherent capacitive charge storage element that tends to stabilize the power supply voltage at the point of use within the foundation integrated circuit. Additionally, since the present invention integrates active devices as part of the power distribution plane, a level of performance and efficiency not possible with conventional PCB designs is possible.
11. By providing a more reliable and stable power source, the present invention increases the reliability of existing digital, analog, and mixed-signal designs above that available in the prior art. Because the voltage fluctuations on the local power supply are drastically reduced as compared with the existing prior art, random external power fluctuations may be more easily filtered by the present invention before they impact the performance of the foundation integrated circuit.
12. The present invention permits higher supply voltages to be utilized to power low voltage analog and/or digital core circuitry without the need for exotic integrated circuit process steps. The reliability problems with conventional circuitry with respect to stressing thin gate oxide are eliminated with the present invention topology. This capability may in some circumstances permit the foundation integrated circuit to be powered from high voltage power sources such as the AC line and/or car and truck batteries, thus eliminating the need for external AC/DC converters and/or regulators.
13. The present invention provides the only known method of supplying peak currents on the order of hundreds of amperes for high density digital and analog designs that are at the forefront of today's and future growth trends in integrated circuit manufacture.
14. The present invention permits the thermal gradient normally associated with regulator/switch pass devices to be largely eliminated. Since the regulator/pass devices are positioned above/below the foundation integrated circuit which is powered by the pass device, the localized thermal increase is evenly distributed above the circuitry affected, thus permitting precision analog circuitry to be fully integrated in a mixed-signal environment with little concern for errant thermal gradients across the chip.
15. The present invention permits the only known method of incorporating anticipatory regulation within the power regulation methodology structure of an integrated circuit. This form of regulation is proactive, rather than reactive as taught within the prior art, and can in many circumstances provide tighter regulation with less system overhead than required in the prior art.

While the above list is only a partial depiction of the benefits of the present invention, more detail and information is available by inspection of the accompanying drawings and informative text.

BRIEF DESCRIPTION OF THE DRAWINGS

The file of this patent contains at least one photograph executed in color. Copies of this patent with color photographs will be provided by the Patent and Trademark Office upon request and payment of the necessary fee.

For a fuller understanding of the advantages provided by the invention, reference should be made to the following detailed description together with the accompanying drawings wherein.

DESCRIPTION OF THE PRESENTLY PREFERRED EXEMPLARY EMBODIMENTS

Embodiments are Exemplary

Figure 1:
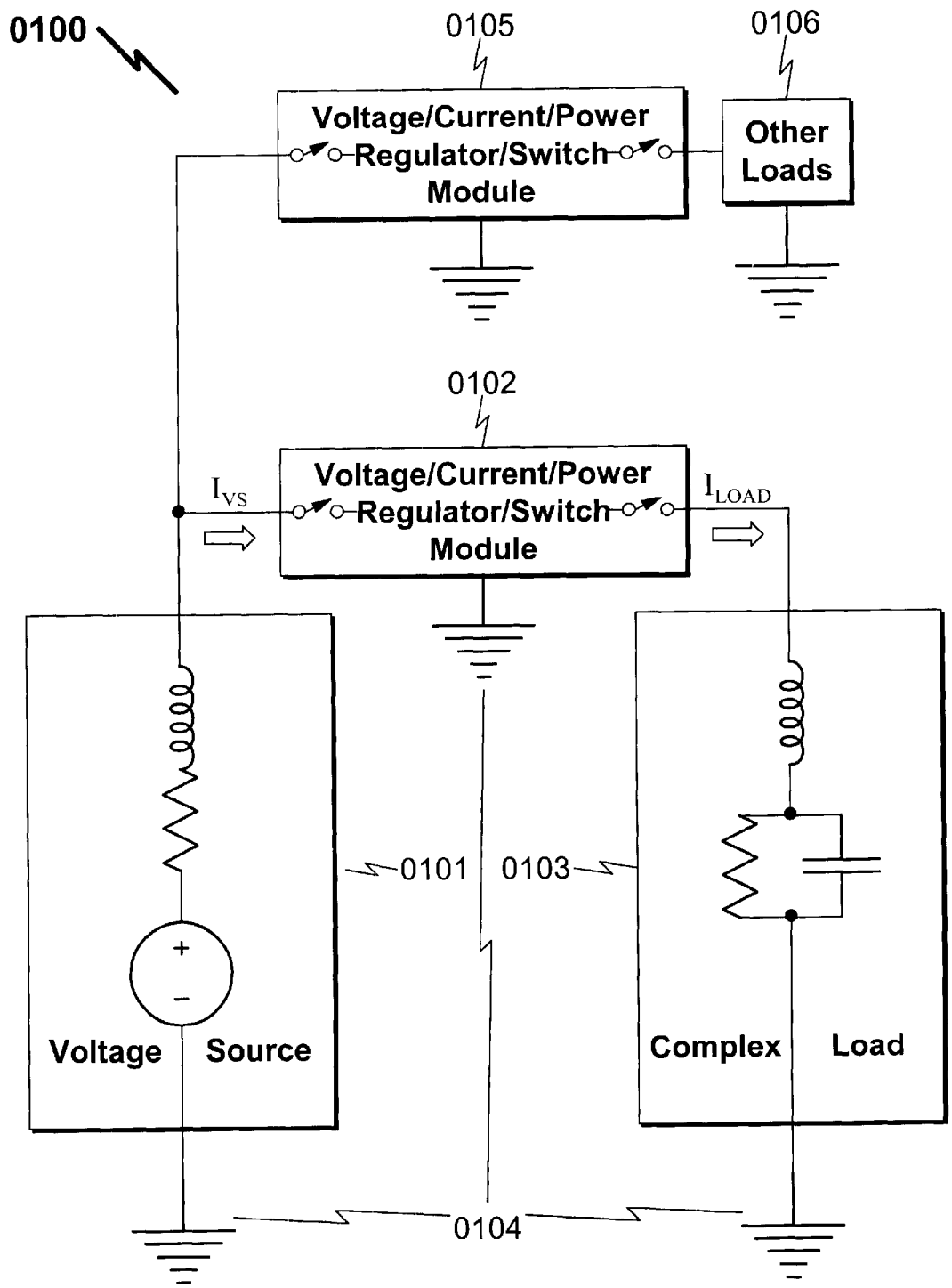
FIG. 1 illustrates an exemplary block diagram of the problem posed in integrated circuit environments which must provide for VCPRS functionality.
Figure 2:
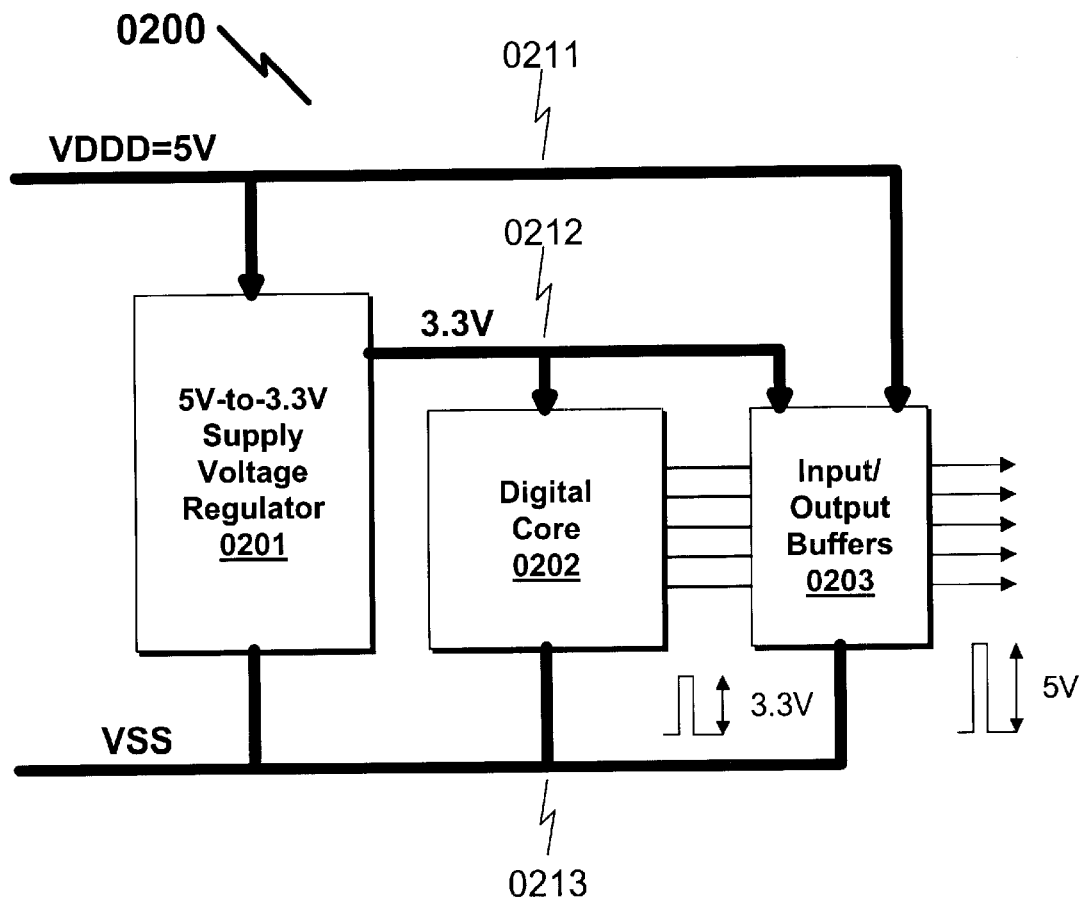
FIG. 2 illustrates a prior art approach to the local regulation of integrated circuit voltages in a multi-voltage integrated circuit environment (see Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998))
Figure 3:
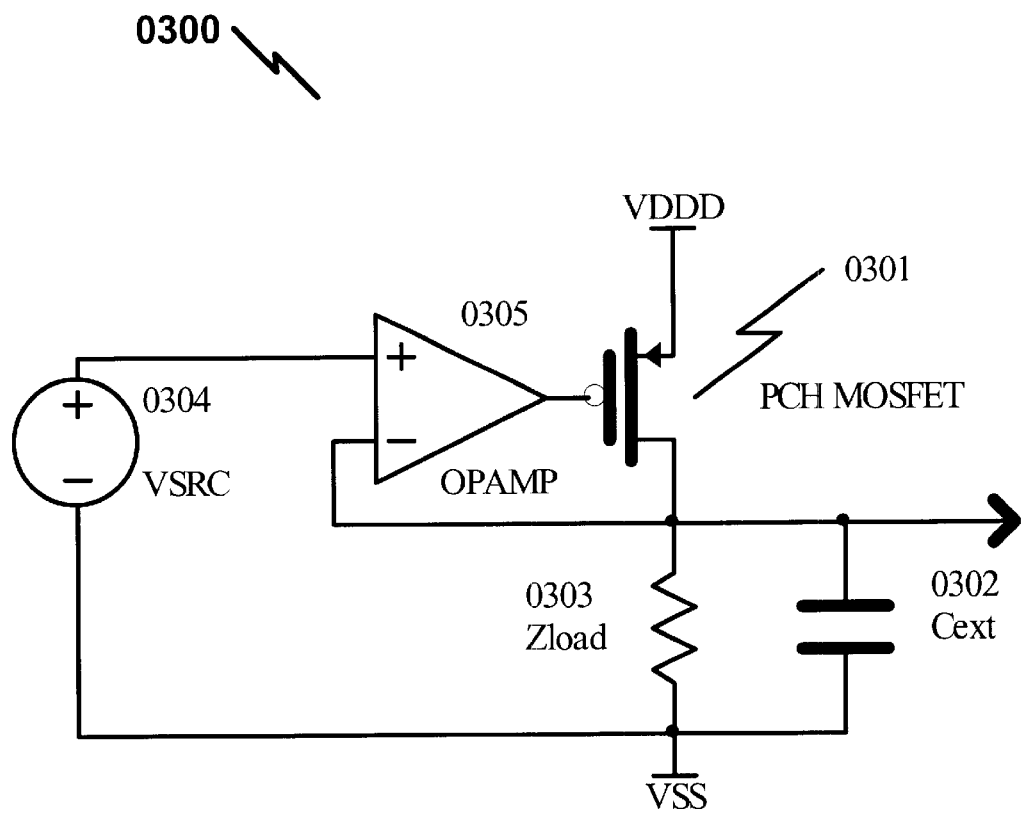
FIG. 3 illustrates a conventional prior art P-channel style voltage regulator topology (see Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998))
Figure 4:
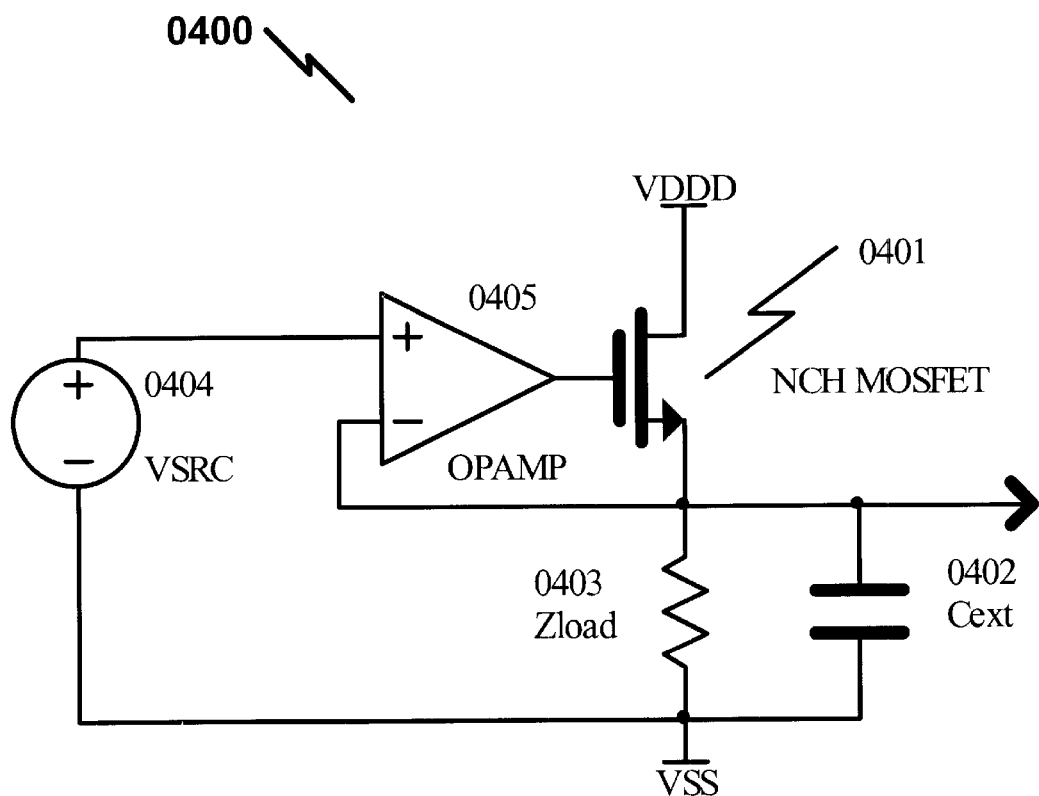
FIG. 4 illustrates a conventional prior art N-channel style source follower voltage regulator topology (see Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998))
Figure 5:
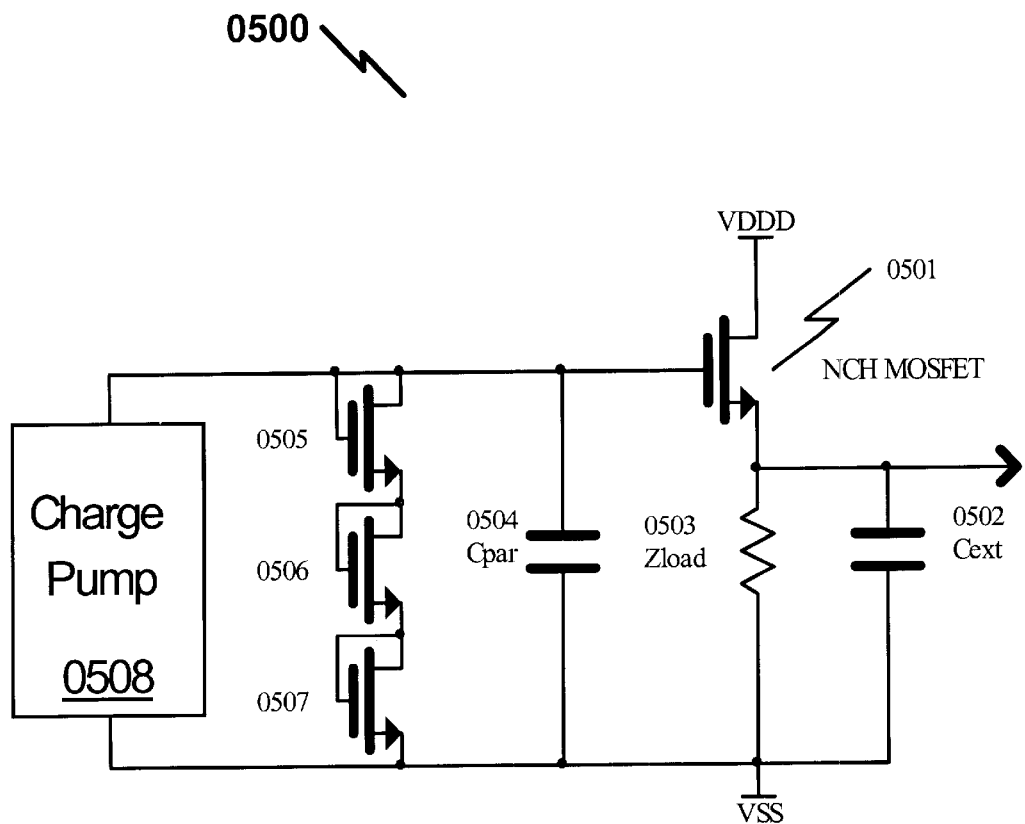
FIG. 5 illustrates a variation of the prior art N-channel style source follower voltage regulator in which a charge pump is utilized to increase the output voltage range of the system (see Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998))
Figure 6:
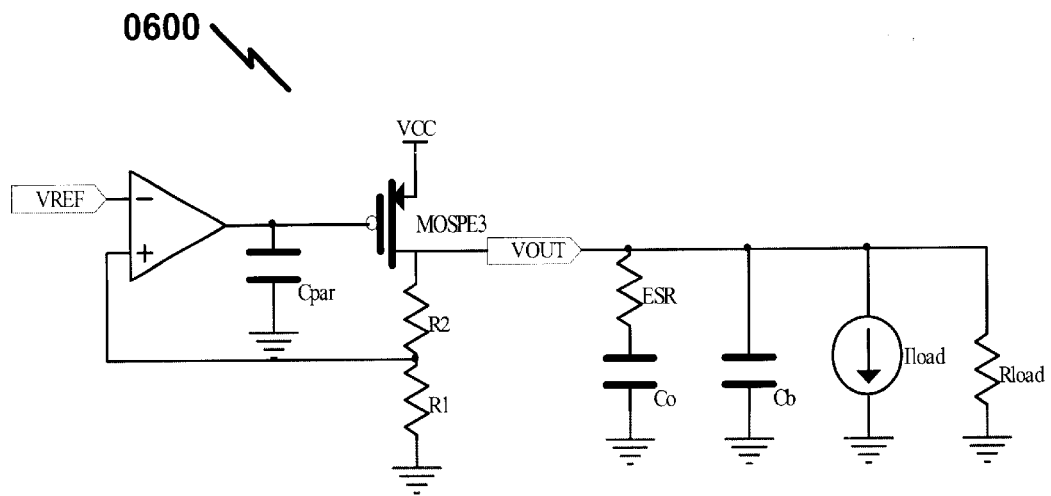
FIG. 6 illustrates a conventional prior art low-dropout regulator configuration that incorporates ratioed feedback to permit the use of bandgap references to control the output voltage regulation (see Gabriel A. Rincon-Mora and Phillip E. Allen, "A Low-Voltage, Low Quiescent Current, Low Drop-Out Regulator", IEEE JOURNAL OF SOLID-STATE CIRCUITS, Vol. 33, No. 1, at 36–44 (January 1998))
Figure 6:
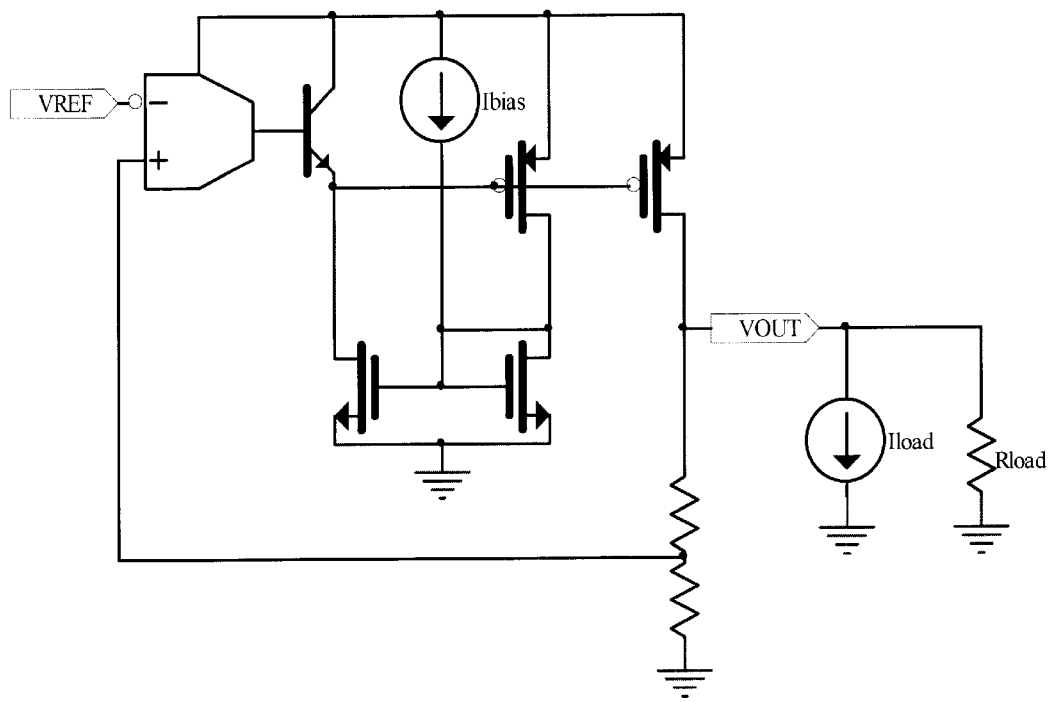
Figure 7:
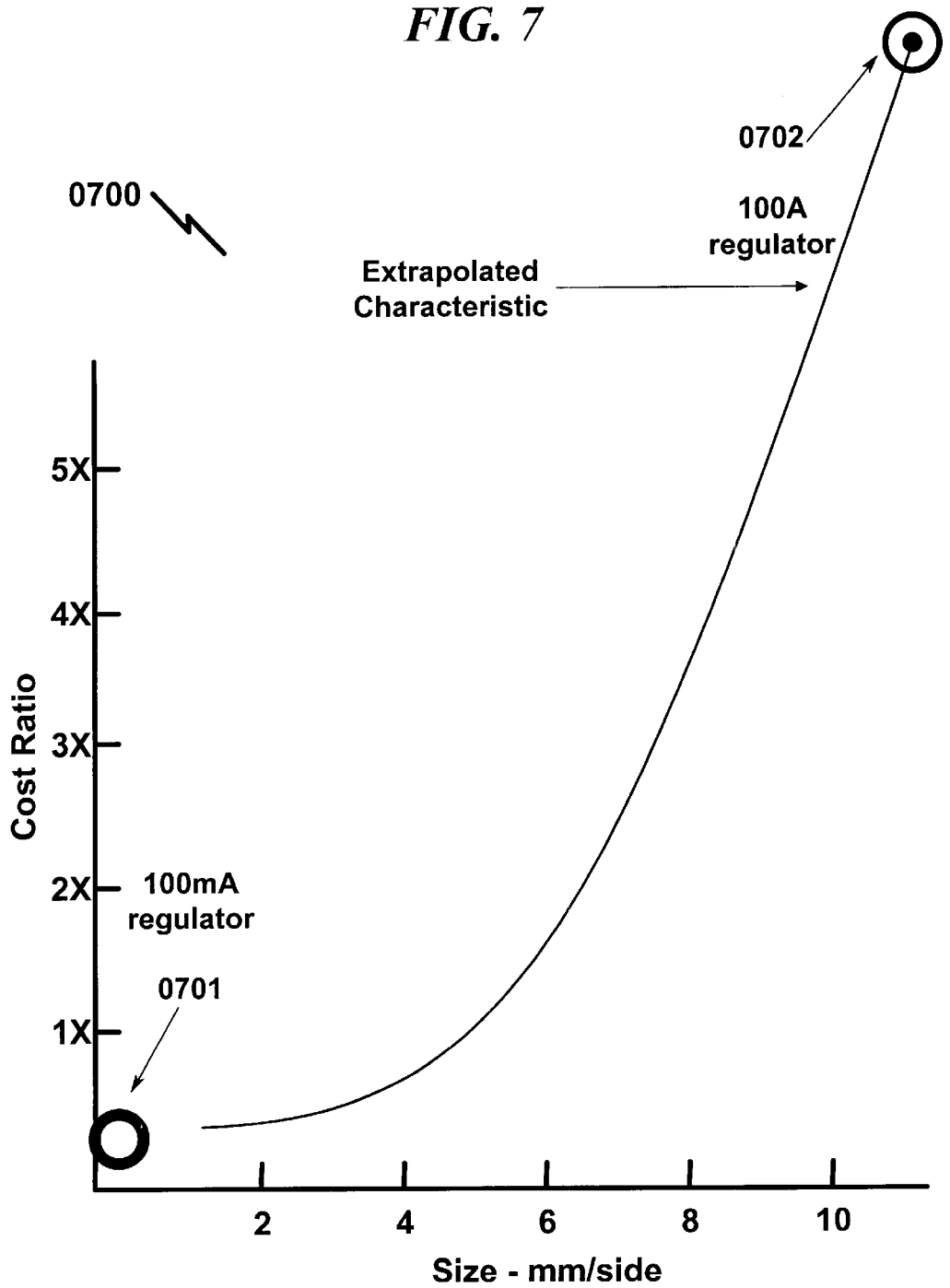
FIG. 7 illustrates a typical cost analysis curve comparing integrated circuit chip die cost versus the size of the die (see Mark Dorais, "Analyze ASIC Designs To Optimize Integration Levels", Supplement to ELECTRONIC DESIGN, at 83–86 (Aug. 9, 1999))
Figure 8:
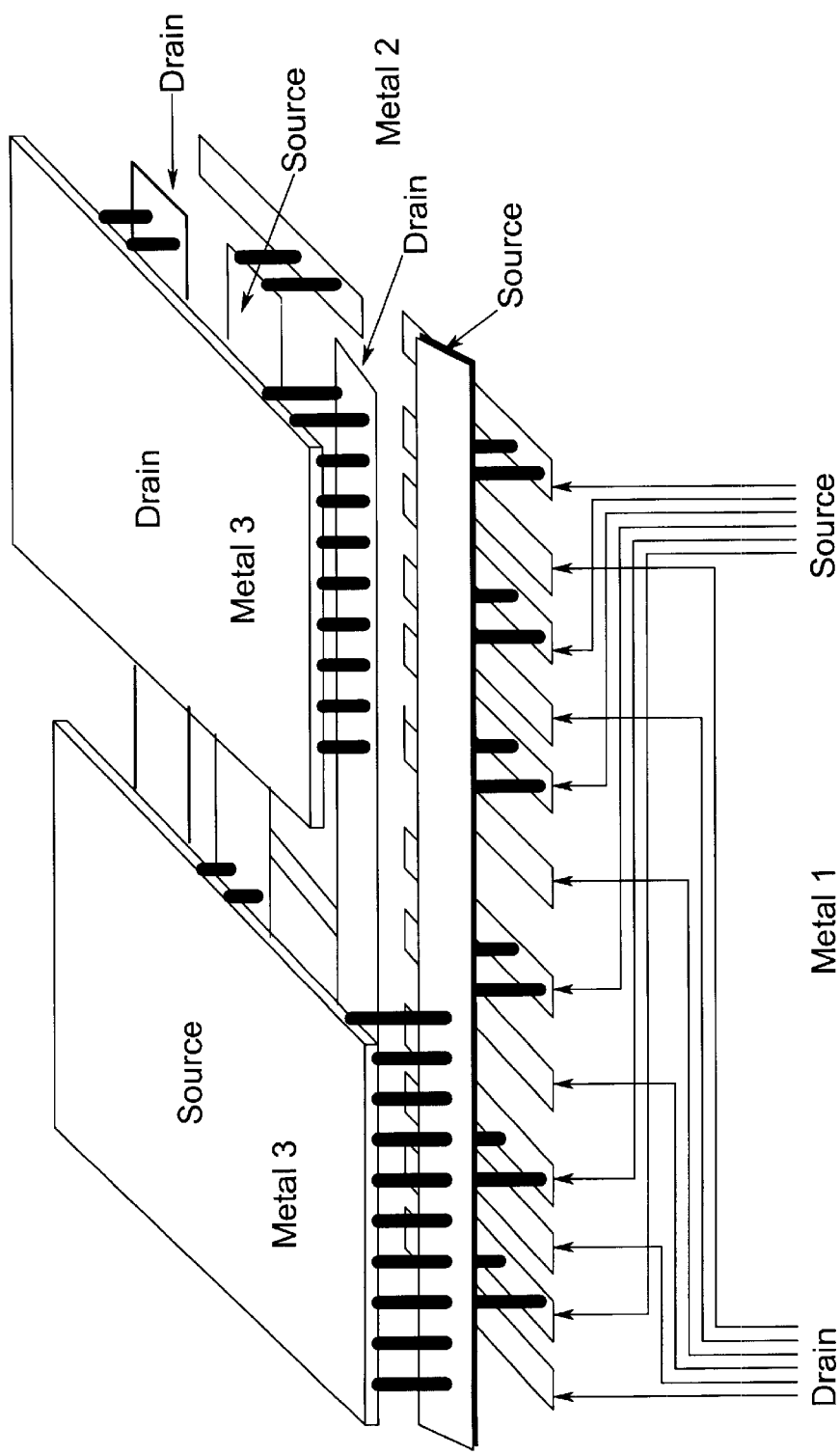
FIG. 8 illustrates a more exotic prior art design approach to using multi-level interdigitated metal interconnect to reduce the effective impedance of lateral MOSFET device structures (see Roger Allan, "Lateral CMOS Process Yields 7.4V MOSFET With An On-Resistance of 6 mΩ", ELECTRONICS DESIGN 36–37 (Jul. 12, 1999))

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of an integrated voltage/current/power regulator/switch system and method. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

Definitions

Throughout the discussion in this document the following definitions will be utilized:

Regulator/Switch not Limitive

Throughout the discussion of the present invention the term 'regulator/switch' or 'voltage/current/power regulator/switch (VCPRS)' will be utilized to indicate a circuit capable of regulating and/or switching voltage and/or current and/or power to one or more load circuits. The rationale for this broad definition is that in many circumstances the regulator pass circuit (FIG. 1, 0102) will encompass a voltage and/or current and/or power regulation characteristic in addition to a method to completely switch off the voltage/current/power path to the load (FIG. 1, 0103). This switching capability may not be present in all circuit embodiments, but will have utility in many applications. Similarly, there are certain applications in which the predominant function of the regulator/switch is one of switching only, and as such the regulation function is diminished or non-existent. It should be emphasized that the teachings of the present invention do not limit the combinations of functions available in and encompassed by the term 'regulator/switch'.

Voltage Regulator/Switch not Limitive

The present invention will speak of a generalized voltage regulator/switch function as illustrated in FIG. 1. However, it should be noted that the same teachings may be equally applied to the task of providing current and/or power regulation/switching with no loss of generality. Therefore, the term 'voltage regulator/switch' should be implicitly understood to include the potential for a 'current regulator/switch' and/or 'power regulator/switch' with no loss of generality.

Additionally, any mention of the term 'regulation' within the context of this document should also be considered to include generalized power conversion as well, including but not limited to DC-DC power conversion.

Pass Device not Limitive

A pass device is an active power switch that may comprise a metal oxide semiconductor field effect transistor (MOSFET), a bipolar junction transistor (BJT), combinations of these devices, and/or any other active semiconductor transconducting element. Both N-type and P-type conduction mechanisms are anticipated (along with their combinations), and thus N-channel, P-channel, NPN, and PNP type transistors are specifically anticipated (without limitation) within this context.

Chen-Style Structure not Limitive

Throughout the discussion herein reference will be made to Chen-style devices and structures. By this term (Chen-style), reference is specifically made to U.S. Pat. No. 5,216,275 for SEMICONDUCTOR POWER DEVICES WITH ALTERNATING CONDUCTIVITY TYPE HIGH-VOLTAGE BREAKDOWN REGIONS issued to Xingbi Chen on Jun. 1, 1993 and initially assigned to the University of Electronic Science and Technology of China.

Figure 14:
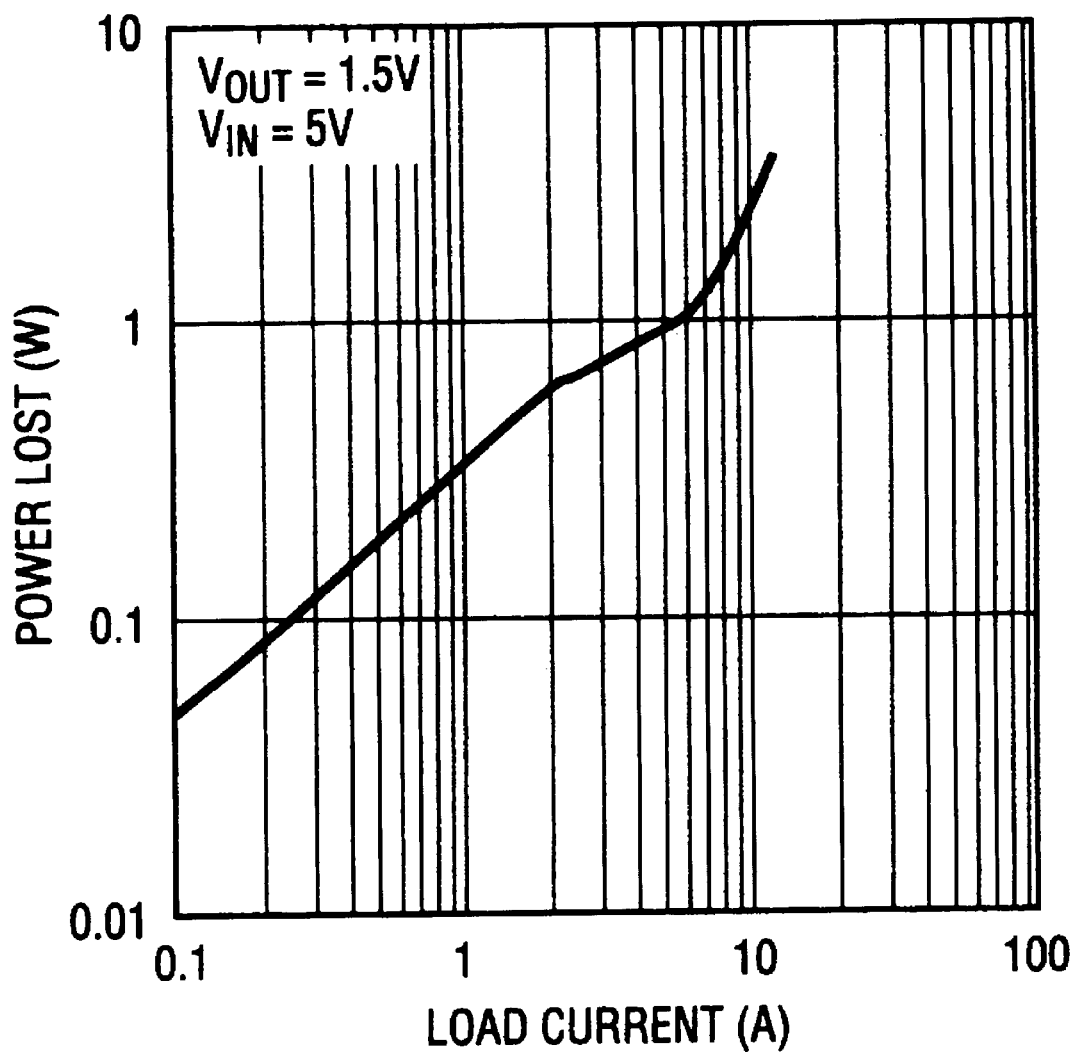
FIG. 14 illustrates a prior art performance curve for an exemplary 2-step power converter style voltage regulator (see John Seago, Linear Technology Design Note 209, "2-Step Voltage Regulation Improves Performance and Decreases CPU Temperature in Portable Applications", www.linear-tech.com/go/dnLTC1736 (August, 1999))
Figure 15:
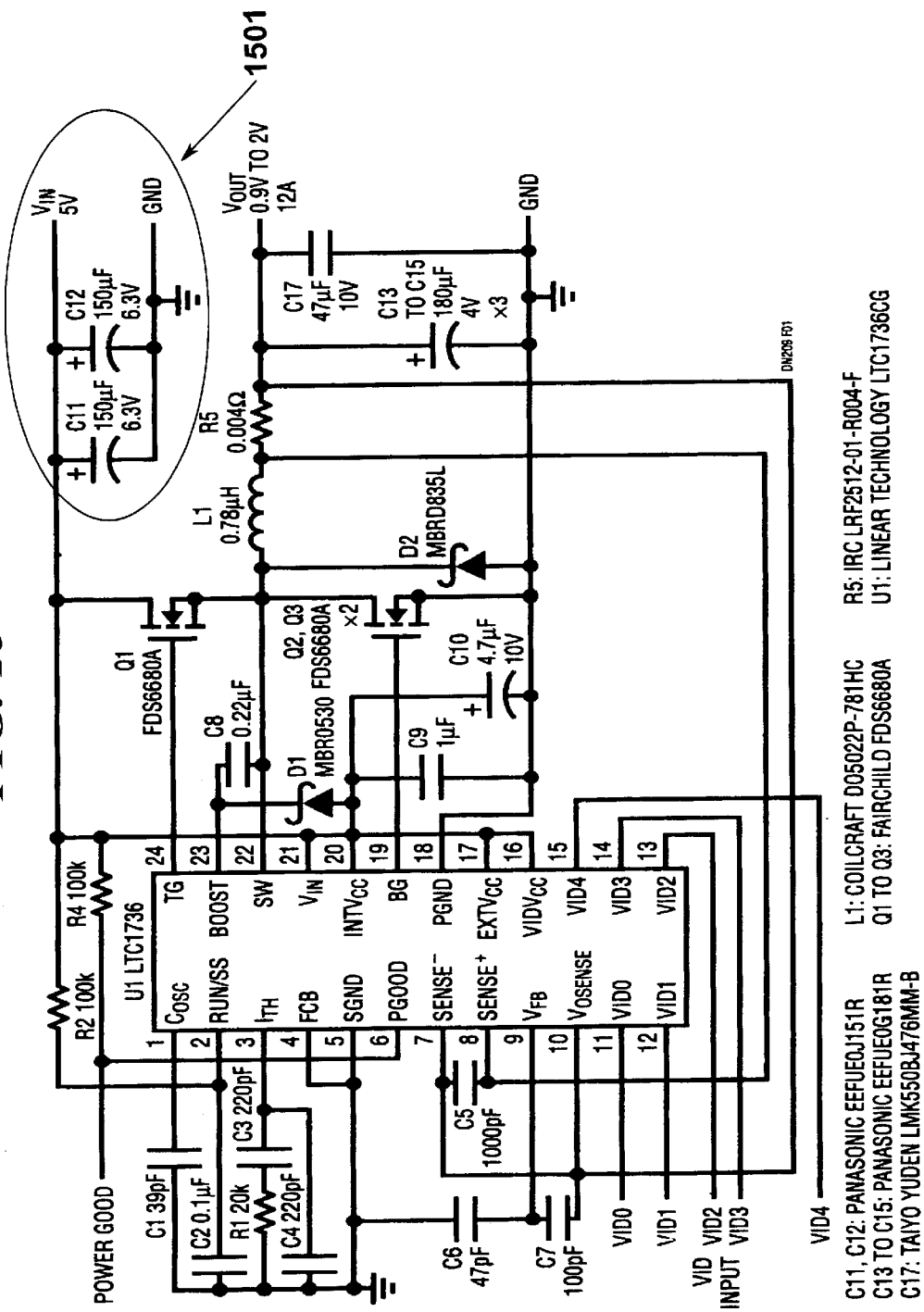
FIG. 15 illustrates a typical circuit topology for a 2-step power converter system (see John Seago, Linear Technology Design Note 209, "2-Step Voltage Regulation Improves Performance and Decreases CPU Temperature in Portable Applications", www.linear-tech.com/go/dnLTC1736 (August, 1999))

However, it should be noted that within this document the term 'Chen-style' refers to any integrated device structure using the teachings of the Chen patent, whether or not the teachings are specifically delineated by the claims. Therefore, the term 'Chen-style' will refer to any vertical transconducting device geometry having complementary conductivity type high-voltage breakdown regions. As illustrated in FIG. 14 and FIG. 15, these complementary conductivity type high-voltage breakdown regions need not directly contact the highly doped substrate to constitute a device structure which is equivalent to the claimed Chen structure, but which in fact may not directly infringe the Chen claims.

Pass Devices Architecture not Restrictive

Pass devices in the context of conventional voltage regulator/switches are typically constructed to pass large amounts of current and have been traditionally constructed using horizontal (lateral) MOSFET and/or BJT structures. While it is believed that the present invention is most advantageously applied using vertical Chen-style MOSFET and/or BJT and/or DIODE structures, the present invention is not limited to this particular style of fabrication and may use any of the other commonly available methods to fabricate the pass device, including all available horizontal/lateral fabrication methods. While it is believed that the Chen-style construction methods provide the best overall performance, variations on this construction style, including methods described by Bagila are also anticipated.

Foundation Integrated Circuit

The term 'foundation integrated circuit (FIC)' and its variants refer to any integrated circuit structure that requires a regulator and/or switching function for one or more power sources. Generally, within the context of the present invention, the foundation integrated circuit will serve as a fabrication foundation on which the integrated VCPRS will be formed. While the foundation integrated circuit may be of any technology type, it is specifically envisioned that the present invention may be advantageously applied to CMOS digital, analog, and mixed signal integrated circuits, as these circuits tend to have significant problems with respect to ground bounce, power supply rejection ratio, power-supply induced noise, and power supply voltage stability due to losses associated with non-zero metal interconnect resistivity. Finally, it should be noted that the foundation integrated circuit need not actually make use of the regulator/switch functionality fabricated vertically on its top. This regulator/switch function may be incorporated on the foundation integrated circuit but used in conjunction with circuitry external to the foundation integrated circuit.

Target Integrated Circuit

Within the context of this discussion, the term 'target integrated circuit' or 'regulated integrated circuit', will refer to an integrated circuit that requires some form of regulation and/or switching functionality. Within this context, the term 'target integrated circuit' will refer generally to prior art system configurations utilizing on-chip lateral pass devices. It is significant to note that Chen-style devices are not amenable to use in these applications using the teachings of the prior art.

Above/Below Not Limitive

While in many preferred embodiments of the present invention the regulator/switch function is implemented in a VCPRS structure positioned above the foundation integrated circuit, nothing in this disclosure should be construed to limit the structure to this embodiment. As will be illustrated in this disclosure, the foundation integrated circuit may also be fabricated above (on top of) the VCPRS structure.

Thus, within the context of this disclosure, the terms 'above' and 'below' can be interchanged with no loss of generality in the teachings of the present invention. One skilled in the art will no doubt recognize that the present invention can also be implemented utilizing a foundation integrated circuit that is sandwiched between two VCPRS structures, one VCPRS structure below the FIC and the other VCPRS structure created above the FIC.

Formation Not Limitative

Within the context of the methods described in this document, the term 'form' or 'formation' should be given a broad interpretation and includes but is not limited to deposition, sputtering, growing, or any other semiconductor process that may be used to achieve the desired film formation function.

Metal/Metalization not Limitive

The present invention may mention the use of tungsten (W), aluminum (Al), copper (Cu), or other metals to perform metal interconnect functions. While this is believed to be the best method of implementing the present invention, in practice any form of conductive interconnect that can pass electric current is suitable to implement the teachings of the present invention. While the use of metal (in some form) is highly desirable for its high conductivity characteristics, the terms 'metal' and 'metalization' should be broadly construed to include any form of conductive material capable of passing an electric current. Similarly, the term 'conductor' should be given a broad interpretation within the context of the semiconductor process technology art.

Insulator not Limitive

Where the present invention makes use of any form of insulating material, it should be given a broad interpretation. While the insulating layer in many preferred embodiments is typically silicon dioxide ($SiO_2$), any insulating material consistent with the fabrication process may be used.

System Overview

The present invention abandons the approach taken by the prior art in utilizing lateral MOSFETs and/or BJTs to regulate and/or switch power to a target integrated circuit and instead integrates a vertical pass device above the foundation integrated circuit in order to regulate/switch power from a power source to the foundation integrated circuit.

Figure 17:
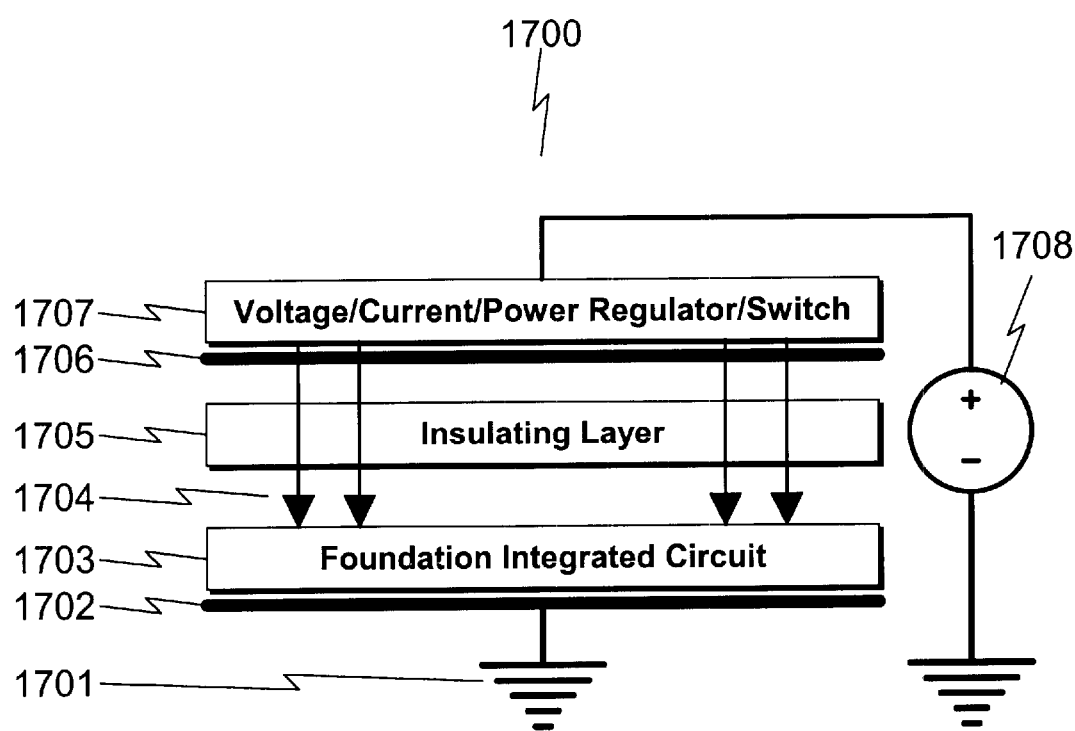
FIG. 17 illustrates an exemplary embodiment of the present invention system.

Referencing FIG. 17, the basic system (1700) begins with a power source (1708) that supplies power to a foundation integrated circuit (1703) that is generally electrically connected (1702) to a common ground (1701) reference voltage point. Instead of providing regulator/switch functionality within the foundation integrated circuit (1703) the voltage regulator/switch (1707) in this exemplary embodiment is oriented above and on top of the foundation integrated circuit (1703). An insulating layer (1705) separates the voltage regulator/switch (1707) and the foundation integrated circuit (1703), with one or more via-style interconnect punchthroughs (1704) providing a conducting means to supply power from the voltage regulator/switch (1707) to the foundation integrated circuit (1703).

Within the context of the present invention, it is envisioned that the best modes of the present invention will also include a metalized back plate (1706) on top of the insulating layer (1705) to support the voltage regulator/switch so as to provide both a fabrication platform for the voltage regulator/switch (1707) and/or a means for conducting current from the voltage regulator/switch to the via-style interconnect punchthroughs (1704).

Method Overview

Figure 18:
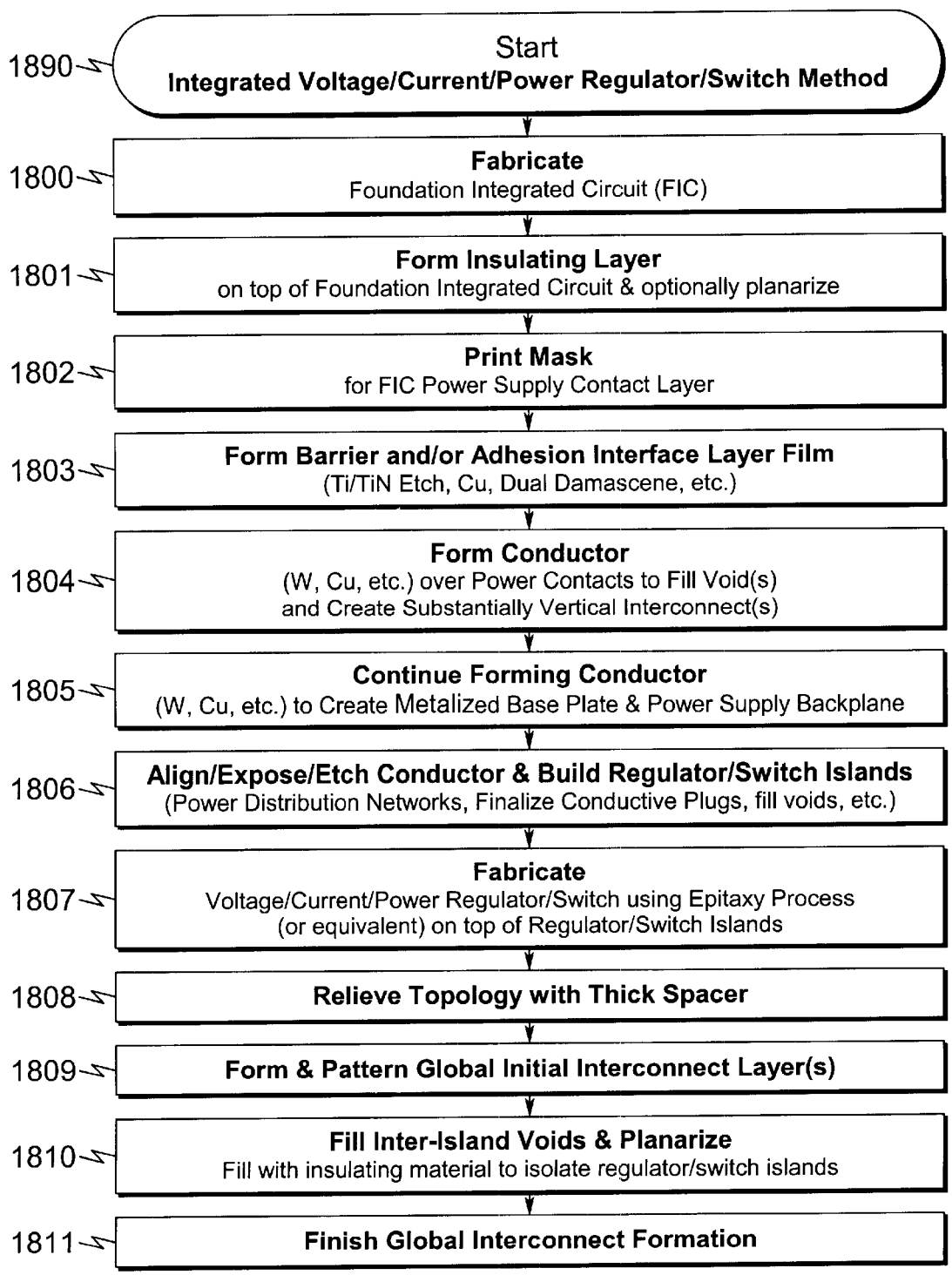
FIG. 18 illustrates an exemplary embodiment of the present invention method.
Figure 19:
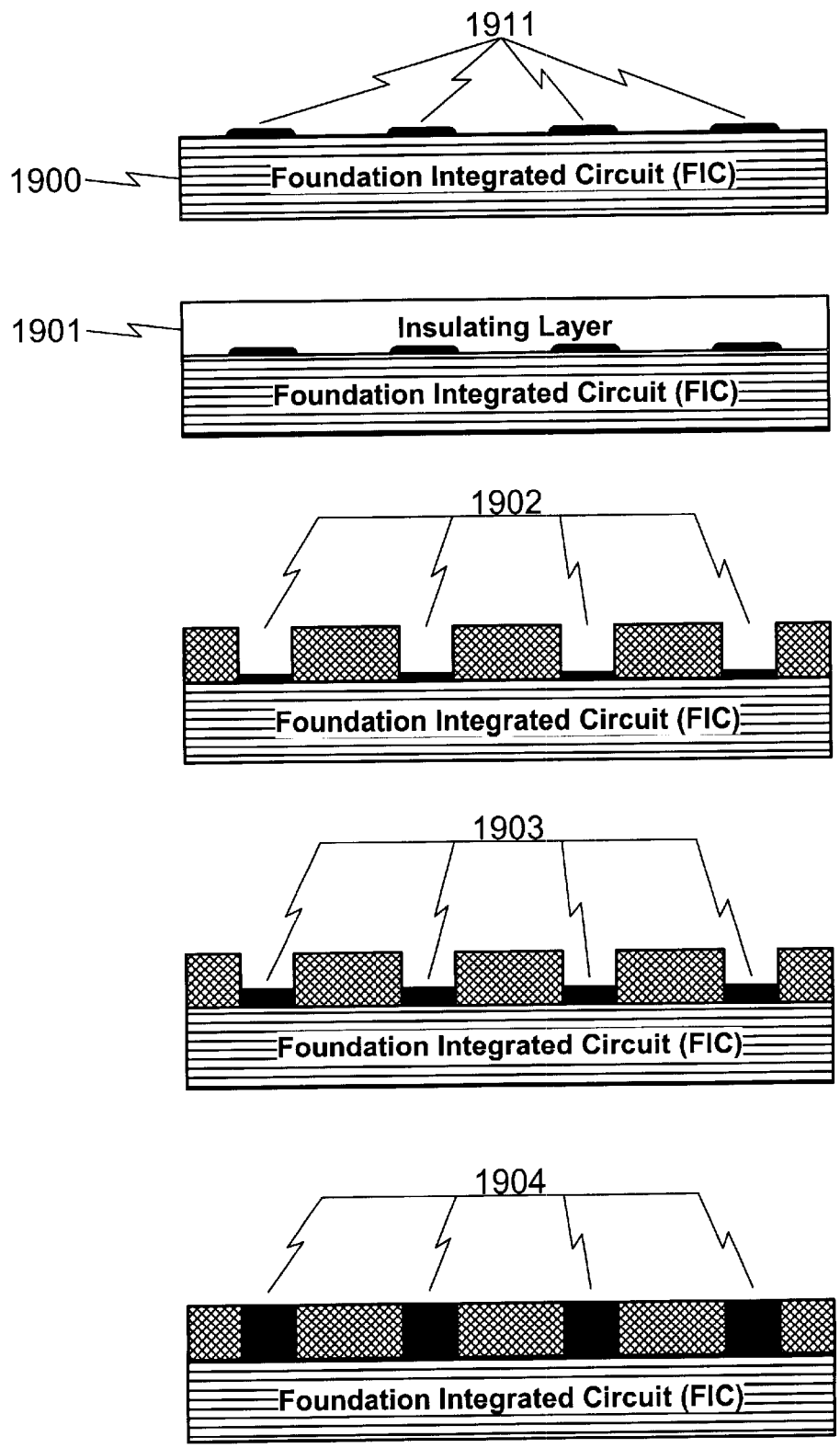
FIGS. 19–21 illustrate an exemplary process flow cross section for the present invention.
Figure 20:
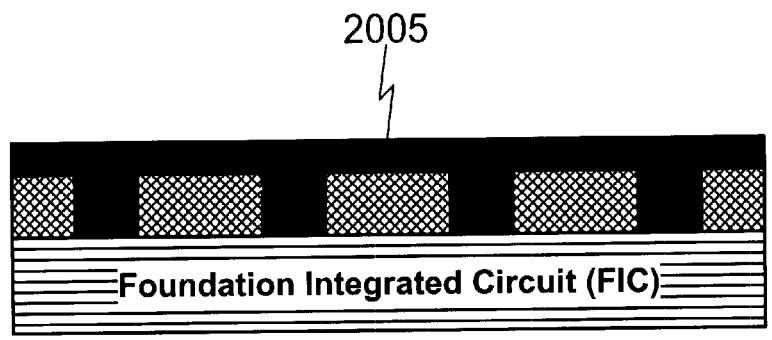
Figure 20:
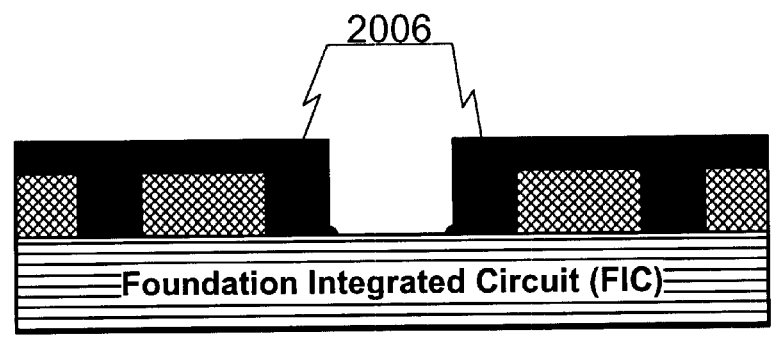
Figure 20:
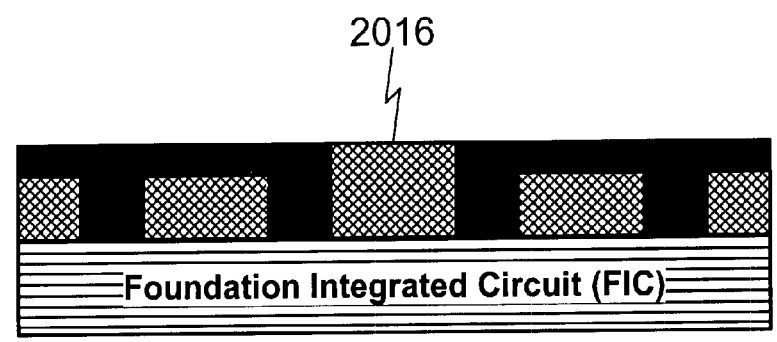
Figure 20:
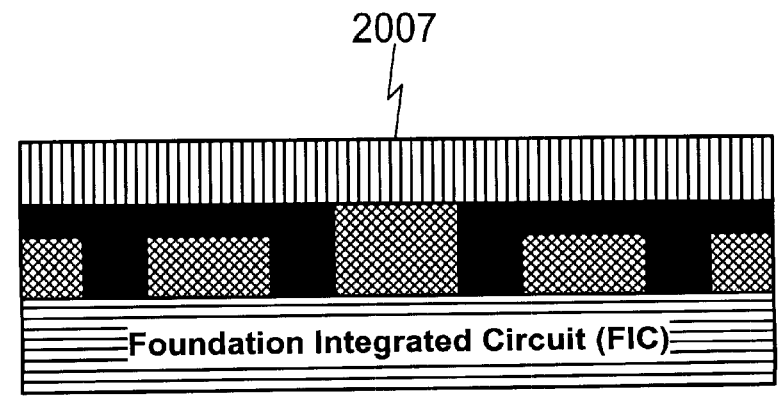
Figure 21:
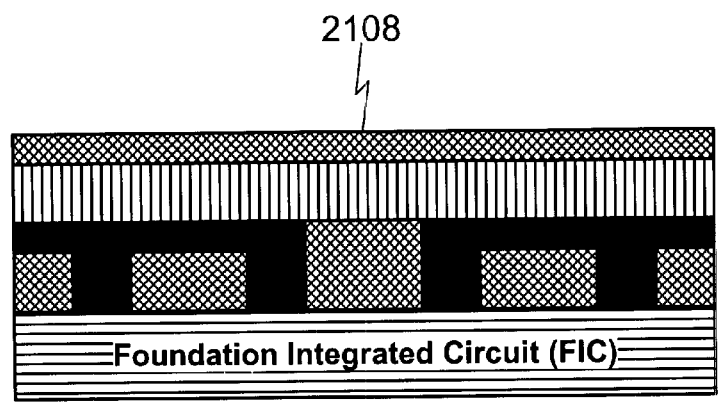
Figure 21:
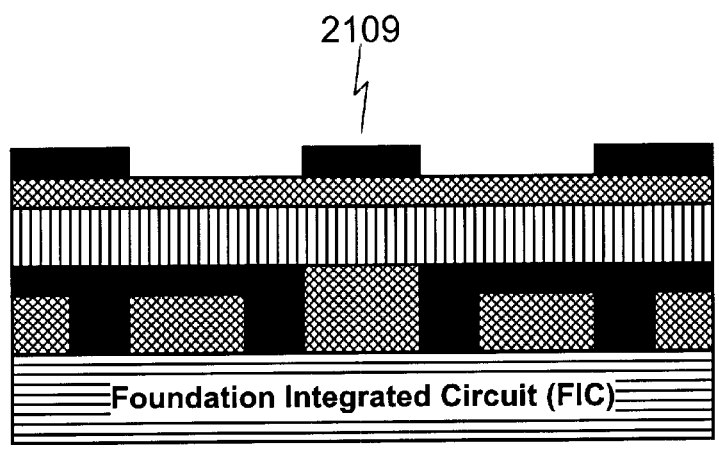
Figure 21:
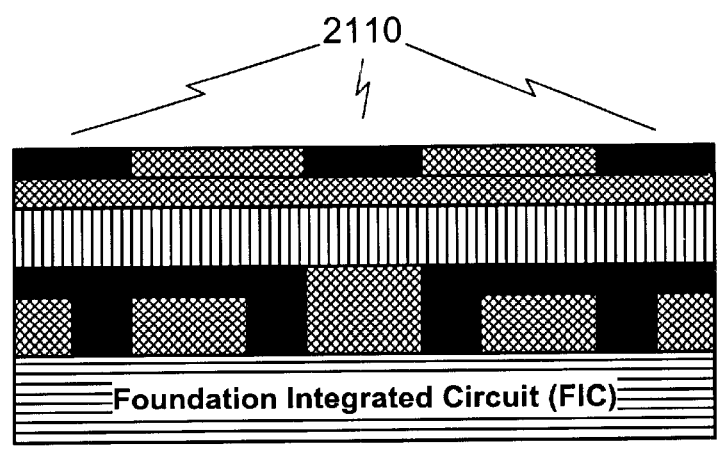
Figure 21:

The system as described in FIG. 17 may be implemented using a process/method as exemplified by the process flowchart of FIG. 18 and corresponding process flow sections in FIGS. 19–21. While many variations of the illustrated are possible, the exemplary flowchart and process section flows will provide one skilled in the art with sufficient information to broadly apply the teachings of the present invention to a number of other process technologies and fabrication methods without loss of generality. As with all method explanations provided in this document, steps may be added or subtracted depending on the requirements of the specific integrated circuit fabrication process flow, and the process flow cross sections are not necessarily to scale.

Referencing FIGS. 18–21, the integrated VCPRS method (1890) begins with first fabricating a foundation integrated circuit (FIC) (1800, 1900) that may be of any commercial design. As indicated previously, a major advantage of the present invention is that it may be advantageously applied to existing integrated circuit designs and a wide variety of IC fabrication techniques.

Once the foundation integrated circuit has been fabricated (1800, 1900) with corresponding power supply contacts (1911), an insulating layer is formed on the FIC and optionally planarized (1801, 1901). While this insulating layer is typically silicon dioxide ($SiO_2$), any insulating material consistent with the fabrication process may be used. Once this insulator has been formed (1801, 1901), a mask print step (1802, 1902) is performed to expose the top of the FIC power supply contact layer. This step permits exposure of the points in the FIC that are to be connected to a power source. This step (1802, 1902) exposes the power supply contacts within 'trenches' of the insulating layer.

These trenches are then prepared for filling by a conductive material such as tungsten (W), copper (Cu), or the like by first forming (usually deposited) a barrier/adhesion layer such as a titanium film/trinitride etch, dual damacscene, etc. (1803, 1903). Then a conductor (tungsten, Cu, or some other electrical conductor) is formed (typically by sputtering) over the selected power supply contacts to fill voids and create substantially vertical interconnect(s) to the foundation integrated circuit power structure (1804, 1904). While the use of tungsten (W) is preferred in many embodiments, the present invention does is not limited to the use of tungsten (W), but permits any suitable metal or conductive material (such as copper) to be used for this purpose. Thus, any suitable adhesion preparation step and conductive interconnect may be substituted in FIG. 18 with no loss of generality in the teachings of the present invention.

Once the contact trenches have been filled (1804, 1904), the conductive material formation (deposition/sputtering) process continues (1805, 2005) until a metalized base plate has been fabricated. This base plate forms the basis for the formation of the regulator/switch (1707, FIG. 17) and is depicted symbolically as (1706) in FIG. 17. At this point an alignment/exposure/etching process is invoked (1806, 2006) to generate any necessary power supply 'islands' among the various foundation integrated circuit power supply busses. Note that while FIG. 17 indicates a single metalized base plate (1707), in practice there may be a plethora of metalized base plate structures (2006), each supplying power to portions of the foundation integrated circuit. This configuration permits the regulator/switch to control various portions of the foundation integrated circuit independently of other portions of the foundation integrated circuit. This independent regulation/switching functionality comes with no additional chip area penalty, a feature not available in the prior art.

The VCPRS system is then fabricated (1807, 2007) on top of the metal base plate (1706, FIG. 17) typically using an epitaxy growth process that is well known in the art. See Stanley Wolf and Richard N. Tauber, SILICON PROCESSING FOR THE VLSI ERA—VOLUME 1: PROCESS TECHNOLOGY, at 124–160 (ISBN 0-961672-3-7, 1986). The topology is then relieved with a thick spacer (1808, 2108) to provide insulation for the formation and patterning of the initial global interconnect layers (1809, 2109). At this point any inter-island voids are filled with an insulating material and planarized (1810, 2110) and then the FIC interconnect formation is completed (1811, 2111). The entire process may then be optionally sealed by covering the integrated circuit with a protective glass to increase system reliability.

VCPRS Active Layer

The VCPRS active layer (2007, FIG. 20) that is formed on the conductive base plate (2006, FIG. 20) may comprise a wide variety of active devices, but of special interest in many preferred exemplary embodiment is the use of Chen-style and other vertical MOSFET and BJT devices and the like. These structures have merit in many applications because they possess both high breakdown voltage resistance, low gate capacitance, as well as low RDS (on) resistance. This combination permits the present invention to utilize high voltage regulator/switch pass devices in situations where the FIC is a low voltage (possibly digital) integrated circuit. Additionally, the low effective gate capacitance permits high bandwidth feedback regulation schemes to be implemented with low active current consumption.

Furthermore, there is an advantage to this newly disclosed topology that is not readily apparent from the process flow diagrams of FIG. 19–21. Since the VCPRS pass devices can essentially consume the entire area of the FIC (on top of or on the bottom of the FIC), they will possess a very low RDS(on) resistance even if the process used to create them is not of the same caliber as the FIC fabrication process. Since the active area of the VCPRS pass device is so huge in comparison with the loads that they must regulate/switch, the present invention topology can turn a mediocre pass device process into a high performance process by the use of additional silicon area on the top/bottom of the FIC. Note that ALL of the silicon area consumed by the VCPRS pass devices is essentially FREE, as no FIC area below the VCPRS pass device is used to support the VCPRS pass devices since the power supply contacts (1911, FIG. 19) were required even if the VCPRS pass devices had not been utilized.

Figure 22:
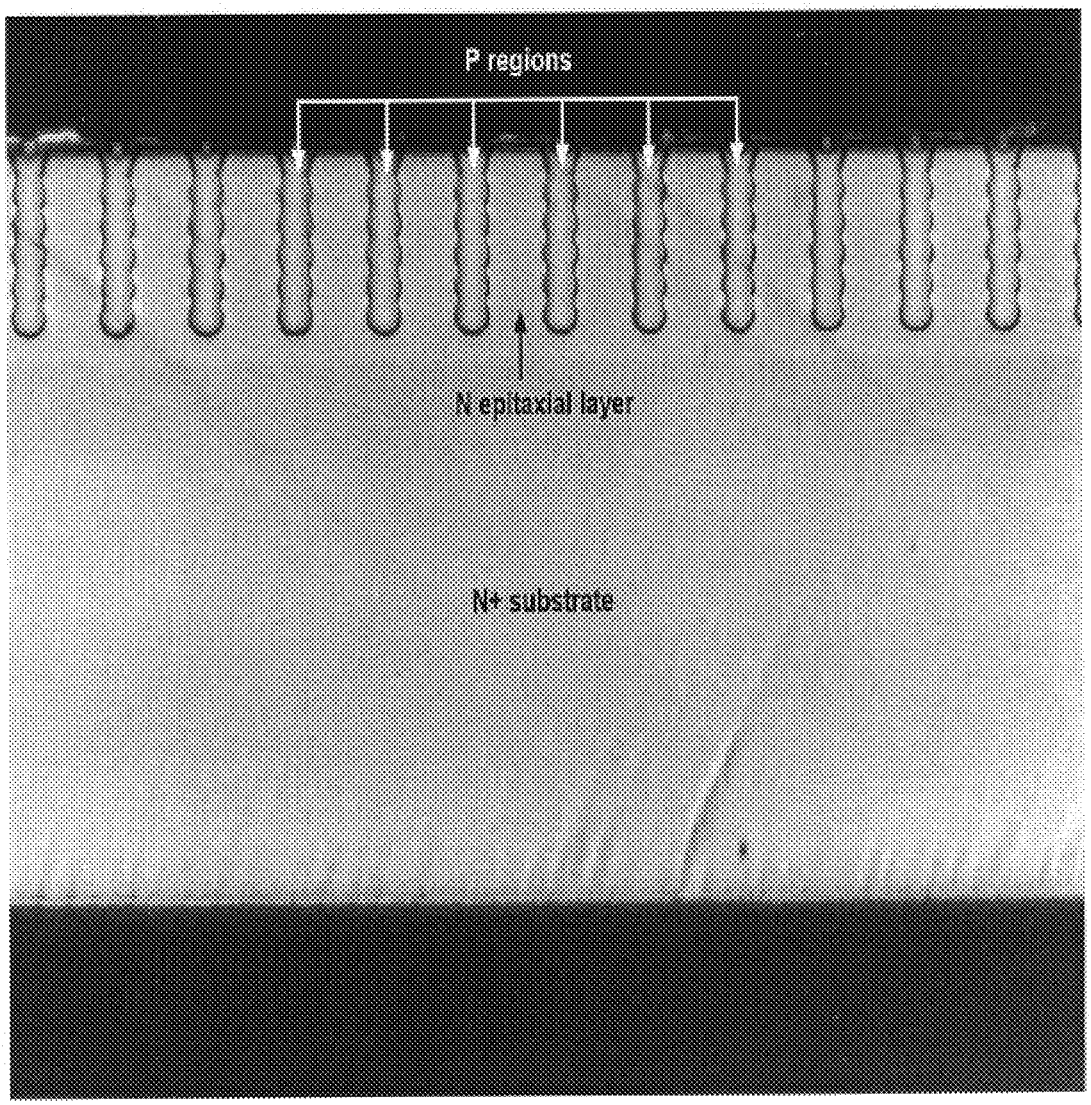
FIG. 22 illustrates a cross section of an exemplary Chen-style power MOSFET structure (as described in U.S. Pat. No. 5,216,275 for SEMICONDUCTOR POWER DEVICES WITH ALTERNATING CONDUCTIVITY TYPE HIGH-VOLTAGE BREAKDOWN REGIONS issued to Xingbi Chen on Jun. 1, 1993 and initially assigned to the University of Electronic Science and Technology of China) that may be utilize in the formation of the pass devices in the regulator/switch function.
Figure 23:
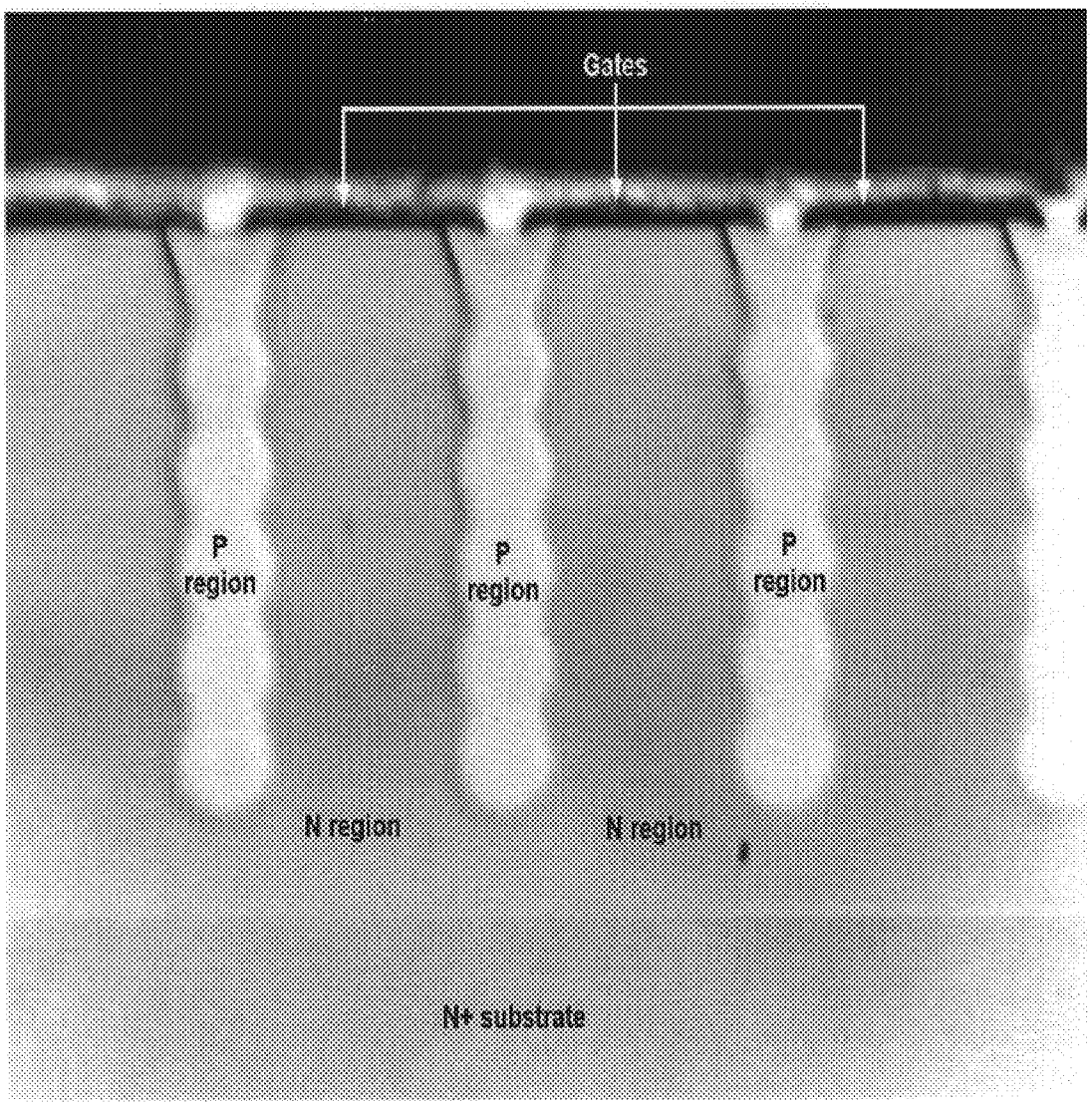
FIG. 23 illustrates an expanded view of the cross section presented in FIG. 22.

Another advantage to the proposed topology and method include the fact that the VCPRS active layer need not be the same intrinsic semiconductor type as that of the FIC. Since the VCPRS active layer is typically grown using an epitaxial growth/deposition process, it may be doped as required to achieve the desired 'substrate' type for the VCPRS. Similarly, Chen-style devices need not have full contact between the sidewall complementary semiconductor regions and the epitaxial layer/substrate of the VCPRS active region as illustrated by the exemplary structures of FIGS. 22–23.

Figure 24:
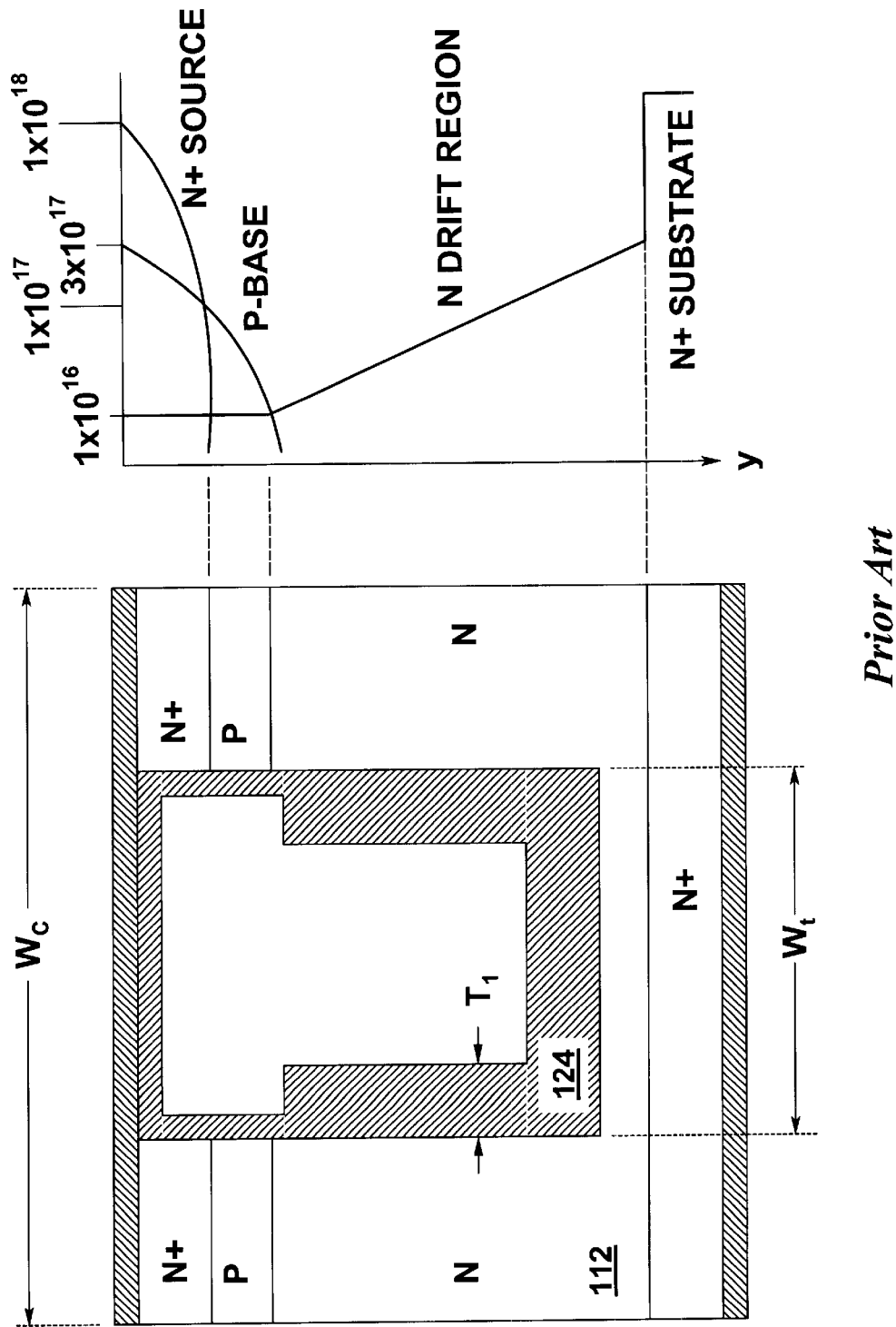
FIG. 24 illustrates a cross section of an exemplary graded-drift-region MOSFET structure that may be utilize in the formation of the pass devices in the regulator/switch function (see Ashok Bindra, "Graded-Drift-Region Technique for MOSFETs May Double Battery Life In Portable Devices", ELECTRONIC DESIGN, at 33–34 (Aug. 9, 1999); U.S. Pat. No. 5,637,898 issued to Bantval J. Baliga on Jun. 10, 1997 for VERTICAL FIELD EFFECT TRANSISTORS HAVING IMPROVED BREAKDOWN VOLTAGE CAPABILITY AND LOW ON-RESISTANCE)

The concentration on vertical devices in this application should be interpreted in its broadest possible fashion. For example, recently disclosed graded-drift-region MOSFETs as illustrated in FIG. 24 fall within this category, even though such devices have breakdown characteristics not on par with Chen-style devices. See Ashok Bindra, "Graded-Drift-Region Technique for MOSFETs May Double Battery Life In Portable Devices", ELECTRONIC DESIGN, at 33–34 (Aug. 9, 1999); U.S. Pat. No. 5,637,898 issued to Bantval J. Baliga on Jun. 10, 1997 for VERTICAL FIELD EFFECT TRANSISTORS HAVING IMPROVED BREAKDOWN VOLTAGE CAPABILITY AND LOW ON-RESISTANCE. These devices use more conventional process steps (and fewer of them) in fabricating the VCPRS active layer, and for economic reasons may be preferable in some applications.

It should be noted here that lateral devices may also be constructed in the VCPRS active layer and used as pass devices in regulator/switch functions. While these devices are not as efficient as Chen-style devices in high-voltage and/or high-current applications, they may for economic reasons be the preferred mode of implementing pass devices given the process limitations of a given semiconductor fabrication facility.

SOI Process Variations

Overview

As stated in the literature, semiconductor silicon-based processes that isolate active devices utilizing by surrounding the device with an insulator rather than a PN junction are referred to as silicon-on-insulator (SOI) technologies. These process technologies tend to provide full electrical isolation of each device from the surrounding devices by utilization of an insulating substrate rather than the traditional PN junction used in bulk silicon CMOS processing. These methodologies, while available for more than a decade, have not found widespread commercial implementation because of the extra process steps required for their implementation and additionally because most integrated circuit designs have been narrowly constrained so as to not need the isolation features of this technology.

Despite assertions in the literature that "[j]unction isolation is not suitable for high-voltage applications because at supply voltages of ±30V junction breakdown occurs under reasonable doping levels and device-structure dimensions", (see Stanley Wolf, SILICON PROCESSING FOR THE VLSI ERA—VOLUME 2: PROCESS INTEGRATION, at 66 (ISBN 0-961672-4-5, 1990), the performance characteristics of Chen-style devices defies this generalization and provides a new opportunity to revisit the potential for integrating junction isolation techniques with emerging silicon-on-insulator (SOI) isolation technologies when coupled with the teachings of the present invention. Specifically, with respect to SOI technologies, it must be observed that the exemplary structure illustrated in FIG. 17 may be further generalized to make use of SOI technologies to great advantage not present in the prior art.

VCPRS SOI Structure

Figure 41:
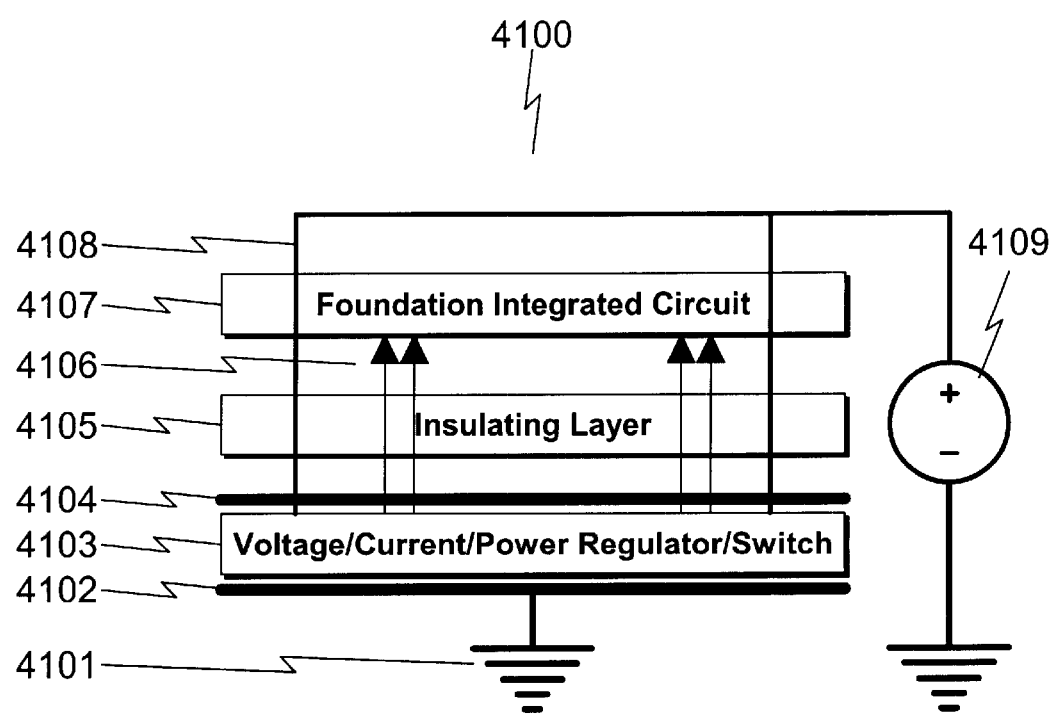
FIG. 41 illustrates a silicon-on-insulator (SOI) embodiment of the present invention.

Referencing FIG. 41, it can be seen that this structure topology is essentially reversed from that depicted within FIG. 17. Here the VCPRS (4103) is constructed on a metalized base plate (4102) with conductive routing layer (4104). Using conventional SOI fabrication technology, an insulating layer (4105) is formed on top of the conductive routing layer (4104). On top of this insulating layer the foundation integrated circuit is formed (4107). Power is supplied from the VCPRS to the foundation integrated circuit through conductive vias (4106) that punch through the insulating layer (4105) and contact the conductive routing layer (4104) on the VCPRS (4103). Power (4109) is supplied to the VCPRS (4103) using either direct bonding on the VCPRS or with vias (4108) that punch through the foundation integrated circuit (4107) through the insulating layer (4105), to the conductive routing layer (4104) to the VCPRS (4103).

SOI Process Advantages

It is instructive to ask at this point what potential advantage the structure of FIG. 41 provides over that of FIG. 17. This may be answered by observing that the VCPRS structure (4103) of FIG. 41 may be fabricated on bulk silicon using high temperature processes. After the insulating layer (4105) is deposited, the foundation integrated circuit (4107) can then be formed using conventional CMOS low temperature processes. Thus, the process stability of the entire system is thus enhanced. Furthermore, the efficiency and voltage breakdown characteristics of the VCPRS (4103) pass devices may be dramatically improved using this technique.

Furthermore, the use of SOI technology permits further electrical isolation of the subsystem blocks in the foundation integrated circuit (4107). This capability aids in fabrication of systems-on-a-chip in which mixed-signal designs incorporate both analog and digital systems on a single integrated circuit. What is significant to note in the teachings of the present invention as illustrated in FIG. 41 is that the level of isolation possible with the present invention is far superior to that of the prior art. The prior art would teach that the power supplies used to power the foundation integrated circuit would be drawn from the same common source and routed using conventional metalization from common bond pads on the die. The present invention would place individual regulator/switch functions on these power supply distribution lines, and thus provide active isolation from one supply to another, thus increasing PSRR of the entire system-on-a-chip.

While this process variation does require the use of SOI technology (see Stanley Wolf, SILICON PROCESSING FOR THE VLSI ERA—VOLUME 2: PROCESS INTEGRATION, at 66–83 (ISBN 0-961672-4-5, 1990), and the use of epitaxial film growth techniques (see Stanley Wolf and Richard N. Tauber, SILICON PROCESSING FOR THE VLSI ERA—VOLUME 1: PROCESS TECHNOLOGY, at 124–160 (ISBN 0-961672-3-7, 1986)), these techniques are well known in the art.

Power Dissipation/Heat Extraction Issues

One significant advantage of the structure illustrated in FIG. 41 as compared to FIG. 17 concerns power dissipation and heat extraction. Since it is envisioned that the VCPRS structure will be a major point of power dissipation in the overall integrated circuit system, the structure of FIG. 41 permits this heat source component to be directly bonded to the lead frame that may constitute the metal backing plate (4102) or some other attachment connected to the VCPRS substrate (4103). By directly contacting a heat sink structure such as the package leadframe, the configuration of FIG. 41 may provide some thermal resistance improvements over some configurations including that of FIG. 17.

Ground Bounce Regulation

Overview

Figure 16:
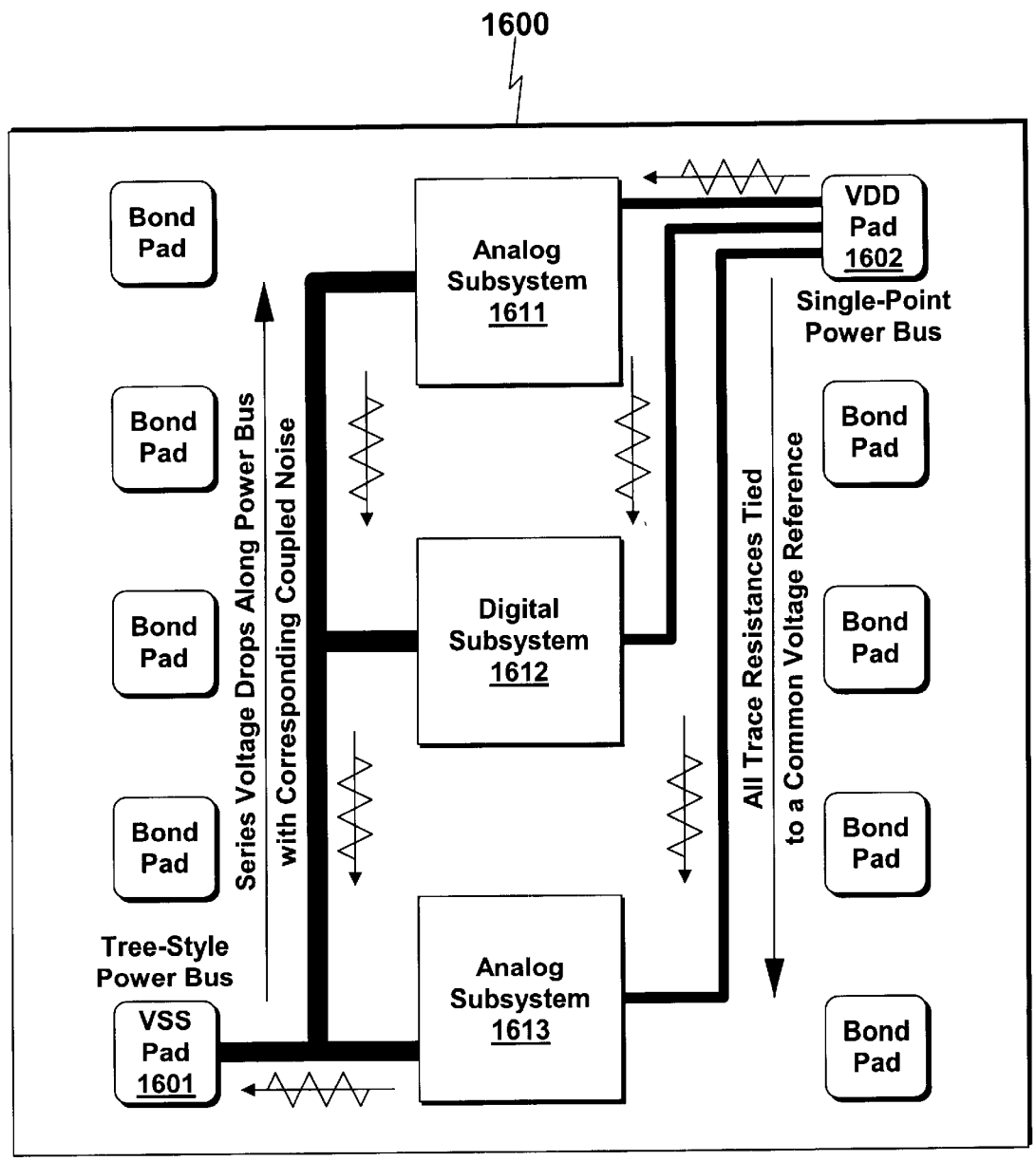
FIG. 16 illustrates prior art layout techniques for power/ground bus routing within integrated circuits.

One potential configuration utilizing the structure of FIG. 41 is in the area of ground bounce regulation. It is often the case that power distribution mechanisms such as illustrated in FIG. 16 (whether tree-style or single-point) result in what is called "ground-bounce" when high currents are switched into the ground bus of the integrated circuit. This may occur when switching external capacitive loads, or when switching internal chip components. The result of this charge injection into the chip ground bus and substrate is generally a significant amount of noise that is injected into the power supply of ALL chip components, albeit through the ground rather than power distribution bus.

Ground Bounce Regulation

Figure 42:
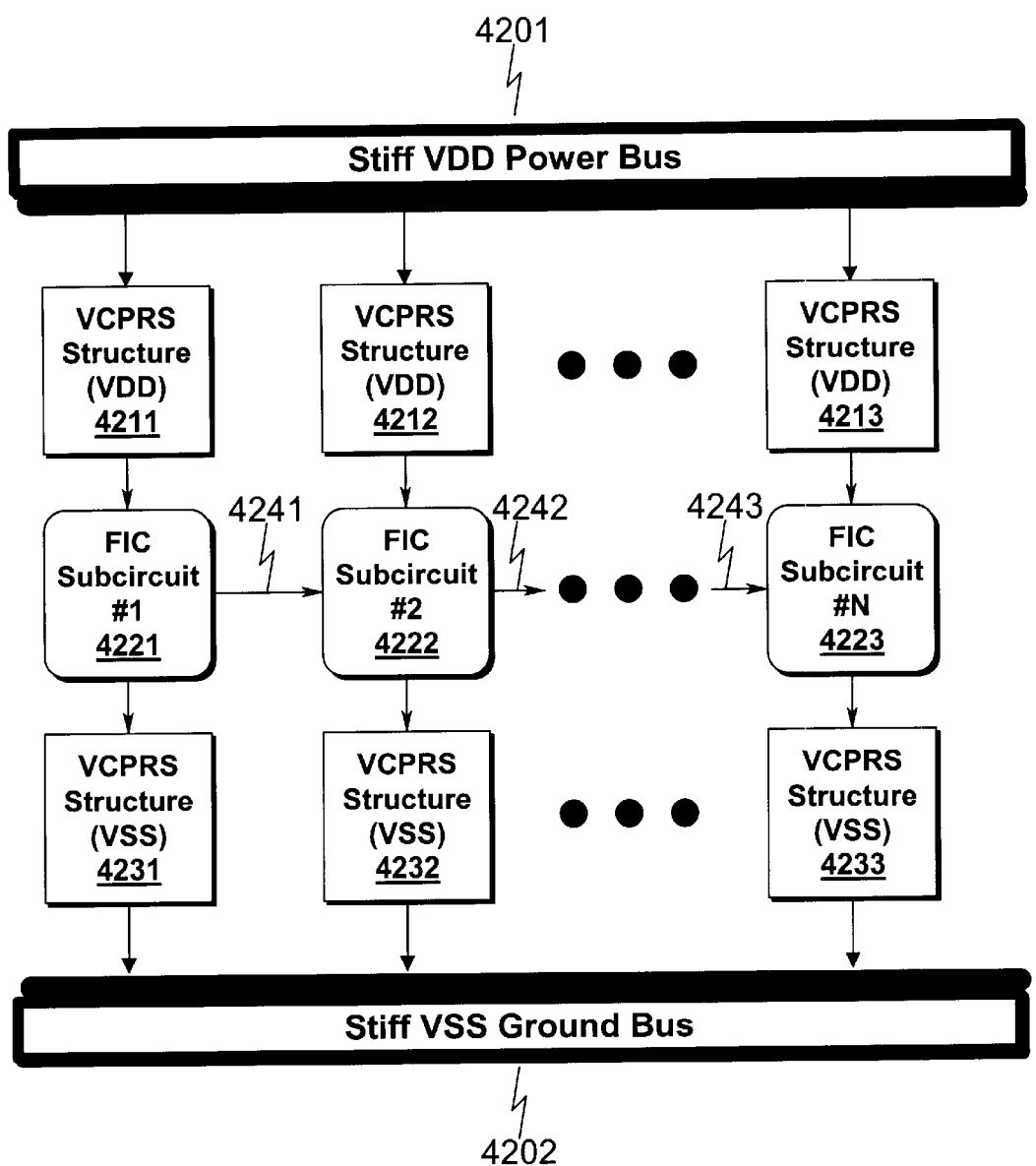
FIG. 42 illustrates an exemplary embodiment of the present invention as applied to increasing PSRR, reduction of ground-bounce, and/or multiple supply regulation within an integrated circuit environment.

One method that may alleviate this problem to some extent is to use the structure of FIG. 41 to regulate the local GROUND bus within each separate section of the integrated circuit. This technique is illustrated in FIG. 42. Here power connections to the integrated circuit system are implemented using a stiff VDD power bus (4201) and a stiff VSS ground bus (4202). Within the context of the present invention, this may be simply a top/bottom coat of metalization to the finished integrated circuit to which VDD/VSS connections are made.

The architecture of this ground-bounce resistant architecture can be seen by noting that for each of the plethora of FIC subcircuits (4221, 4222, 4223) in the entire integrated system, those that are susceptible to ground bounce will incorporate both a VCPRS VDD pass structure (4211, 4212, 4213) and a VCPRS VSS pass structure (4231, 4232, 4233). These independent VCPRS structures serve to isolate the FIC subcircuits (4221, 4222, 4223) electrically from a power consumption perspective so that the overall noise generated by each system may be actively isolated by the VCPRS structures (4211, 4212, 4213, 4231, 4232, 4233) from the power busses (4201, 4202) and other portions of the FIC circuitry. Note that interconnections between FIC components can be either direct (4241, 4242, 4243) or may incorporate some form of filtering to further isolate sensitive FIC circuitry from PSRR induced noise in the power supply systems.

Slew Rate Limitations

One significant application of this structure is in slew rate limitations involving bond pad (I/O) drivers on the integrated circuit. Since the ground bounce incurred by the bond pad (I/O) driver depends in part on the capacitive/inductive load that is connected to the driver, limiting the outrush/inrush currents to an acceptable level to prevent collapse of the internal power supply busses is of great concern in a large chip design. Here this issue may be easily solved by incorporating current and/or power regulation of the bond pad (I/O) driver subsystem, thus isolating this from the remainder of the chip and also limiting the impact of the driven bond pad load irrespective of the load externally connected to the integrated circuit.

EMI Considerations

This technique has significance not only from a power system and noise integrity perspective but also from an electromagnetic interference (EMI) perspective. Since the bond pad (I/O) driver is connected to the driven load via a bond pad metalization structure and associated bond wire leads, the inductance associated with these components in conjunction with the high frequency components dictated by the slew rate of the driven bond pad signal create a small radio frequency (RF) transmitter in every high frequency digital system. This RF energy utilizes the bond wire and bond pad metalization as an antenna and is radiated indiscriminately outside the confines of the integrated circuit.

Tight regulatory requirements by the U.S. FCC and other national regulatory agencies dictate that this EMI/RF emission be below a regulated threshold if a given product is to be allowed for sale in the country of interest. One technique that has been used to limit this EMI/RF emission is that of slew rate control and/or switching the bond pad (I/O) driver off during periods of non-use. Both techniques are ideally suited for use with the disclosed VCPRS structure as well as the exemplary embodiment of FIG. 42.

One skilled in the art will have no trouble incorporating the teachings of the prior art with the present invention to affect a system with considerably lower EMI than is currently possible with the prior art. Note that the sandwiching of the VDD/VSS busses (4201, 4202) around the FIC circuitry (4221, 4222, 4223) tends to provide additional EMI shielding not possible in the prior art even if the VCPRS structures are not implemented with every bond pad driver structure. This additional shielding tends to minimize the source of on-chip EMI radiation, a significant contributor to the overall RF/EMI problem.

Multiple Supply Integration

Of interest to persons wishing to fully incorporate a variety of dissimilar (and possibly incompatible) systems on a given integrated circuit is the potential provided by the present invention to incorporate a variety of supply voltages on a given integrated circuit. As an example, a fully integrated single-chip disk drive controller chip might require the use of +12V to drive the spindle of the disk drive, +5V to run the read/write sense amplifiers for the disk drive heads, and +1.5V to run the interface logic that communicates to the host CPU. Traditionally these functions had to be incorporated on separate integrated circuits.

However, with the present invention this separation need not be mandatory. As exemplified by the diagram of FIG. 42, the VCPRS VDD structures (4211, 4212, 4213) can be configured to supply different voltages to different portions of the FIC (4221, 4222, 4223) irrespective of the power supply voltage value. This technique may be especially useful in battery-powered systems where the battery voltage may fluctuate widely yet the power requirements for the disk drive spindle remain relatively fixed. While not specifically illustrated in FIG. 42, it will be apparent to one skilled in the art that there may be a multiple number of VDD power busses (4201) with no loss of generality in the teachings illustrated by the figure.

Dissimilar Substrate Types

What should be apparent from the above discussion of SOI technology to one skilled in the art is the fact that the present invention permits the use of different substrate types for both the VCPRS (4103) and the foundation integrated circuit (4107). This potential was also available in the context of FIG. 17, but is more exciting in the context of a full SOI implementation since the VCPRS may be optimized for high current carrying capacity and can be totally independent from the substrate characteristics of the foundation integrated circuit.

Conductive Interconnect Mask Alignment

One issue that may be raised by the reader regarding the topology of FIG. 41 is how the conductive via interconnect (4106) from the VCPRS (4103) to the FIC (4107) is aligned during and after the formation of the insulating layer (4105). These masking alignment and registration steps would normally be performed optically by a machine or fab operator. In this application, however, it is possible to use ultraviolet and/or infrared light to "see" though the VCPRS substrate (4103) to the backside metalization (4102) that may be patterned with alignment marks suitable to perform the mask alignment and registration process. None of this equipment or the technique just described is beyond the scope of one skilled in the art of semiconductor fabrication to implement on a production basis.

Preferred System Context of the Present Invention

As mentioned previously, the present invention is amenable to a wide variety of applications. While the following applications are not limitative of the teachings of the present invention, they will provide one skilled in the art sufficient information to both apply the teachings of the present invention and aid in understanding the wide scope of application possible using the novel techniques disclosed by the present invention.

Throughout the following discussion, the reader should be aware of the following common themes:
1. Integration of high voltage pass devices with low voltage integrated circuit components on a single integrated circuit.
2. Elimination of PCB board area by integration of all system components on a single integrated circuit.
3. Increased system reliability due to fewer component interconnections.
4. Integration of power regulation/switch functions with dense digital supervisory microprocessor circuitry. This merging of power devices and complex digital circuitry has been largely unavailable as a design option when fabricating integrated circuits.
5. Significantly improved RDS(on) performance for applications requiring pass devices.
6. New power control and regulation methodologies not presently possible with the prior art.
7. Improvements in overall system cost due to increased integration levels.

These themes should in no way be construed to limit the scope or application of the present invention.

Local Integration of Power Conversion

Overview

It is quite apparent from inspection of the literature and after viewing FIGS. 2–6 that the subject of voltage regulation and more specifically power conversion is of paramount concern in the semiconductor and electronics industry. Driving this emphasis is a migration towards more portable systems that invariably means power supplies that are driven with battery power. Given that the voltages associated with the most efficient and practical batteries available are not compatible with modern semiconductor processes, there has been and will continue to be a need for efficient power conversion and regulation systems to convert the power available from existing battery supplies to clean, regulated, supply voltages/currents that are compatible with the prevailing semiconductor processes used to create portable electronic equipment.

Traditionally, this power conversion function has been performed by separate integrated circuits, as illustrated by the industry examples in FIGS. 9–15. This partitioning of system function has been traditionally dictated because the process requirements for the power converter integrated circuits was incompatible with the circuit being powered (i.e., the power converter required an analog process and the device being powered was purely digital). This system partitioning continues to be the predominant, if not exclusive, industry trend and there appears to be little if any interest in integrating the voltage regulator/switch functions on the same chip die as the logic/circuitry being powered. There are some special purpose exceptions to this rule involving linear voltage regulators, but they generally fail to provide a scalable means of extension using current technology. See Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998).

Figure 31:
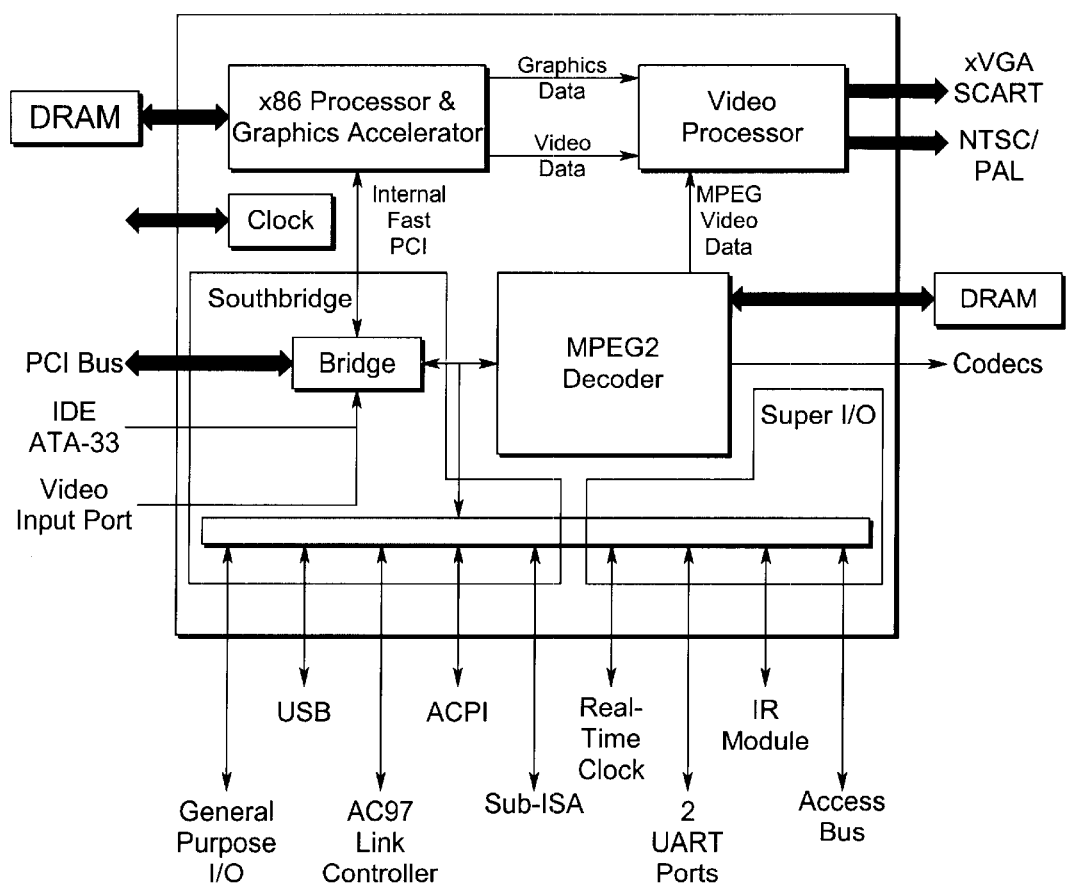
FIG. 31 illustrates a typical prior art information appliance system-on-a-chip architecture (see Geode SC1400 system-on-a-chip from National Semiconductor)

Furthermore, no one in the prior art seems to have any idea of how high current switched mode regulators can be fully integrated into conventional integrated circuit process flows. The disparity between the low-voltage digital process design cores and the high-voltage analog processes required for switched mode regulators seems to have foreclosed any practical method of merging these technologies, save for the use of multi-chip modules or similar hybrid construction techniques. Even with modern system-on-a-chip architectures as illustrated in FIG. 31, local regulation of power supply voltages has been relegated to off-chip circuitry.

Drawbacks of Existing Designs

While it is quite settled that for high power applications it is standard practice to utilize a system partition in which the power regulation and control circuitry is embodied in a separate integrated circuit from the integrated circuit being powered, this is by far not an optimal configuration from a power flow and regulation perspective. The rationale behind this statement is best illustrated graphically.

Figure 25:
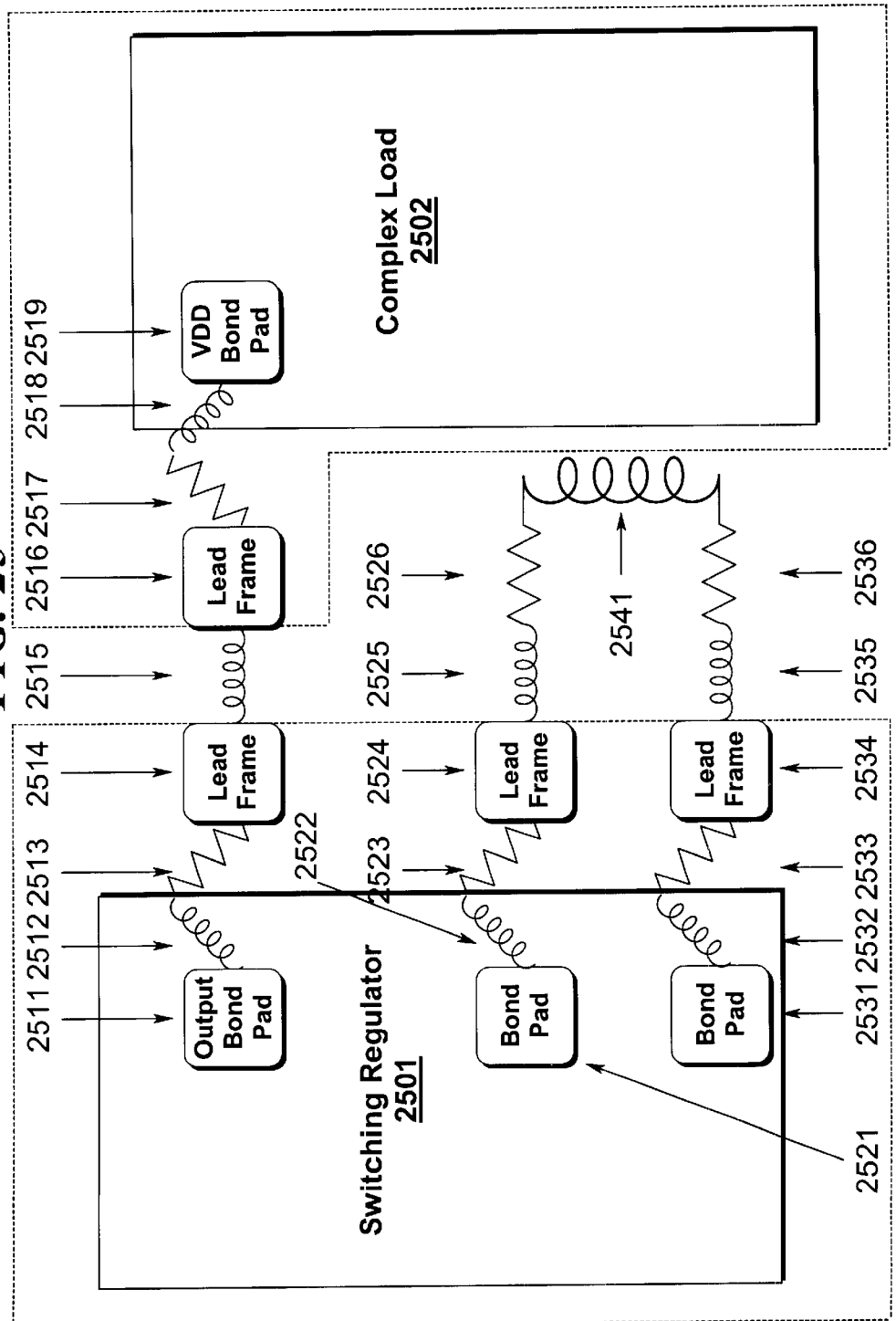
FIG. 25 illustrates circuit parasitics associated with prior art switched-mode and linear regulation methodologies.

Referencing FIG. 25, a typical regulator system comprising a switching regulator (2501) powering a complex load (2502) is depicted. This illustration details several of the parasitics that impact the performance of such systems. In particular, it should be noted that the although this system depicts direct output of regulated power from the switching regulator (2501) bond pad (2511) to the VDD bond pad (2519) of the complex load (2502), there are several parasitics of interest in this path. Particularly, the bond wire inductance (2512) and resistance (2513), lead frame inductance and resistance (2514), PCB trace complex impedance (2515), complex load lead frame inductance and resistance (2516), complex load bond wire resistance (2517) and resistance (2518). All of these parasitics tend to make stable regulation of the voltage at the VDD bond pad (2519) difficult. This regulation problem is exacerbated given the fact that the complex load (2502) may experience high load current demands with fast slew rates.

Additionally, the use of inductors (2541) and sometimes capacitors as energy storage elements in switched-mode voltage regulators is a necessity with modern power supply designs. What is significant to note in these circumstances is that the parasitic path to/from the switching inductor (comprising the bond pads (2521, 2531), bond wire inductances (2522, 2532), bond wire resistances (2523, 2533), lead frame inductances and resistances (2524, 2534), PCB trace complex impedances (2525, 2535) and parasitic trace resistances (2526, 2536)) tends to reduce the quality factor (Q) of the switching inductor (2541) to below its optimal value. Note that the series resistance elements in this chain to the switching inductor directly reduce the Q of the series switching inductance (2541) due to the relation $$Q = \frac{\omega_0 L}{R} = \frac{1}{\omega_0 RC} \tag{10}$$

See David M. Pozar, MICROWAVE ENGINEERING, at 334 (ISBN 0-201-50418-9, 1990).

From the prior art system architecture illustrated in FIG. 25, it can be seen that there are significant issues regarding reduction of system parasitics that must be addressed before any meaningful improvements in switching regulator efficiency can be obtained. Unfortunately, there is nothing in the prior art that teaches how these parasitics may be eliminated from the existing systems. While manufacturers have concentrated on manufacturing their switching regulators in smaller packages (see FIGS. 9–11), nothing has been done to date to address these inherent system architecture problems with the current design methodology.

Present Invention Advantages

Reduced RDS(on) Pass Resistance

As mentioned previously, one key performance consideration in the construction of regulator/switch functions is that of the impedance of the regulator/switch pass device. Traditional on-chip regulator/switch pass devices required that lateral devices be utilized, with a corresponding limitation on minimum RDS(on) resistance. To achieve low RDS(on) values, the active pass devices required a large device area (A) for fabrication, resulting in increased die costs and lower system yield and reliability.

The present invention permits the use of a wide variety of vertical devices to be utilized as the pass device, and this opens up a new opportunity for system integrators to achieve very low RDS(on) values without sacrificing additional chip die area. Furthermore, the present invention specifically anticipates the use of Chen-style and graded-drift-region power MOSFETs and BJTs that have the capacity to lower the effective RDS(on) values by a factor of 1000 or more over existing lateral devices. For example, the literature has referenced a design in which a 3Ω pass device was required for an on-chip regulator implementation. (See Gerrit W. den Besten and Bram Nauta, "Embedded 5V-to-3.3V Voltage Regulator for Supplying Digital IC's in 3.3V CMOS Technology", IEEE JOURNAL OF SOLID STATE CIRCUITS, VOL. 33, NO. 7, at 956–962 (July 1998)). Using a conventional Chen-style vertical power MOSFET structure would yield an RDS(on) value on the order of 3 mΩ to 30 mΩ or two to three orders of magnitude lower than that of the prior art. It is significant to note that since power dissipation (P) is proportional to the voltage drop squared over the value of RDS(on) (P=$V^2$/RDS(on)), the power savings associated with a lower RDS(on) value is directly proportional to decreases in the RDS(on) value of the MOSFET pass transistor.

It should be noted here that while the present invention anticipates that many applications will take advantage of the Chen-style MOSFET devices, there are other active devices described in the Chen patent that may equally be of use in some applications using the teachings of the present invention. Additionally, graded-drift-region devices developed by Baliga and illustrated by the exemplary structure in FIG. 24 may be equivalently substituted in this application with no loss of generality. See Ashok Bindra, "Graded-Drift-Region Technique for MOSFETs May Double Battery Life In Portable Devices", ELECTRONIC DESIGN, at 33–34 (Aug. 9, 1999); U.S. Pat. No. 5,637,898 issued to Bantval J. Baliga on Jun. 10, 1997 for VERTICAL FIELD EFFECT TRANSISTORS HAVING IMPROVED BREAKDOWN VOLTAGE CAPABILITY AND LOW ON-RESISTANCE.

Reduced Gate Capacitance

One significant aspect of the prior art that is improved upon by the present invention's ability to use Chen-style pass devices is the issue of gate capacitance. Since the Chen-style devices have superior low capacitance performance in this arena (reference the Chen patent cited elsewhere in this document), their implementation in various embodiments of the present invention is a big design win. Since higher gate capacitance results in slower operation and more pronounced Miller capacitance effects, the low gate capacitance of Chen-style devices permits tighter regulator feedback control than is possible with existing lateral device designs. Furthermore, this lower capacitance value permits higher switching speeds to be achieved using Chen-style devices, a desirable characteristic in switching power regulator applications.

Fully Integrated Power Management

Note that the integration of switching power regulators in the context of a fully integrated power management scheme is specifically anticipated by the present invention. To date this capability has not been possible because the processes associated with switching regulators and the analog/digital circuits that they regulate have been incompatible. The present invention provides a mechanism whereby these disparate processes may be integrated with higher system performance characteristics than available with the prior art.

Significant Reduction of System Parasitics

The present invention teaches that the optimal placement for switched-mode inductors and/or capacitors in high performance systems is direct attachment to the integrated circuit constituting the complex load. By integrating the switched-mode regulator AND the complex load on a single substrate, the present invention permits all the parasitics associated with bond wire resistance/inductance, lead frame impedance, and PCB trace impedance to be eliminated. Furthermore, the PCB area normally associated with the switched-mode regulator circuitry is completely eliminated, making for a more compact and cost-efficient system design.

Figure 26:
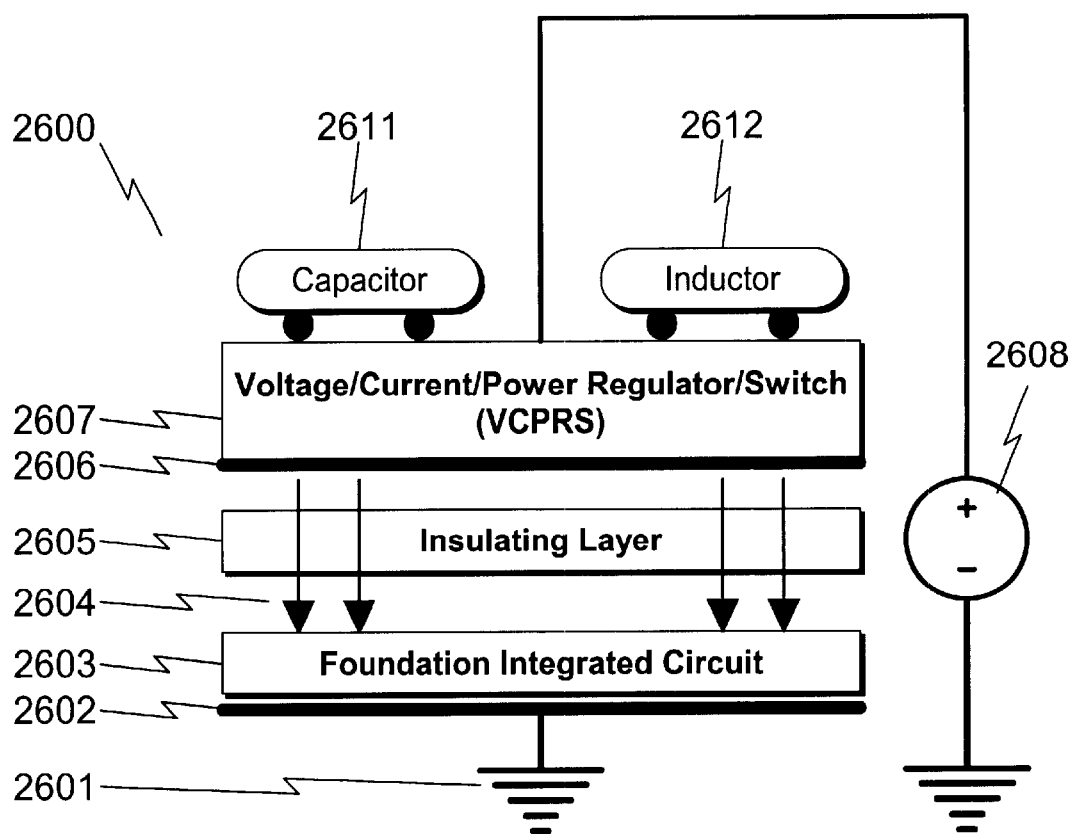
FIG. 26 illustrates a preferred exemplary embodiment of the present invention wherein switched-mode and/or linear regulator inductors and/or capacitors may be fully integrated into the VCPRS system to eliminate circuit parasitics associated with the prior art methodologies.
Figure 27:
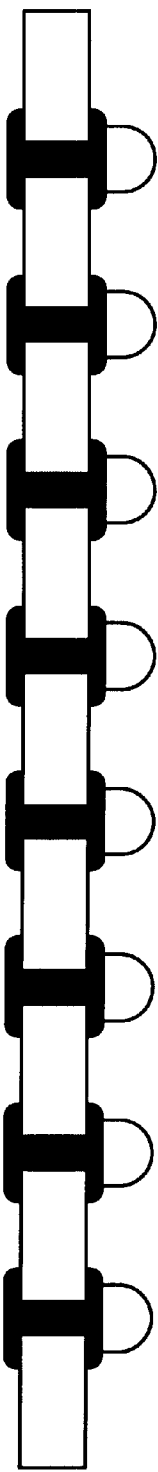
FIG. 27 illustrates a prior art technique for stacking multiple chips containing different circuit functions such as memory, logic, analog, and digital (see Spencer Chin, "Thru-Silicon Process Offers New Way to Build Stacked 3-D Chip Packages", ELECTRONIC PRODUCTS (January 2000)
Figure 28:
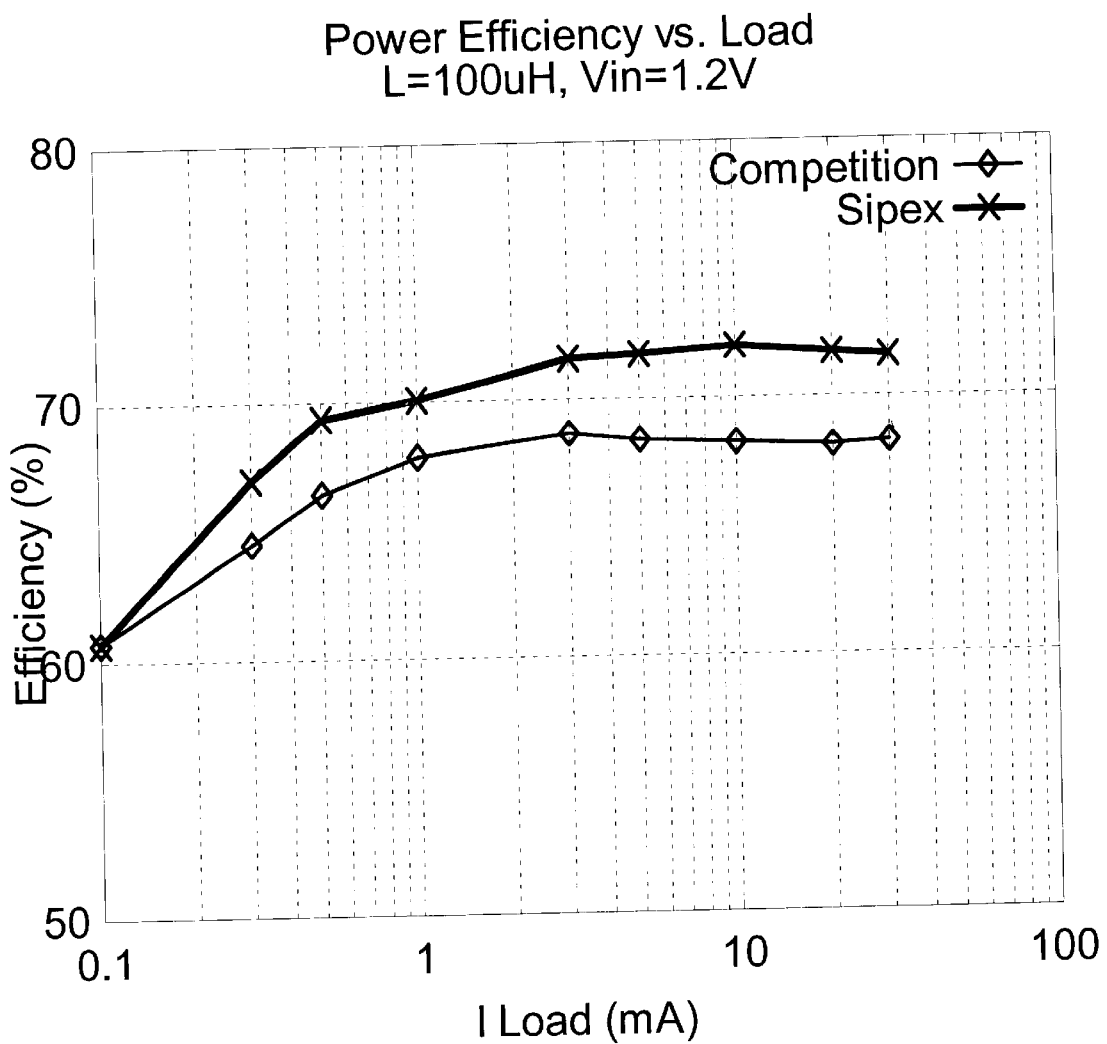
FIG. 28 illustrates a typical power efficiency curve for prior art DC-DC converters.
Figure 29:
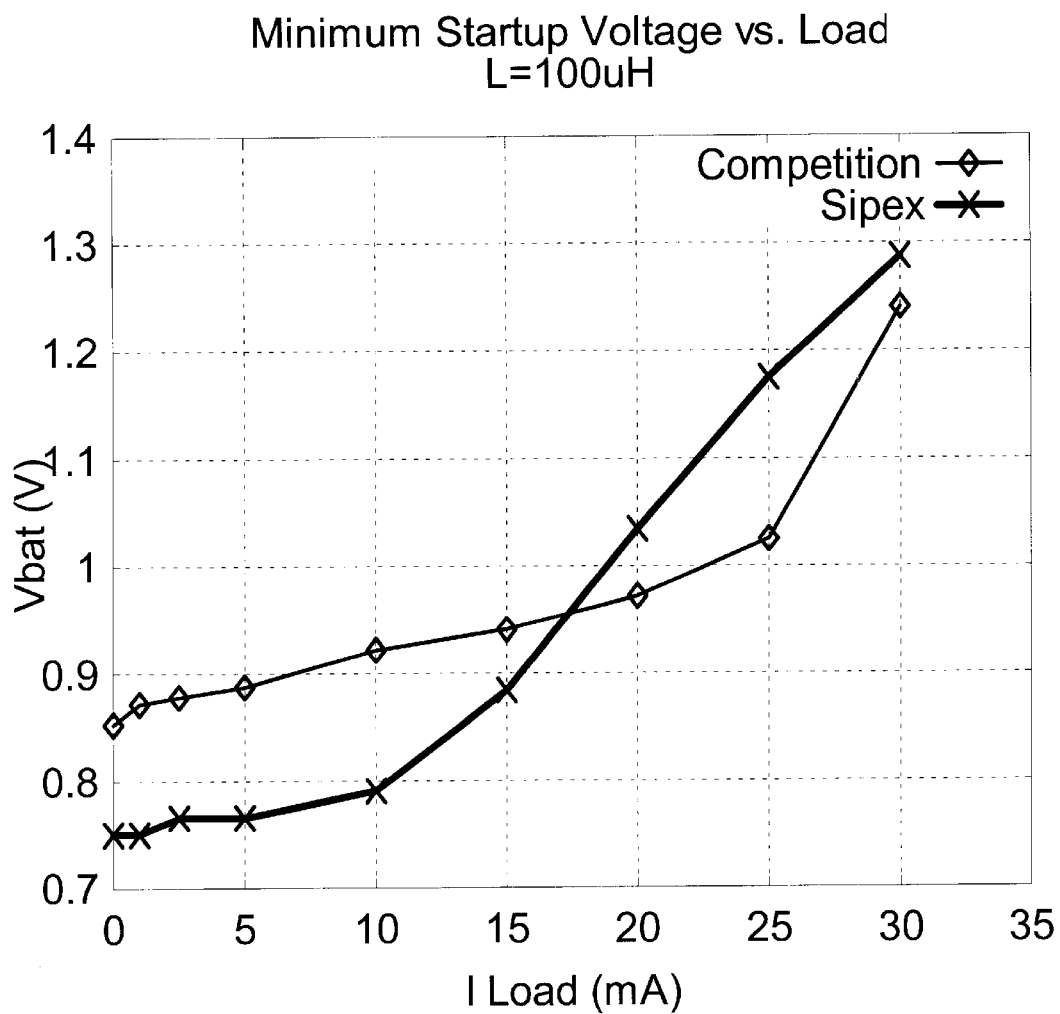
FIG. 29 illustrates a typical minimum startup voltage curve for prior art DC-DC converters.
Figure 30:
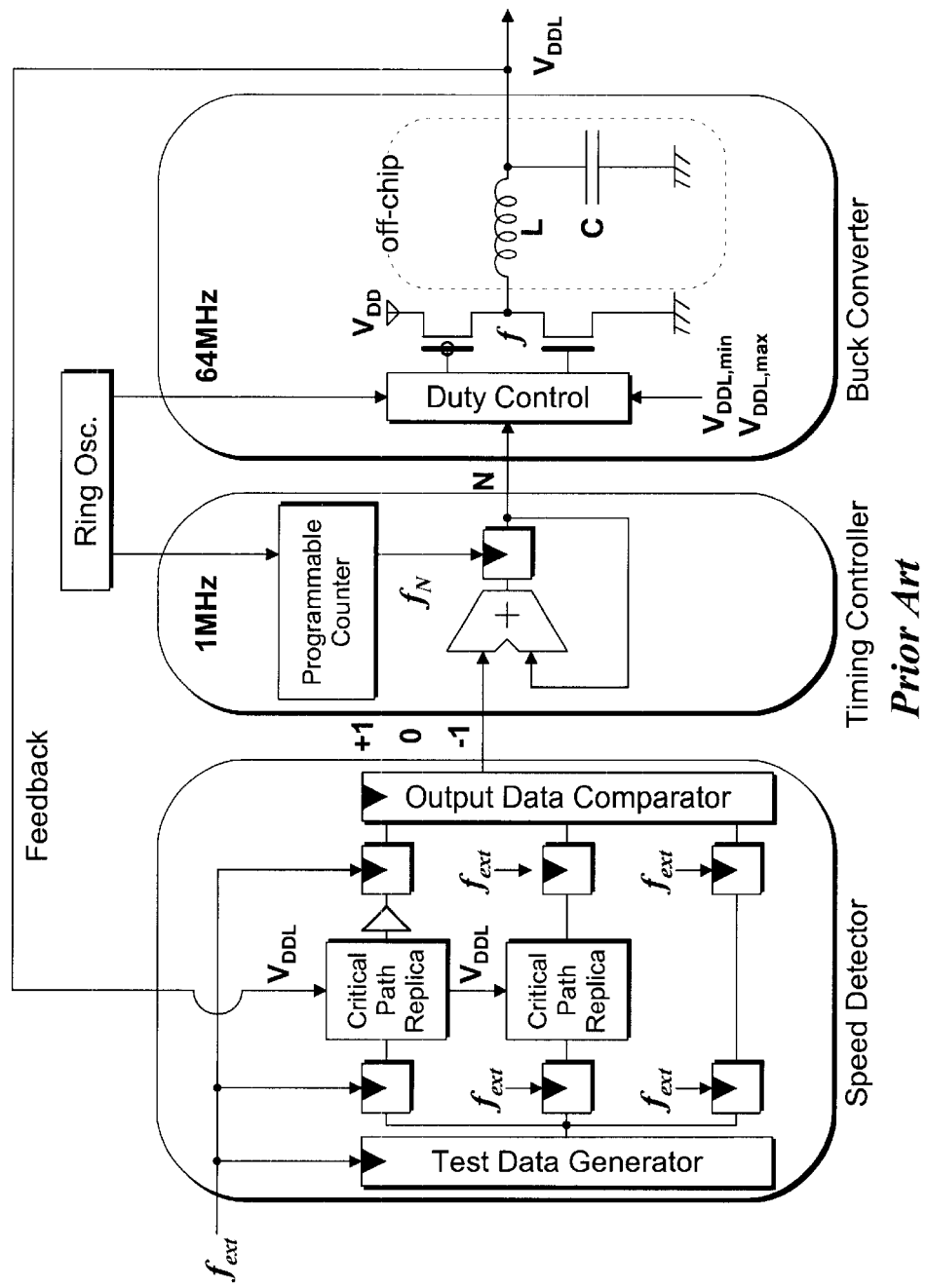
FIG. 30 illustrates a typical prior art implementation of a switched regulator with externally connected filtering inductor and capacitor (see Tadahiro Kuroda, Kojiro Suzuki, Shinji Mita, Tetsuya Fujita, Fumiyuki Yamane, Fumihiko Sano, Akihiko Chiba, Yoshinori Watanabe, Koji Matsuda, Takeo Maeda, Takayasu Sakurai, and Tohru Furuyama, "Variable Supply-voltage Scheme for Low-Power High-Speed CMOS Digital Design", IEEE JOURNAL OF SOLID-STATE CIRCUITS, Vol. 33, No. 3, at 454–462 (March 1998))

This technique is illustrated in the exemplary embodiment of FIG. 26 (2600), wherein a fully integrated complex load (FIC) (2603) is supported with regulated power from a VCPRS (2607) fabricated above the FIC (2603). Here, however, rather than having the required switched-mode capacitor(s) (2611) and/or inductor(s) (2612) mounted external to the integrated circuit, they are mounted directly to the VCPRS (2607), thus completely eliminating the parasitics normally associated with external connections. This serves to not only improve the energy efficiency and power supply performance of the entire system, but also permits the entire switching regulator system to be shielded to minimize EMI and RF emissions from the switching regulator.

Reverse Engineering/IP Security

While not a predominant consideration in the implementation of the present invention, it should be mentioned that a side benefit of the present invention is additional security that is provided to protect the foundation integrated circuit from reverse engineering efforts by third parties used to breach security of the intellectual property (IP) associated with the foundation integrated circuit design.

The present invention requires that the foundation integrated circuit be covered with the regulator/switch function as implemented with a separate set of metal and semiconductor layers. This coverage of the lower foundation integrated circuit makes visual reverse engineering of the foundation integrated circuit exceedingly difficult, and completely prohibits probing of the active foundation integrated circuit. This characteristic is extremely valuable in applications where a large capital expenditure has been required to generate the IP associated with the foundation integrated circuit, and it is desirable to protect the IP in this resource from the prying eyes of competitors. Examples of situations in which this approach has high value is in the area of complex microprocessor systems where the resources required to generate the IP design are considerable.

Encryption Security

The present invention is particularly amenable to situations where the energy dissipated by a given system is desired to be normalized to a given level to minimize the possibility of cryptographic defeat based on measured energy consumption of a wireless or other secure device. The requirement of power normalization is well known in the art. See James Goodman, Abram P. Dancy, and Anantha P. Chandrakasan, "An Energy/Security Scalable Encryption Processor Using an Embedded Variable Voltage DC/DC Converter", IEEE Journal of Solid-State Circuits, Vol. 33, No. 11, at 1799–1809 (November, 1998).

Anticipatory Switch Regulator Clocking
Overview

As discussed previously, the power regulator/switch functions have traditionally been partitioned outside of the integrated circuit being powered. This has lead to a problem that many circuit designers have encountered, but which few have completely solved. Since the power regulator and the circuitry consuming power are decoupled, there is generally no feedback from the complex load to the power regulator to inform it of future or imminent increases in power demands.

This concept may best be illustrated by viewing FIG. 1 and noting that the complex load (0103) has no method of informing the voltage/current/power regulator (0102) prior to the demand for extra power that such a demand will be forthcoming. This observation leads to the correct conclusion that the power consumption model used by most, if not all, voltage/current/power regulator manufacturers is one of asynchronous and random load demands by the complex load (0103).

Note that this observation is more realistic and considerably more accurate if there is only one VCPRS in the system (0102) that powers both a given complex load (0103) and any other loads (0105) in the system (this assumes that the functions of voltage/current/power regulator (0105) have been subsumed by (0102)). The asynchronous nature of these independent system power demands would tend to make the power demand curve more random, but there would still be individual characteristics attributable to each individual load.

Prior Art Approach

Figure 32:
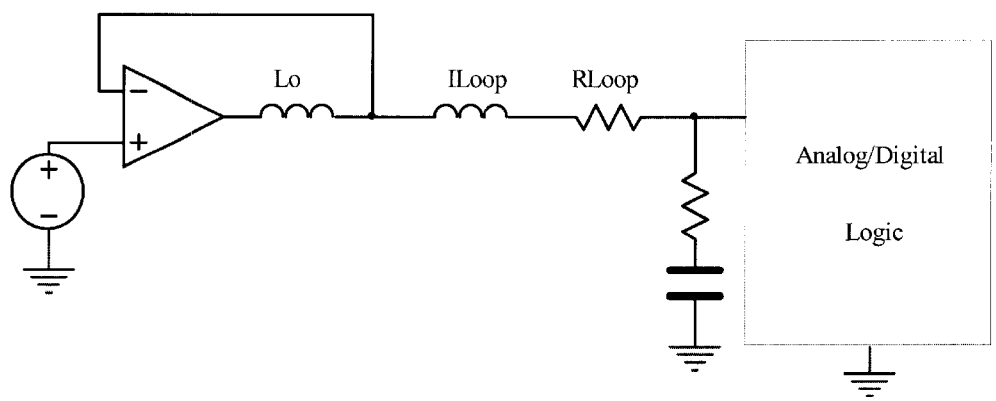
FIG. 32 illustrates a prior art voltage regulator topology utilized with digital loads.

Referencing FIG. 32, one prior art approach to controlling the feedback loop is to sense the voltage on the far side of the filtering conductor and adjust the voltage supplied to the inductor with an amplifier to correct the inductor drive voltage. Unfortunately, this approach still produces a lag between the time the amplifier increases the drive voltage/current and the corresponding stabilization of the voltage at the CPU core.

A New Regulation Paradigm

While it may be true that in many analog integrated circuits it is impossible to predict the future demand requirements of a given complex load, this is not the case with digital circuitry, because in general these systems are clocked by a known system clock generator, making their behavior temporally deterministic. Several preferred embodiments of the present invention make use of this observation to improve the loop regulation control of the overall regulation process by anticipating required increases in power to permit corrective measures to be taken before power demands require action by the regulator. In this sense, the current invention teaches a proactive rather than reactive method to regulation in the integrated circuit environment.

This new paradigm is best illustrated by contrasting the architecture of FIG. 1 with the system architecture illustrated in FIG. 1. As stated previously, the power flow in FIG. 1 is from the voltage/current/power regulator (0102) to the complex load (0103), with the voltage/current/power regulator (0102) responsible for reacting to changes in the complex load and supplying sufficient current to ensure that the required load operating conditions are maintained across variations in load characteristics.

Figure 33:
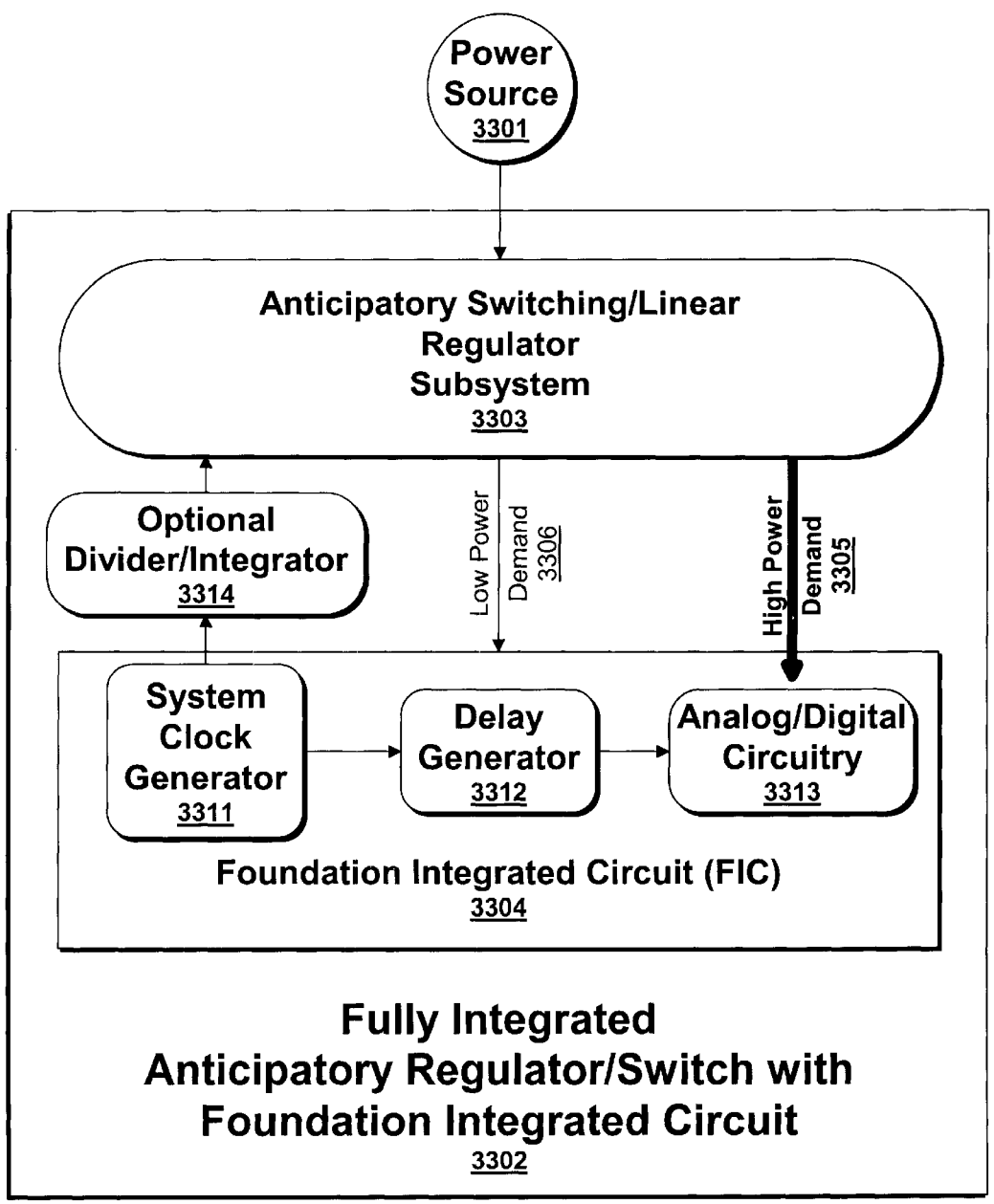
FIG. 33 illustrates a system block diagram of an exemplary embodiment of the present invention as applied to a fully integrated anticipatory regulator/switch with foundation integrated circuit.

This technique may be contrasted by the system block diagram of FIG. 33, wherein a power source (3301) supplies power to a fully integrated anticipatory regulator switch with foundation integrated circuit (3302). Here it can be seen that the anticipatory switching/linear regulator subsystem (3303) powers the foundation integrated circuit (FIC) (3304) as described previously in this document.

However, the configuration of the FIC has been slightly modified in this application. Normally, the system clock generator (3311) that clocks the FIC would directly drive the analog/digital circuitry (3313) within the FIC via a clock distribution tree or similar apparatus. Here, however, the system clock generator (3311) is put through a delay generator (3312) prior to distribution through the FIC analog/digital circuitry (3313). The raw non-delayed system clock is put through an optional divider/integrator circuitry (3314) and fed to the anticipatory switching/linear regulator subsystem (3303) where it is used to predict the number of clock transitions that have and will occur prior to their occurrence. By knowing when a clock transition will occur before it in fact does occur, the anticipatory switching/linear regulator subsystem (3303) can preadjust the feedback controls in the pass device to compensate for the power that will be demanded by the FIC analog/digital circuitry (3313) prior to the demand actually occurring. This permits the feedback response loop of the anticipatory switching/linear regulator subsystem (3303) to be much more responsive than traditional architectures as illustrated in FIG. 1, as well as reducing the amount of standby power required to maintain the required loop response in low power or battery powered applications.

Exemplary Timing Sequence Diagram—Clock-Based Regulation

Figure 34:
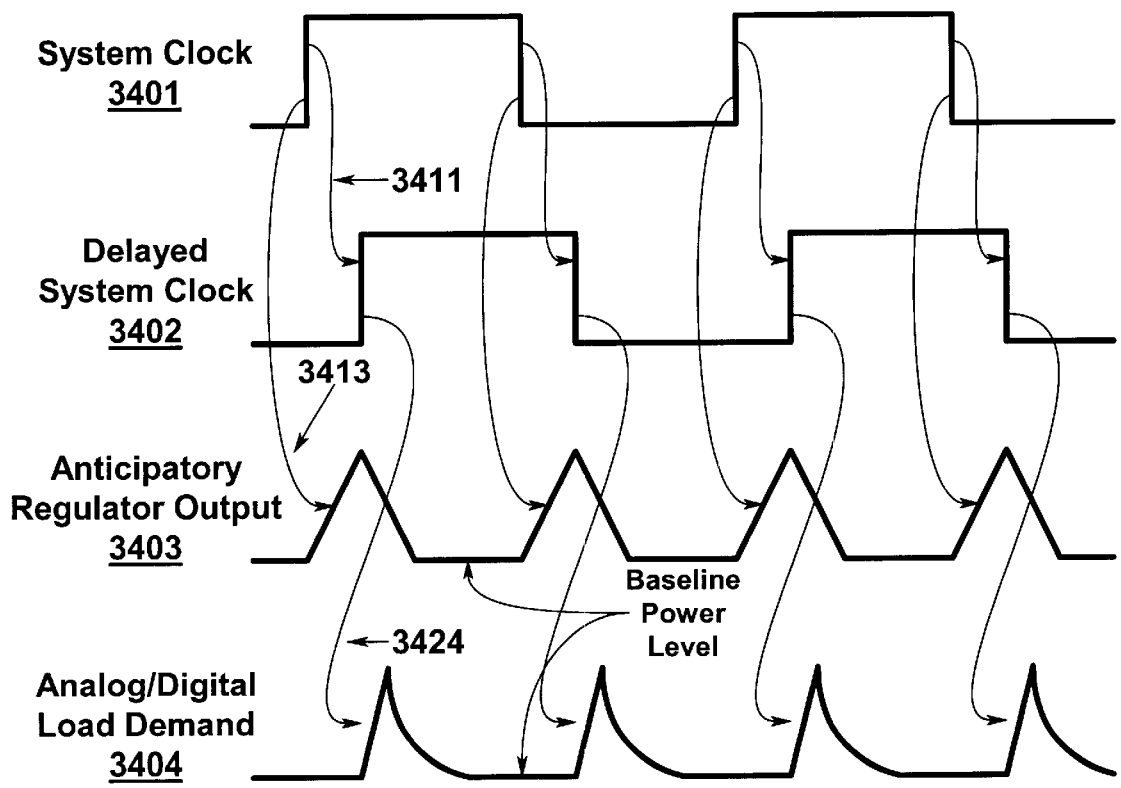
FIG. 34 illustrates an exemplary timing diagram depicting the teachings presented in FIG. 33.

While the exemplary anticipatory regulation scheme illustrated in FIG. 33 is sufficient for one skilled in the art to practice this embodiment of the present invention, the principles of anticipatory regulation may also be taught graphically via a timing diagram as exemplified in FIG. 34. Here the relationship between the system clock generator (3311) output (3401), the output of the delay generator (3312) output (3402) and the anticipatory switching/linear regulator system (3303) high current (3305) output (3403) and the analog/digital circuitry (3313) demand load (3404) are illustrated graphically.

Here it can be seen that the system clock output (3401) after passing through the delay generator (3312) is delayed in time (3411). This delayed signal will then subsequently trigger (3424) an analog/digital load demand (3404) coincident with the rising/falling edge of the delayed system clock (3402). However, prior to this load demand being felt by the anticipatory switching/linear regulator system (3303), the system clock output (3401) has triggered (3413) an adjustment in the anticipatory regulator output (3403) (above or below the baseline power level) that has been determined in an attempt to compensate for the future analog/digital load demand (3404).

While it is not possible to perfectly predict the future analog/digital load demand (3404), any prediction (of the proper sign) will help the anticipatory switching/linear regulator system (3303) deal with load spikes that are generated by the analog/digital circuitry (3313). Note, however, that a wide variety of neural net, fuzzy logic, as well as analog and digital techniques may be utilized to refine the prediction scheme used to generate the anticipatory regulator output (3403) adjustment. All of these systems merely increase the accuracy of the resulting system and do not change the basic premise on which the anticipatory regulation is based.

While the timing diagram of FIG. 34 illustrates the anticipatory regulation on each and every system clock output (3401) edge, one skilled in the art will quickly realize that this technique may be applied to just rising or falling clock edges, as well as to some multiple of any number of rising and/or falling clock edges as implied by the optional divider/integrator (3314).

Advantages to Anticipatory Regulation

As mentioned previously, there are several advantages to this new approach to regulation. Among these include the following:

Proactive vs. Reactive Regulation

The feedback control path, being anticipatory, has a head start on activating circuitry necessary to meet the power requirements of the complex load (FIG. 33, 3307). In contrast, other regulation schemes require that the regulator first sense the power demand based on the reduced regulator output voltage (or increased regulator current demand by the load). This reactive approach can never have the bandwidth necessary to react instantaneously to peak current demands by the load, and as such is inferior to a proactive approach to regulation.

Load Synchronization

The anticipatory architecture described above synchronizes the load power demands with actions within the regulator used to correct for loading-based power demands. The traditional approach has been to have the switching regulator/power converter asynchronously modulate its pulse width and/or frequency to compensate for changing load requirements. The drawback with this design approach is that the PWM or frequency converter in the switching regulator may not be able to respond fast enough to adequately regulate the output voltage in periods of peak power loading demands. By providing an anticipatory feedback loop to the regulator that is synchronized with future power demands, there is never any issue as to whether the regulator can respond in time to meet the future power demands by the complex load.

Electromagnetic Interference

Anticipatory regulation has a unique advantage in that it provides the opportunity to drastically reduce the electromagnetic interference (EMI) associated with high current switched mode power supply systems. These systems typically involve the use of inductors and other PCB components that are switched at high frequencies to supply the peak power demands of the complex load. These configurations emit a significant amount of EMI that must be either filtered or shielded from the surrounding environment. These preventative measures not only cost money, but also increase the weight of portable equipment.

It should also be noted that due to the high clock frequencies present in modern digital integrated circuits, there would be significant problems in routing this clocking information outside the chip to feed to a discrete regulator circuit. Even if such a system could be constructed, the EMI that would be generated by such a system would make it prohibitive from a regulatory sense, and extremely expensive to shield from an economic perspective. Therefore, with current system construction methods, this would not be a practical alternative.

Component Efficiencies

Figure 9:
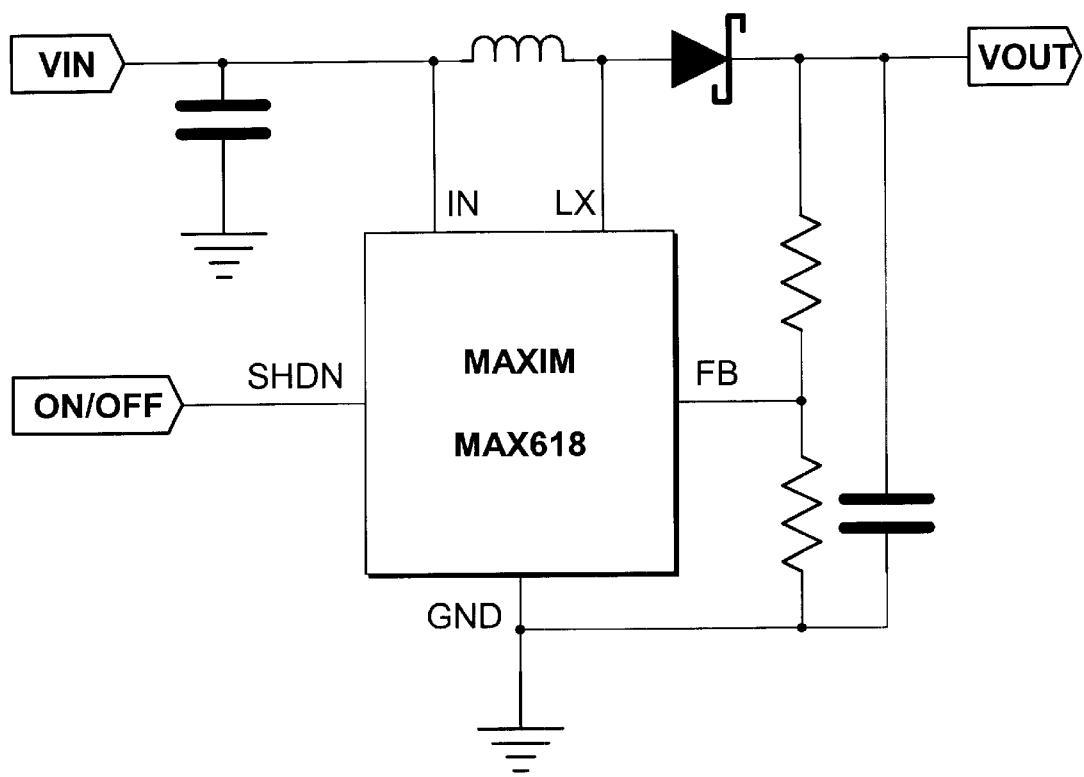
FIG. 9 illustrates a prior art switching regulator application from Maxim Integrated Products and its associated performance curves (see Maxim Integrated Products advertisement, "Highest Power Step-Up DC-DC Delivers 50% More Current Without Package Penalty", ECN MAGAZINE, at 67, www.ecnmag.com/info (August, 1999))
Figure 10:
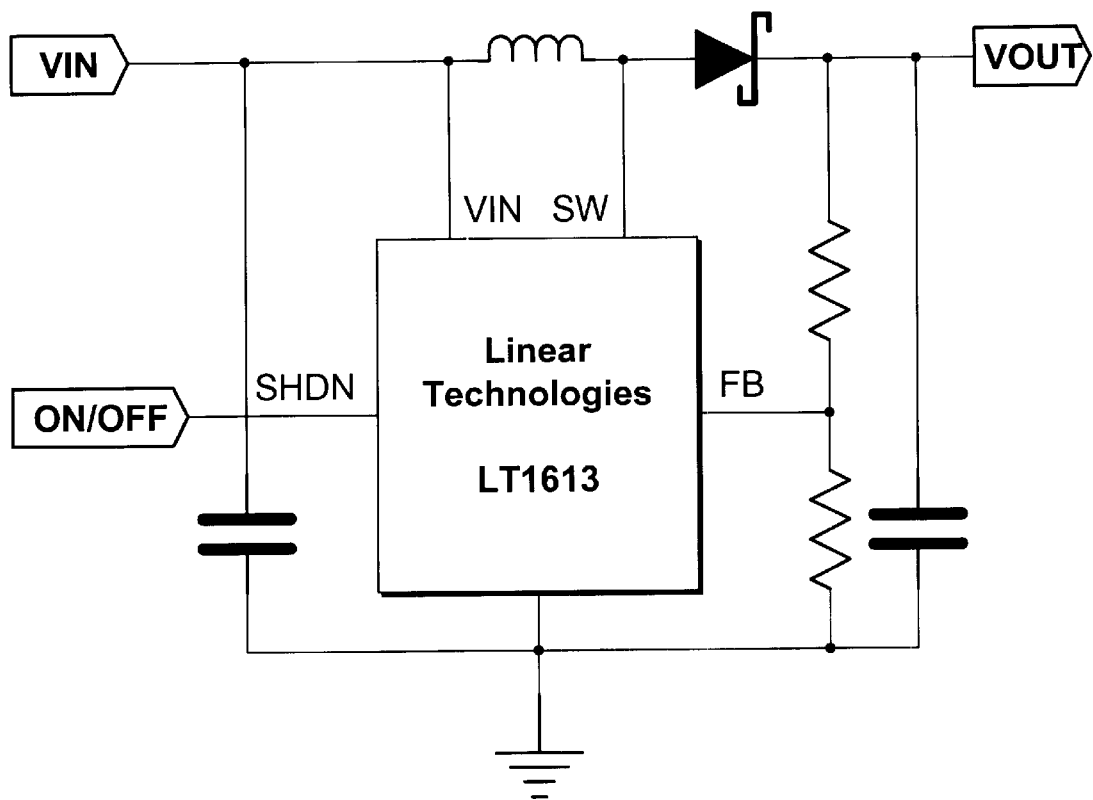
FIG. 10 illustrates a prior art switching regulator application from Linear Technology (see Linear Technology advertisement, "SOT-23 Switchers Use Smallest Inductors", ECN MAGAZINE, at 55, www.ecnmag.com/info (August, 1999))
Figure 11:
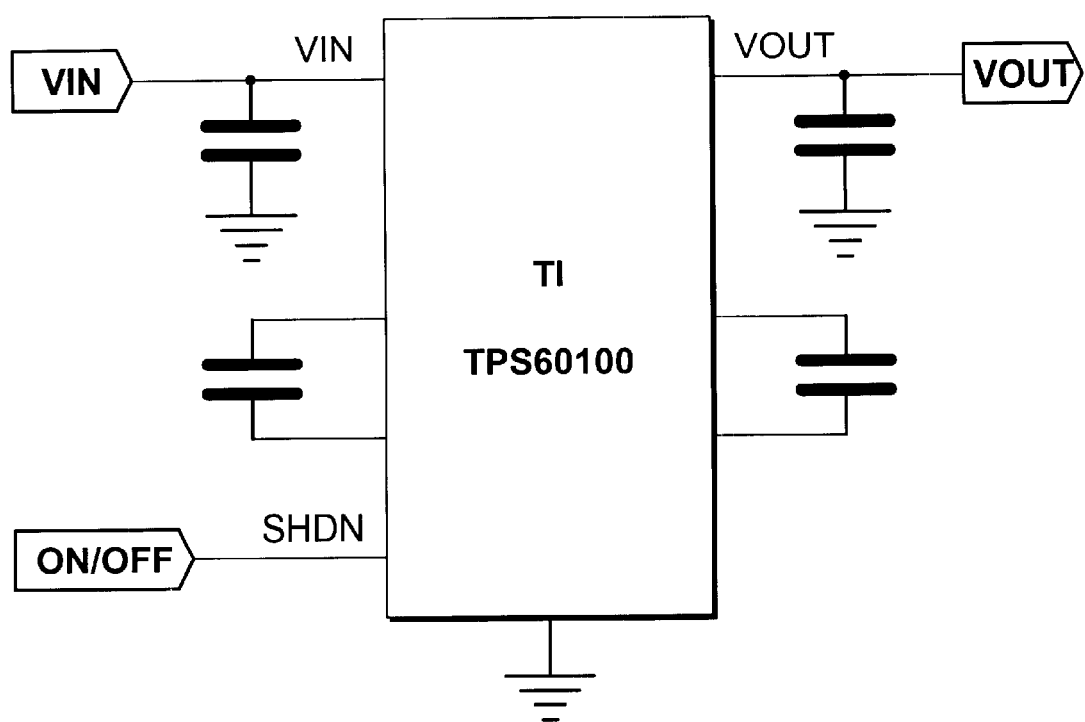
FIG. 11 illustrates an inductorless prior art power converter application from Texas Instruments and its associated performance characteristics (see Texas Instruments advertisement, "Industry's First Regulated, High-Current, Zero-Ripple Charge Pumps", ECN MAGAZINE, at 63, www.ecnmag.com/info (August, 1999)
Figure 12:
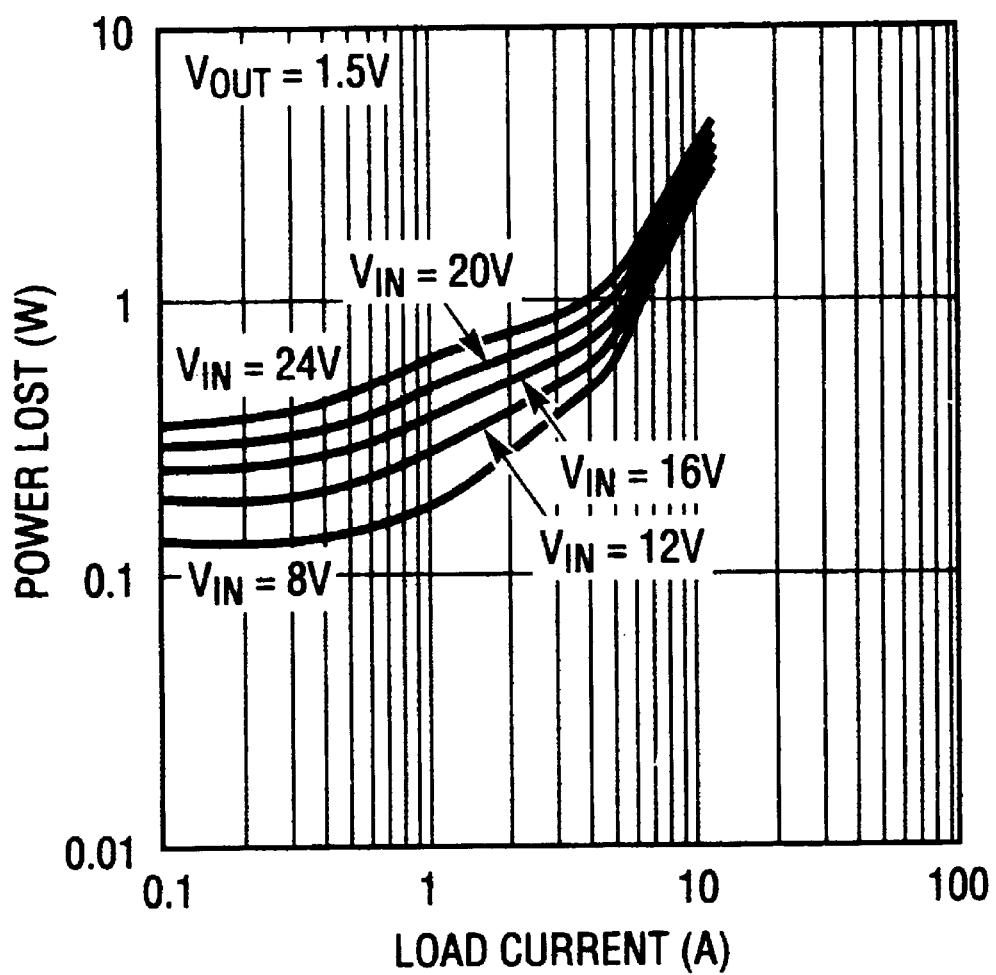
FIG. 12 illustrates prior art performance curves for an exemplary 1-step power converter style voltage regulator (see John Seago, Linear Technology Design Note 209, "2-Step Voltage Regulation Improves Performance and Decreases CPU Temperature in Portable Applications", www.linear-tech.com/go/dnLTC1736 (August, 1999))
Figure 13:
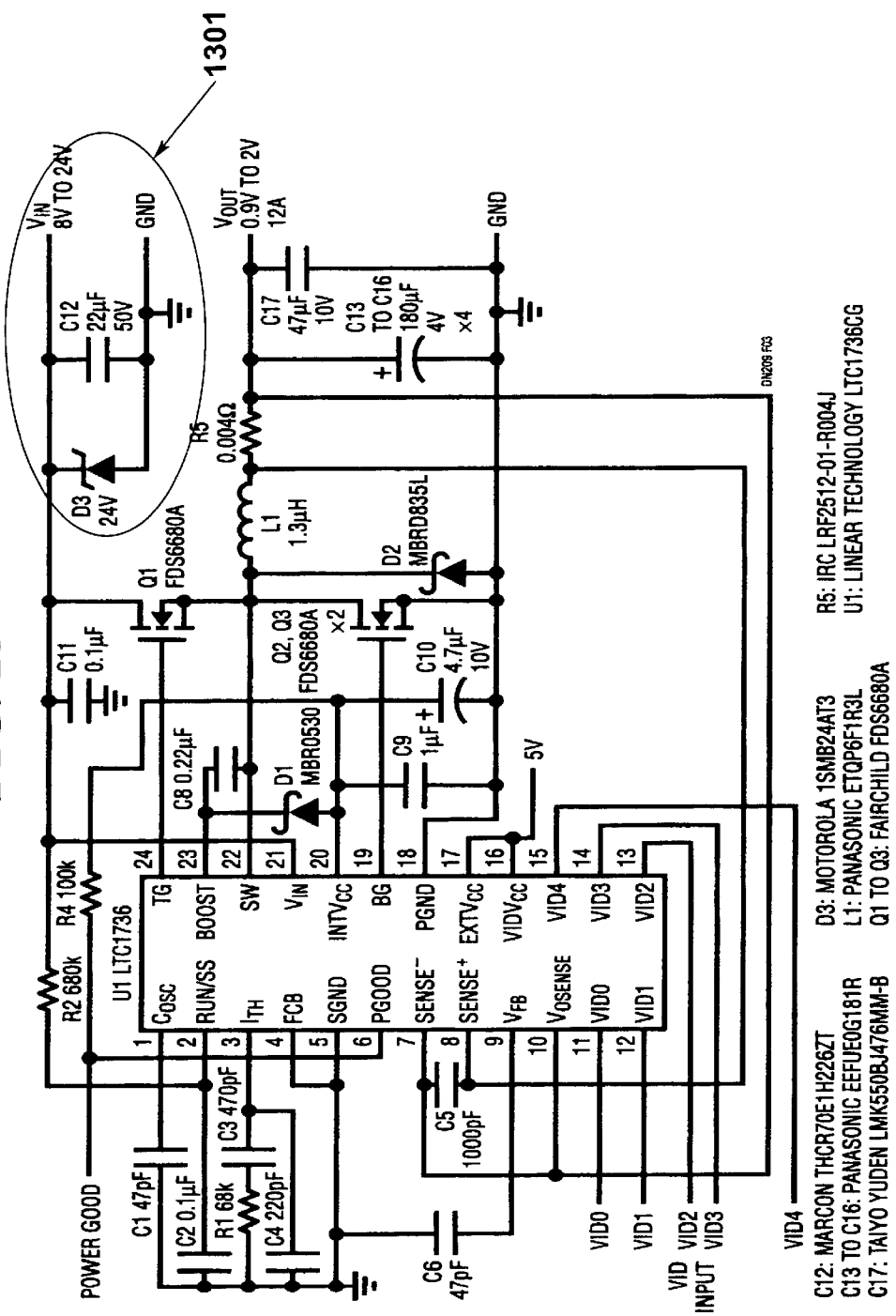
FIG. 13 illustrates a typical circuit topology for a 1-step power converter system (see John Seago, Linear Technology Design Note 209, "2-Step Voltage Regulation Improves Performance and Decreases CPU Temperature in Portable Applications", www.linear-tech.com/go/dnLTC1736 (August, 1999))

With conventional switched mode power supplies as illustrated by the configurations of FIGS. 9–11, a reactive component (usually an inductor) is required for temporary energy storage during the power conversion process. This inductor is invariably placed beside the switching regulator circuit on a printed circuit board (PCB).

Using anticipatory regulation, a switched mode power supply inductor can be mounted directly on top of the fully integrated anticipatory regulator/switch with foundation integrated circuit (3302) prior to encapsulation of the entire integrated circuit package. This offers some distinct advantages over the prior art. Specifically, the Q (quality factor) of the inductor is heavily dependent on stray impedances associated with the electrical connection with the switching regulator integrated circuit. For this reason, many integrated circuit manufacturers have gone to exotic surface mount packaging and similar techniques to minimize the loss components associated with the package interconnect. However, there is a limit to this approach, and all of these techniques still demand that the package leads and bond wires used in the connection process be of a relatively conventional character.

In contrast, by permitting a surface mount inductor to be mounted directly to the top of the fully integrated anticipatory regulator/switch with foundation integrated circuit (3302) prior to encapsulation of the entire system, there is no need to deal with this lossy interconnect. Furthermore, since the fully integrated system is often encapsulated in a metalized ceramic package, this offers the opportunity to shield the inductor and the entire switching regulator system and thus affect a significant decrease in EMI for the overall system configuration. This result is a direct consequence of not having to connect the switching inductor via conventional PCB interconnect as is now common in the art.

Deterministic Power Scheduling

The teachings illustrated in FIG. 33 may be made more specific to applications such as digital microprocessors and the like with no loss of generality. In these circumstances, the present invention teaches that the deterministic nature of digital circuitry may be used to advantage to schedule power future demands just prior to their actual impact on the regulator/switch.

Figure 35:
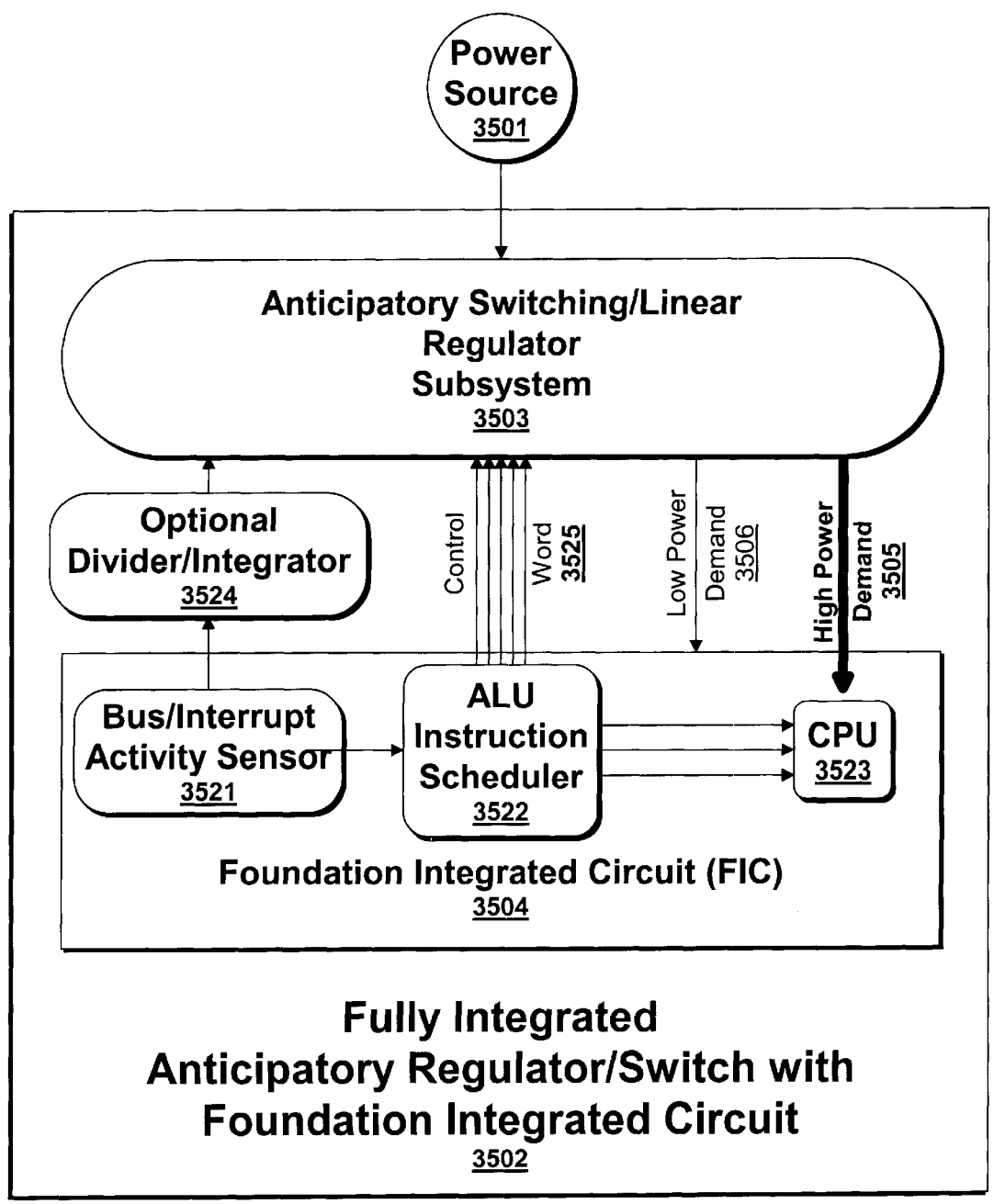
FIG. 35 illustrates an exemplary embodiment of the present invention utilizing deterministic power scheduling as applied to a fully integrated anticipatory regulator/switch with foundation integrated circuit.

Referencing FIG. 35, this configuration of anticipatory regulation is structurally similar to that illustrated in FIG. 33, with the exception of the addition of a few component system blocks within the foundation integrated circuit (FIC) (3504). Here the application is one of regulating the voltage to a microprocessor CPU (3523). In this configuration the ALU instruction scheduler (3522) associated with the microprocessor CPU (3523) is augmented to emit a control word (3525) that is fed directly to the anticipatory switching/linear regulator subsystem (3503). The anticipatory switching/linear regulator subsystem uses the control word (3525) to increase/decrease the power output to the CPU (3523) in anticipation of the increased/decreased load presented to the regulator subsystem. Since the ALU instruction scheduler (3522) knows in advance what instructions will be performed and what portions of the CPU will be activated based on the instructions selected, it is a relatively simple matter to calculate prior to use the required increase/decrease in power required for upcoming CPU instructions.

This technique may be augmented with a bus and/or interrupt activity sensor (3521) which 'sniffs' bus activity both within and/or outside of the complete integrated circuit (3502) and generates clock pulses which are fed to an optional divider/integrator (3524) for use by the anticipatory switching/linear regulator subsystem (3503).

Note that this information may be also integrated into the ALU scheduler to both inform the anticipatory switching/ linear regulator subsystem (3503) via the control word (3525) but also regulate the performance of the CPU to moderate the overall power consumption to some average acceptable level. It is important to realize that in some circumstances where power consumption is of paramount importance, some speed tradeoffs in the short term may be acceptable to achieve this overall goal of power efficiency. By integrating the power sensing and generating functions in this manner, it is possible for the system to be tailored to a given performance level based on a desired power use curve. For example, a user of a laptop computer might well be willing to live with a reduced performance level of the laptop computer during the last hour or so of available battery life if it were possible using power saving techniques to extend the useful life of the last hour to four or five hours of use. Similarly, the user may wish to opt for a lower overall performance level knowing that the laptop MUST operate at some level for 8 hours rather than the specified 2 hour battery life that is available when operating at full power and CPU speed.

In summary, it has been shown that deterministic power scheduling as taught by the present invention may be used to both more accurately regulate the power demands of a given analog or digital circuit but also permit intelligent planning of how power is to be used within an integrated circuit environment. This integration of the power conversion function at the chip level will provide a wide variety of options not previously possible in the prior art.

Exemplary Timing Sequence Diagram—ALU Instruction-Based Regulation

Figure 36:
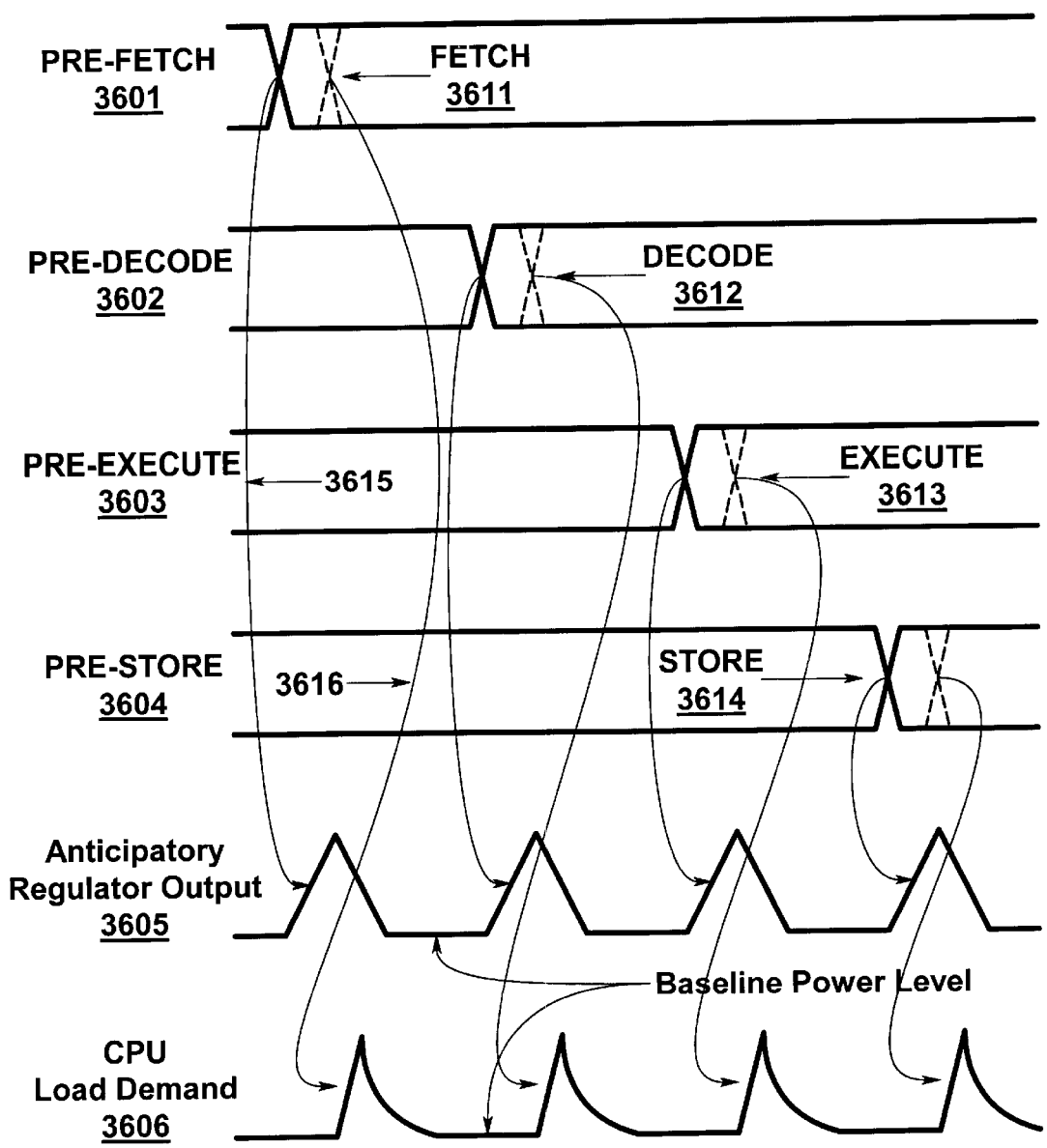
FIG. 36 illustrates an exemplary timing diagram depicting the teachings presented in FIG. 35.

While the exemplary anticipatory regulation scheme illustrated in FIG. 35 is sufficient for one skilled in the art to practice this embodiment of the present invention, the principles of anticipatory regulation may also be taught graphically via a timing diagram as exemplified in FIG. 36. Here the ALU architecture has been assumed to be a standard RISC based system having overlapping FETCH, DECODE, EXECUTE, and STORE sequences.

As seen in FIG. 36, the signal transitions corresponding to the actual FETCH (3611), DECODE (3612), EXECUTE (3613) and STORE (3614) are preceded in time by corresponding PRE-FETCH (3601), PRE-DECODE (3602), PRE-EXECUTE (3603) and PRE-STORE (3604) signals that are generated by pre-delay elements that are functionally similar to the delay generator (3312) in FIG. 33. As in FIG. 34, the transition of any of the PRE-FETCH/DECODE/EXECUTE/STORE signals (3601, 3602, 3603, 3604) causes the anticipatory regulator output (3605) to be increased as exemplified by the link (3615). This increase in regulator output precedes and attempts to compensate for the CPU load demand (3606) triggered by the ALU instruction function as exemplified by the link (3616).

One skilled in the art will recognize that any number of CPU and/or ALU digital transitions may form the basis for the decision space utilize by the anticipatory regulator output (3605) in making the adjustment of regulator power output in response to future system demands. Furthermore, it is also clear from this methodology that one function of the anticipatory regulator in this circumstance might be to modulate the CPU clock rate to maintain an optimum (or minimum) power dissipation for the entire computer system. In this manner it is feasible for the ALU cycle (FETCH, DECODE, EXECUTE, STORE, etc.) to be delayed as needed to meet this requirement. It is anticipated that this processor speed throttling may occur via modulation of the CPU clock rate, or by insertion of wait states within the ALU pipeline, and/or migration of some system components to full static DC conditions to conserve scarce battery resources.

Integrated AC and High-Voltage Supply Conversion Overview

There exist a wide variety of applications in which integrated circuits are interfaced directly or indirectly to an AC power source. In these applications it is often burdensome to implement a fully regulated power supply to support the integrated circuit, and additionally space constraints may make this impractical. This scenario will now be discussed in detail, especially with reference to fully integrated digital systems that operate directly from AC power sources.

Figure 37:
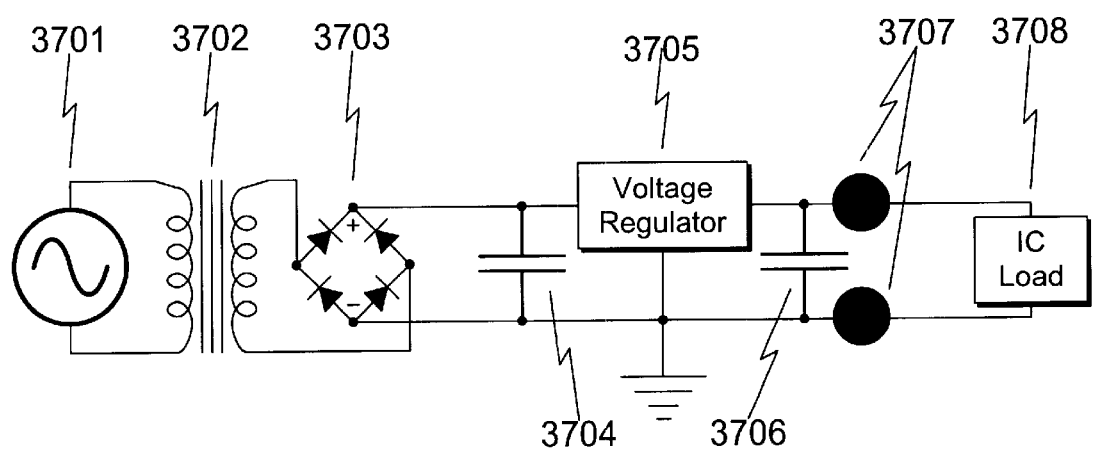
FIG. 37 illustrates a conventional prior art power supply system for a typical integrated circuit load.

Referencing FIG. 37, a typical AC power application includes an AC power source (3701) which is then isolated and voltage converted using a transformer (3702), rectified using a full-wave or half-wave bridge rectifier (3703), filtered by a capacitor (3704), regulated by a voltage regulator (3705), and decoupled using yet another filtering capacitor (3706). The regulated DC output is then available at the output of the voltage regulator (3707) for use with any number of analog and/or digital integrated circuit loads (3708).

Almost without exception, this circuitry is implemented using discrete components on a printed circuit board and poses problems from several respects. First, the space requirements in many cases restrict the available area for this circuitry. Second, the AC transformer (3702) is often bulky and adds significant weight to the system. Third, the voltage regulator (3705) consumes power irrespective of any drain on the power supply terminals (3707). Finally, the AC transformer (3702) consumes power due to finite coil resistance irrespective of whether there is any load (3708) at the power supply terminals (3703). All of these are minor disadvantages but in the long run result in significant power waste in these systems.

While the industry has sought options to this basic design, there are little if any viable alternatives given the current process technologies. The basic problem is twofold. First, the integrated circuit load (3708) present at the power supply output terminals (3707) demands that DC current be provided, and additionally, that this current be stable and regulated to a low voltage suitable to prevent oxide punch-through and damage to the integrated circuit.

An Integrated Regulation Solution

The present invention teaches that the conventional design in FIG. 37 can be modified to be fully integrated within the integrated circuit load. This can be accomplished by judicious use of Chen-style pass devices and Chen-style diode structures (or their functional equivalents). This improvement over the prior art is significant because for the first time it is now possible to completely eliminate extraneous power supply circuitry and connect the integrated circuit directly to the AC power source.

Figure 38:
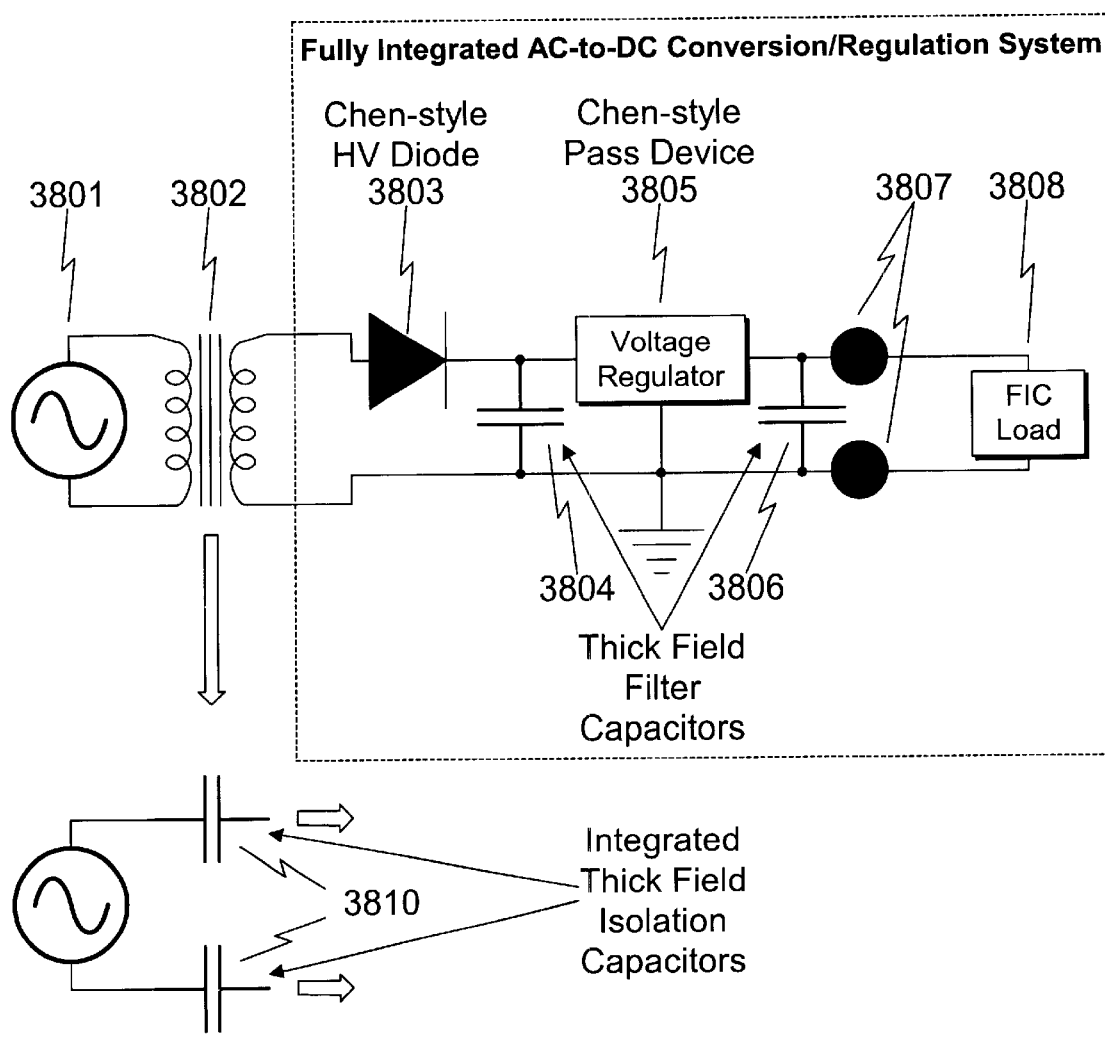
FIG. 38 illustrates an exemplary embodiment of the present invention as applied to a fully integrated AC-to-DC conversion/regulation system.

Referencing FIG. 38, and exemplary embodiment of this concept is presented. Note that the bridge rectifier has been replaced in this simple example with a single Chen-style high voltage diode structure (3803). The filter (3804) and decoupling (3807) capacitors are fabricated using metal plate structures with thick field oxide or some other suitable dielectric with a high breakdown voltage rating. Since Chen-style high voltage pass devices may be utilized in constructing the voltage regulator (3804), there is no worry with respect to junction breakdown within these devices during use. Thus, it is possible to construct systems in which standard 120VAC line current may be used directly to power the integrated circuit, without special processing beyond proper fabrication of the Chen-style active semiconductor devices.

Within the context of this application it is especially significant to note that the voltage regulator (3804) can take on a wide variety of implementation, from a simple linear pass device regulator to a full DC-DC switching power converter. Therefore, it is possible to fabricate an integrated circuit using the teachings of the present invention that incorporates a topside/bottomside regulator/switch function that include a fully integrated AC-to-DC-to-DC conversion system. In this preferred embodiment, AC line current (or any other AC source) is converted to DC high voltage, which is then power-converted using a DC-DC converter to the desired regulated DC voltage for use with the foundation integrated circuit (FIC).

The type of capability presented by this application has a wide variety of uses, especially in situations where logging of data must take place in remote areas where only raw 120VAC line power or other AC power is available, or where the line voltage is erratic or of varying voltages and/or frequencies. The system as presented also has the capability to incorporate power factor correction to ensure that applicable utility regulations regarding reactive loading are followed.

AC Power Capacitive Coupling

Referencing FIG. 38, it should be noted that within the context of this application it is possible to dispense with the AC transformer (3802) in many applications. The primary purpose of the AC transformer in many applications is one of safety, to prevent potentially hazardous AC line voltages at the integrated circuit load (3808).

However, it is possible to use thick field oxide and metal plate capacitors (3810) to functionally replace the AC transformer (3802) and isolate the rectifier circuitry of the present invention from direct electrical contact with the incoming AC line. Since many integrated circuit loads only require a few microamperes of current to operate, the amount of capacitor plate area required to implement this isolation medium is modest.

As an example, consider an integrated circuit that requires 1 microampere of DC current at 5V for proper operation. This equates to 5 microwatts of power dissipation. Assuming a 120VAC RMS power source, this would require an equivalent series impedance of $R=V^2/P=2.88$ G$\Omega$. This capacitive reactance is given by the relation $Z=1/(2\pi fC)$, so a 2.88 G$\Omega$ impedance requires a single ended capacitance value of approximately 1 picofarad, a value that is easily fabricated using even thick field oxide.

Applications

Smart Consumer Appliances

The present invention when applied to integrated AC and high-voltage supply conversion is envisioned to have wide application to emerging 'smart' consumer appliance markets. It has long been posited that the home of the future will have a plethora of interconnected household appliances that are interconnected in an intelligent network that may be centrally or remotely controlled by the homeowner. However, few practical systems have been put forth to implement such a system.

The major hurdle in implementing these sorts of systems is not one of functionality, but rather integration level and associated cost. For example, it is now possible to generate local area networks which use the house wiring in a home as the communications medium, but to do so requires a network controller, interface circuitry, a separate microprocessor, and other controller functions. The sum total cost of these components exceeds the price threshold of functionality that homeowners are willing to pay. Furthermore, no existing process technology has been able to integrate these functions on a single die at a reasonable cost. As illustrated in FIG. 31, there do exist a variety of information appliance system-on-a-chip configurations, but the level of integration has to date generally precluded the integration of power switching devices on-chip.

Figure 39:
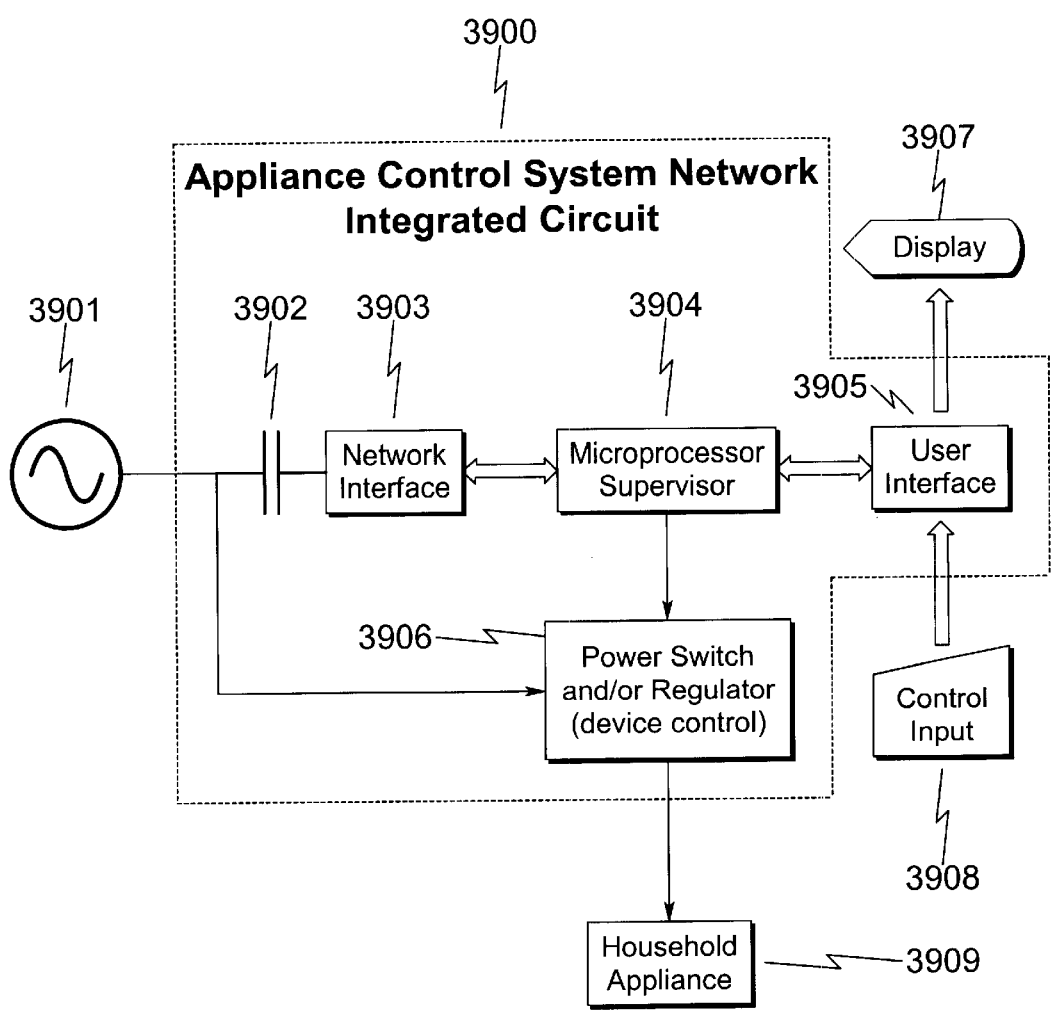
FIG. 39 illustrates an exemplary embodiment of the present invention as applied to an integrated appliance control system network.

The present invention as applied to this problem solves these problems by permitting a full integration of the network controller, microprocessor supervisor, and power management functions. As illustrated in FIG. 39, an appliance control system network integrated circuit (3900) fully integrating these functions is possible. Here the AC line source (3901) is DC isolated (3902) from a network interface (3903) that provides access to a microprocessor supervisor (3904). This microprocessor supervisor (3904) can activate one or more power switches (3906) that control the function of the household appliance (3909). The system may also incorporate an optional user interface (3905) and external user display (3907) and/or keyboard control input (3908).

Automotive Applications

The present invention is uniquely adapted to integration in automotive applications because of the high level of integration possible with the disclosed integrated circuit topology. While a plethora of applications in the automotive environment are possible, it is instructive to look at an exemplary automotive application to illustrate the power of the present invention.

Figure 40:
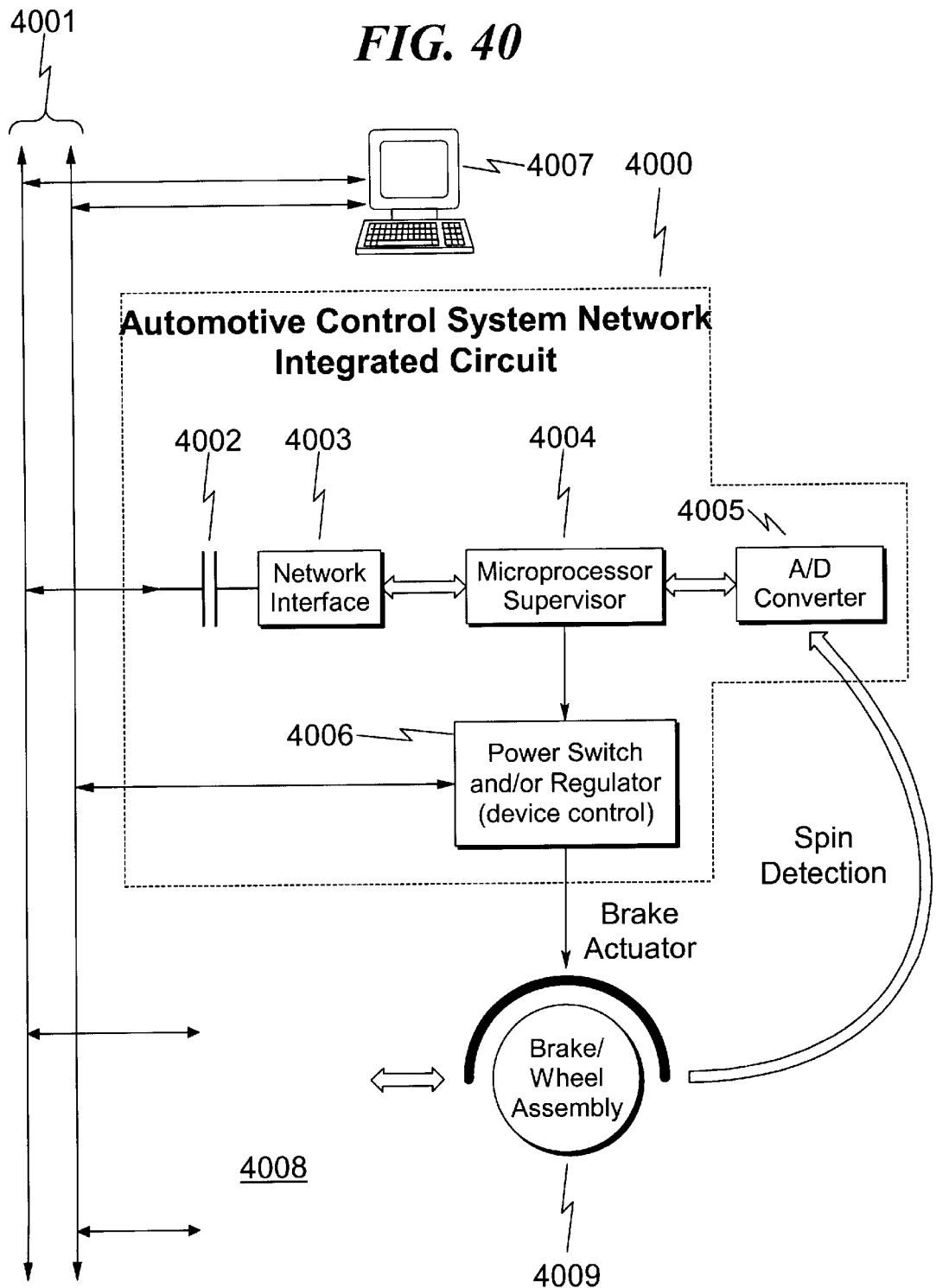
FIG. 40 illustrates an exemplary embodiment of the present invention as applied to an integrated automotive control system network.

Referencing FIG. 40, a typical modern day application for power switching in automobiles is in an integrated ABS (anti-lock brake system) control system (4000). Here we can see that the automobile (4008) has one or more brake/wheel assemblies (4009) that are activated to brake based on a brake actuation control from a power switch (4006). This power switch would normally be implemented via use of a power MOSFET that was controlled by a separate microprocessor integrated circuit. In this example, the microprocessor (4004) and the required A/D converter (4005) to convert wheel spin information from the brake/wheel assembly (4009) is integrated on the same integrated circuit using the teachings of the present invention. Furthermore, a network interface (4003) and associated isolation means (4002) may be integrated onto the same integrated circuit to provide access via a system bus (4001) for communication with other brake/wheel control systems, automotive diagnostic computers (4007), etc.

The real benefits of this configuration as applied to the automobile are many, but basically center around reliability, functionality, and cost. The system as shown can be made much more reliable than conventional ABS systems because the components can be localized right at the brake/wheel assembly rather than being remotely controlled by a central computer. Should one portion of the system fail, there is a potential for a duplicate ABS component to take control and recover braking control. The functionality of this system can be made greater than that of existing ABS systems since the control loop from the braking system to the control microprocessor is both direct and without potential for connector malfunction. The cost of this system can obviously beat any discrete implementation, since the cost of printed circuit board (PCB) is approximately $1/in$^2$. Reducing the component count in this situation definitely saves overall system cost.

The above example is only one small portion of the application pool available in the automotive market for the present invention. Other applications, such as smart fuel pumps, windshield wipers, door locks, window controls, seat position adjusters, ignition control systems (both multi-cylinder control and individual cylinder control), among others are possible using the teachings of the present invention. The key advantage of the present invention in these applications is that the control for most systems can be reduced to a five-wire harness having POWER, GROUND, COMMUNICATION, SENSOR INPUT, and CONTROL OUTPUT functions. The POWER and GROUND connections supply power supply connections for the controller IC and the device being powered. The COMMUNICATION connection provides for a network interface (4003) connection via an isolation means (4002). The SENSOR INPUT permits some analog function to be digitized for use by the embedded microprocessor supervisor (4004), while the CONTROL OUTPUT is a high current drive output permitting power switching (4006) of some external load. Given the teachings of the present invention, the construction of such a generic automotive control system is within the ordinary skill of one in the IC design arts.

Finally, it must be mentioned that with the advent of electric cars and the increased pressures on the electrical systems of conventional gasoline combustion and diesel automobiles, there is a concerted effort in the automotive industry to increase the standard battery voltage in automobiles from the current +12V systems to a +48V system. While this increase makes sense from a power distribution perspective (note that the power lost in a battery cable is proportional to the battery voltage drop through the cable squared divided by the cable resistance), this presents some significant problems with future automotive electronics designs. Higher levels of electronics integration (according to the prior art) invariably dictate reductions, not increases in power supply voltage. Furthermore, the increased supply voltages associated with electric cars and the like will dictate a continued separation of the power regulator/switching functions and the associated microprocessor supervisors that control their operation. This results in increased automobile weight, already a serious issue with electric automobiles. Obviously, another approach is wanting in this application area, and the present invention fits neatly with existing technologies and the future needs of the automotive industry to bridge the gap from existing discrete control systems to a fully integrated environment.

Extension/Integration of Existing Serial Bus Topologies

It should be mentioned at this point that there currently exist a wide variety of serial bus topologies on the market, such as RS-232, RS-422, Dallas Semiconductor 1-wire (www.dalsemi.com; www.ibutton.com), FireWire, SPI, USB, Ethernet, cable modem, to name just a few exemplary standards. There are two preferred exemplary embodiments of the present invention that deal specifically with these and similar serial communication systems.

First, these systems invariably need a power regulator/switch function as the driver for the serial communication interface. These drivers typically must be robust and able to source and/or sink significant amounts of current with rapid slew rates. Additionally, these devices must have significant ESD protection to protect them in the event of electrostatic discharge events. Unfortunately, the communication aspects of these interfaces makes the integration of these devices expensive and problematic from a reliability standpoint. The present invention solves this problem in many circumstances by utilizing robust Chen-style structures as the serial interface elements. These devices can provide superior ESD protection characteristics as compared to conventional lateral MOSFET structures, and are thus ideally suited for these serial interface applications.

While one manufacturer (Maxim Integrated Products, http://www.maxim-ic.com) has announced a RS-232 interface complete with integrated UART, this combination of functionality is somewhat unique in the industry, as integration of the high-voltage interface circuitry with the control logic of a UART, etc. has eluded modern chip manufacturers. However, the present invention can take this integration two steps farther by integrating the RS-232 interface, the UART function, the microprocessor supervisor, and the power output switch drivers all on a single integrated circuit. This would never be possible/practical using the technology posited by Maxim for their combined RS-232 and UART functionality.

Finally, as just mentioned, the present invention permits both the reception and regulation/switching of power devices by the serial interface circuitry. Thus, the level of integration using the present invention with existing serial interfaces permits direct control of power devices on the same integrated circuit chip that contains the serial interface and microprocessor supervisor control circuitry. This level of integration has been wanting in the personal computer market and has severely limited both the low power operation of many products as well as the minimum PCB area required for a given computer system implementation. With the present invention, it is now entirely possible to build a complete personal computer (including serial interface circuitry, bus drivers, etc.) on a single chip.

Fully Integrated Power Factor Correction

One anticipated application for the present invention is the integration of power control circuitry into 'smart' power factor correction circuitry. There are currently a variety of 3-terminal devices available that when surrounded with a variety of discrete components can support a power factor correction system. The present invention permits all of this circuitry to be integrated on a single integrated circuit and thus drastically reduce the cost and increase the reliability of these systems.

Integrated Video Deflection Drivers/Amplifiers

The mixed-voltage nature of the present invention permits the direct support of high-voltage video deflection drivers in conjunction with electronics that might serve as an interface to the 'digital' world. Prior to the present invention, the integration of these functions would be unheard of, as the disparity in voltage and current demands would require the use of integrated circuits fabricated with wildly different process parameters.

Summary

The significant hurdle breached by the present invention in this application is that all of the functionality illustrated in (3900, 4000) can be incorporated on a single integrated circuit, saving both space and cost when implementing this functionality. The full integration of the power switch and/or regulator (3906, 4006) devices (typically using Chen-style pass devices) both reduces the cost of the overall system and permits the system to be implemented in situations where space is at a premium. Note also that a significant advantage of the topology illustrated in FIGS. 39–40 is that the standard functionality associated with a power regulator module can also incorporate a full microprocessor control function at substantially the same system cost. Thus, the system as illustrated can be substituted for conventional power supply designs for existing household appliances (such as clock radios and other electronics) and at the same time permit these devices to communicate via household wiring networks to other nodes on the network within the house.

While the technology to implement house wiring networks is well known in the art, the capability to integrate this functionality on a single integrated circuit has been lacking in the prior art. The present invention solves this problem and in doing so reduces the cost of this system to a level that will permit penetration of this technology into markets that are heretofore have not been reached due to economic considerations.

Finally, the present invention provides for a degree of integration that has been lacking in automotive systems. It is a given that with the increasing sophistication of automobiles and their integration of power control functions, the use of the present invention will be a welcome addition to the design suite for automobile designers.

Conclusion

A versatile integrated voltage/current/power regulator/switch system and method have been presented that provides superior regulation/switching performance as compared to the prior art while simultaneously reducing the cost of the integrated circuit as fabricated. In contrast to the prior art's slavish use of lateral pass devices in regulator/switching circuits, the present invention specifically teaches that these devices and their associated control circuitry may be fabricated on top of or on the bottom of the foundation integrated circuit, which may essentially be any integrated circuit requiring this functionality.

As has been demonstrated by the exemplary invention embodiments concerning integrated high voltage and AC-driven power supplies and appliance monitoring and control networks, the present invention permits a heretofore unheard of level of integration, in that it permits high voltage devices such as the Chen-style pass devices to be integrated within the same integrated circuit die as low voltage microprocessors. As will be appreciated by one skilled in the art, this functionality is highly desirable in a wide variety of communications and networking circuits wherein the network interface typically requires high voltage capability, yet the computational part of the system dictates the use of low power supply voltages and high power supply currents. The present invention makes this integration possible and opens up wide avenues for true system-on-a-chip integration in areas which have eluded attack using conventional methods, such as single-chip disk drive controllers, T1 and associated telecommunications interfaces, and integration of full RS-232/422 interfaces on microprocessor/microcontroller circuits, among others. As demonstrated by the examples provided in this document, the power control of external devices with MOSFET switches and the like is invariably accompanied in modern systems with some form of intelligent control function. To date these functions have been separately packaged. The present invention has as a major accomplishment providing the capability to fully integrate both power switching/regulation and the intelligent control functions on a single integrated circuit.

Finally, it should be mentioned that the present invention has particular application in local regulation of power supply voltages to both support a wider variety of mixed-signal designs, but also attack a very serious and impending dilemma facing digital designers. With the dropping of supply voltages for digital designs and the corresponding increase in switching and crowbar currents in these designs, a new level of performance in power switching and regulation will become necessary for future digital designs to take advantage of scaling in technology feature sizes in accordance with Moore's Law. Current power regulation and power conversion technology cannot support the required peak current loads without significantly increasing the die size to the point that the chip design becomes uneconomical. The present invention presents a clear and elegant method of solving this problem both within current process technologies and for the foreseeable future.

Additionally, the present invention permits integration of high voltage switches within the context of low voltage digital systems, a feature that cannot be duplicated using the prior art.

Claims

Although a preferred embodiment of the present invention has been illustrated in the accompanying Drawings and described in the foregoing Detailed Description, it will be understood that the invention is not limited to the embodiments disclosed, but is capable of numerous rearrangements, modifications, and substitutions without departing from the spirit of the invention as set forth and defined by the following claims.

What is claimed is:

1. An integrated voltage/current/power regulator/switch system comprising:
   (a) one or more integrated pass device(s) having one or more metalized base plate(s);
   (b) a foundation integrated circuit (FIC) having one or more metalized power interconnection layer(s);
   (c) one or more insulating layer(s) between said pass device(s) and said foundation integrated circuit; and
   (d) one or more substantially vertical metal interconnect(s);
   wherein
      said integrated pass device is proximal to and placed vertical to said foundation integrated circuit;
      said vertical metal interconnect(s) connects said metalized power interconnection layer(s) to said metalized base plate(s); and
      said integrated pass device regulates and/or switches power to said metalized power interconnection layer(s) via said vertical metal interconnect(s) through said metalized base plate(s).

2. The integrated voltage/current/power regulator/switch system of claim 1 wherein said integrated pass device is horizontally integrated.

3. The integrated voltage/current/power regulator/switch system of claim 1 wherein said integrated pass device is vertically integrated.

4. The integrated voltage/current/power regulator/switch system of claim 1 wherein said integrated pass device is a Chen-style device.

5. The integrated voltage/current/power regulator/switch system of claim 1 wherein said integrated pass device comprises a MOSFET.

6. The integrated voltage/current/power regulator/switch system of claim 1 wherein said integrated pass device comprises a BJT.

7. The integrated voltage/current/power regulator/switch system of claim 1 wherein said integrated pass device regulates the current passing through said metal interconnect(s).

8. The integrated voltage/current/power regulator/switch system of claim 1 wherein said integrated pass device regulates the voltage at said metal interconnect(s).

9. The integrated voltage/current/power regulator/switch system of claim 1 wherein said integrated pass device regulates the output power flowing through said metal interconnect(s).

10. The integrated voltage/current/power regulator/switch system of claim 1 wherein a capacitor is electrically connected to said pass device and integrated, fabricated, or attached on the surface of said pass device.

11. The integrated voltage/current/power regulator/switch system of claim 1 wherein an inductor is electrically connected to said pass device and integrated, fabricated, or attached on the surface of said pass device.

12. An integrated voltage/current/power regulator/switch method comprising:
   (a) fabricating a foundation integrated circuit (FIC);
   (b) forming an insulating layer on said FIC & optionally planarizing said insulating layer;
   (c) printing a mask for power supply contacts on said FIC;
   (d) optionally forming a barrier and/or adhesion layer film on said FIC power supply contacts;
   (e) forming a conductive material over said power supply contacts to fill void(s) and create substantially vertical interconnect(s);
   (f) continuing to form a conductive material over said insulating layer and said filled void(s) to create a metalized base plate and/or power supply backplane;
   (g) aligning/exposing/etching said metalized base plate to create regulator/switch islands;
   (h) filling voids between said islands with an insulating material; and
   (i) fabricating a regulator/switch on top of said regulator/switch islands.

13. The integrated voltage/current/power regulator/switch method of claim 12 wherein top/bottom orientations are reversed and said steps are reversed such that said foundation integrated circuit is fabricated on top of said regulator switch.

14. The integrated voltage/current/power regulator/switch method of claim 12 wherein said insulating layer comprises silicon dioxide.

15. The integrated voltage/current/power regulator/switch method of claim 12 wherein said adhesion deposition step comprises a titanium film and trinitride etch.

16. The integrated voltage/current/power regulator/switch method of claim 12 wherein said conductive material comprises tungsten (W).

17. The integrated voltage/current/power regulator/switch method of claim 12 wherein said conductive material comprises copper (Cu).

18. The integrated voltage/current/power regulator/switch method of claim 12 wherein said conductive material comprises aluminum (Al).

19. The integrated voltage/current/power regulator/switch method of claim 12 further comprising the fabrication and/or attachment of a capacitor and/or inductor on top of or on the bottom of said regulator/switch.

20. An integrated circuit system comprising:
   (a) a foundation integrated circuit (FIC) comprising analog and/or digital circuitry having a clock input;
   (b) a system clock generator having clock output;
   (c) a delay generator having input and output;
   (d) an optional divider/integrator having input and output;
   (e) an anticipatory switching and/or linear regulator subsystem having clock input and regulated output;
   wherein
      said system clock generator output is connected to said input of said delay generator and to said input of said optional divider/integrator;
      said output of said delay generator is connected to said clock input of said analog and/or digital circuitry of said FIC;
      said output of said optional divider/integrator is connected to said clock input of said anticipatory switching and/or linear regulator subsystem;
      said power output of said anticipatory switching and/or linear regulator subsystem provides power to said FIC; and
      said anticipatory switching and/or linear regulator subsystem modulates said power output in response to and/or in anticipation of said clock input.

* * * * *